(12) United States Patent
Kai et al.

(10) Patent No.: US 11,489,043 B2
(45) Date of Patent: Nov. 1, 2022

(54) THREE-DIMENSIONAL MEMORY DEVICE EMPLOYING THINNED INSULATING LAYERS AND METHODS FOR FORMING THE SAME

(71) Applicant: SANDISK TECHNOLOGIES LLC, Addison, TX (US)

(72) Inventors: James Kai, Santa Clara, CA (US); Senaka Kanakamedala, San Jose, CA (US); Johann Alsmeier, San Jose, CA (US)

(73) Assignee: SANDISK TECHNOLOGIES LLC, Addison, TX (US)

(*) Notice: Subject to any disclaimer, the term of this patent is extended or adjusted under 35 U.S.C. 154(b) by 246 days.

(21) Appl. No.: 16/859,196

(22) Filed: Apr. 27, 2020

(65) Prior Publication Data
US 2021/0335999 A1 Oct. 28, 2021

(51) Int. Cl.
| | |
|---|---|
| *H01L 27/11582* | (2017.01) |
| *H01L 29/06* | (2006.01) |
| *G11C 8/14* | (2006.01) |
| *H01L 27/11556* | (2017.01) |
| *H01L 27/1157* | (2017.01) |
| *H01L 27/11524* | (2017.01) |
| *H01L 27/11565* | (2017.01) |
| *H01L 27/11519* | (2017.01) |

(52) U.S. Cl.
CPC ........... *H01L 29/0649* (2013.01); *G11C 8/14* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ................................. H01L 27/11582
See application file for complete search history.

(56) References Cited

U.S. PATENT DOCUMENTS

| | | | |
|---|---|---|---|
| 5,915,167 A | 6/1999 | Leedy | |
| 8,501,629 B2 | 8/2013 | Tang et al. | |
| 9,484,357 B2 | 11/2016 | Makala et al. | |
| 9,576,975 B2 | 2/2017 | Zhang et al. | |
| 9,613,977 B2 | 4/2017 | Sharangpani et al. | |
| 9,659,656 B2 | 5/2017 | Nguyen et al. | |

(Continued)

FOREIGN PATENT DOCUMENTS

| | | |
|---|---|---|
| CN | 108447870 A | 8/2018 |
| JP | 2016100596 A | 5/2016 |

OTHER PUBLICATIONS

USPTO Office Communication, Non-Final Office Action for U.S. Appl. No. 16/859,164, dated Oct. 5, 2021, 20 pages.

(Continued)

*Primary Examiner* — Christopher A Johnson
(74) *Attorney, Agent, or Firm* — The Marbury Law Group PLLC

(57) ABSTRACT

A three-dimensional memory device includes an alternating stack of word lines and at least one insulating layers or air gaps located over a substrate, a memory opening fill structure extending through the alternating stack. The memory opening fill structure includes a memory film and a vertical semiconductor channel contacting an inner sidewall of the memory film. The word lines are thicker than the insulating layers or air gaps.

11 Claims, 42 Drawing Sheets

(56) References Cited

U.S. PATENT DOCUMENTS

| | | |
|---|---|---|
| 9,659,955 B1 | 5/2017 | Sharangpani et al. |
| 9,659,956 B1 | 5/2017 | Pachamuthu et al. |
| 9,716,105 B1 | 7/2017 | Tsutsumi |
| 9,842,907 B2 | 12/2017 | Makala et al. |
| 9,875,929 B1 | 1/2018 | Shukala et al. |
| 9,960,180 B1 * | 5/2018 | Zhou ............... H01L 27/11582 |
| 10,002,880 B1 | 6/2018 | Nagashima |
| 10,020,314 B1 | 7/2018 | Baraskar et al. |
| 10,043,819 B1 | 8/2018 | Lai et al. |
| 10,103,167 B1 | 10/2018 | Lai et al. |
| 10,115,459 B1 | 10/2018 | Yamada et al. |
| 10,192,784 B1 | 1/2019 | Cui et al. |
| 10,256,247 B1 | 4/2019 | Kanakamedala et al. |
| 10,283,513 B1 | 5/2019 | Zhou et al. |
| 10,319,680 B1 | 6/2019 | Sel et al. |
| 10,438,964 B2 | 10/2019 | Makala et al. |
| 10,700,078 B1 | 6/2020 | Cui et al. |
| 10,700,090 B1 | 6/2020 | Cui et al. |
| 10,707,233 B1 | 7/2020 | Cui et al. |
| 2011/0001178 A1 | 1/2011 | Iwase et al. |
| 2011/0233648 A1 | 9/2011 | Seol et al. |
| 2012/0001264 A1 | 1/2012 | Kim et al. |
| 2013/0134493 A1 * | 5/2013 | Eom ............... H01L 27/11582 257/314 |
| 2014/0284695 A1 | 9/2014 | Won et al. |
| 2016/0315095 A1 * | 10/2016 | Sei ............... H01L 29/7883 |
| 2016/0379989 A1 | 12/2016 | Sharangpani et al. |
| 2017/0062472 A1 | 3/2017 | Park et al. |
| 2017/0125436 A1 | 5/2017 | Sharangpani et al. |
| 2018/0374866 A1 | 12/2018 | Makala et al. |
| 2019/0139973 A1 | 5/2019 | Zhou et al. |
| 2020/0020715 A1 | 1/2020 | Nakamura et al. |
| 2020/0058673 A1 | 2/2020 | Nishikawa et al. |
| 2020/0091160 A1 | 3/2020 | Ino et al. |

OTHER PUBLICATIONS

Endoh et al., "Novel Ultra High Density Memory with a Stacked-Surrounding Gate Transistor (S-SGT) Structured Cell," IEDM Proc. (2001) 33-36.
U.S. Appl. No. 16/272,468, filed Feb. 11, 2019, SanDisk Technologies LLC.
U.S. Appl. No. 16/582,262, filed Sep. 25, 2019, SanDisk Technologies LLC.
U.S. Appl. No. 16/695,775, filed Nov. 26, 2019, SanDisk Technologies LLC.
U.S. Appl. No. 16/801,456, filed Feb. 26, 2020, SanDisk Technologies LLC.
U.S. Appl. No. 16/859,164, filed Apr. 27, 2020, SanDisk Technologies LLC.
Notification of Transmittal of the International Search Report and the Written Opinion of the International Searching Authority for International Patent Application No. PCT/US2020/067544, dated Apr. 22, 2021, 14 pages.
USPTO Office Communication, Notice of Allowance and Fee(s) Due for U.S. Appl. No. 16/859,164, dated Mar. 16, 2022, 9 pages.

* cited by examiner

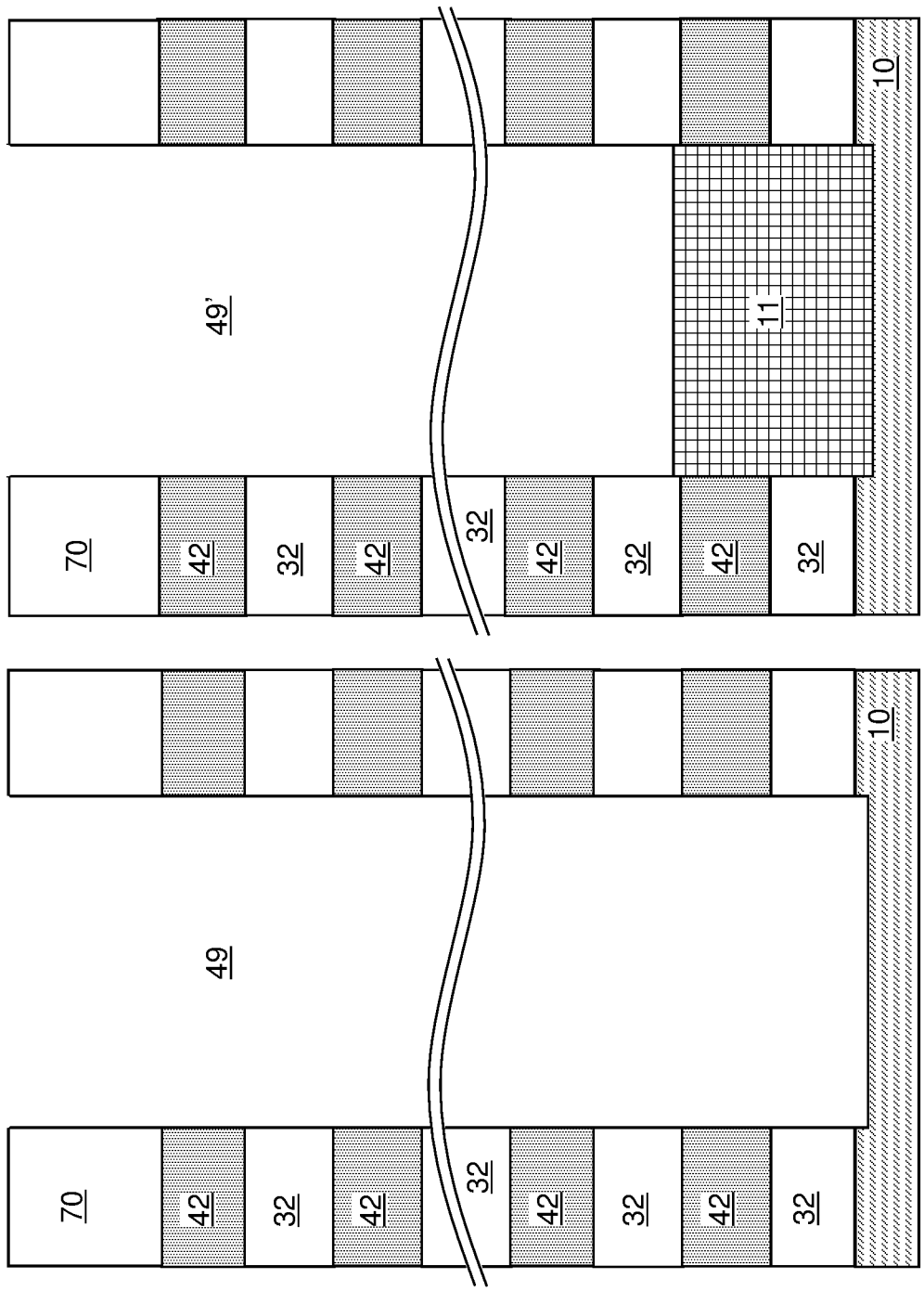

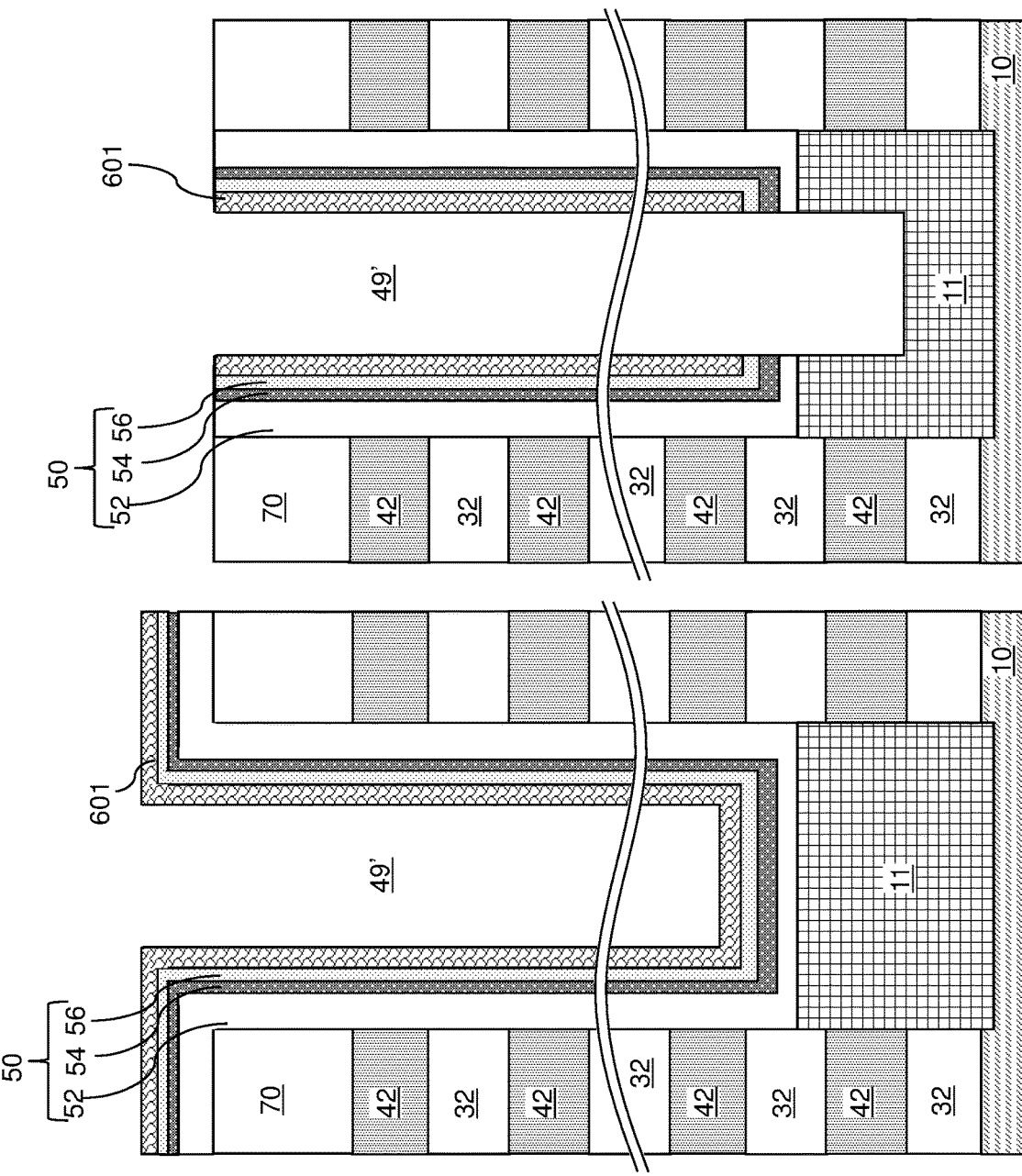

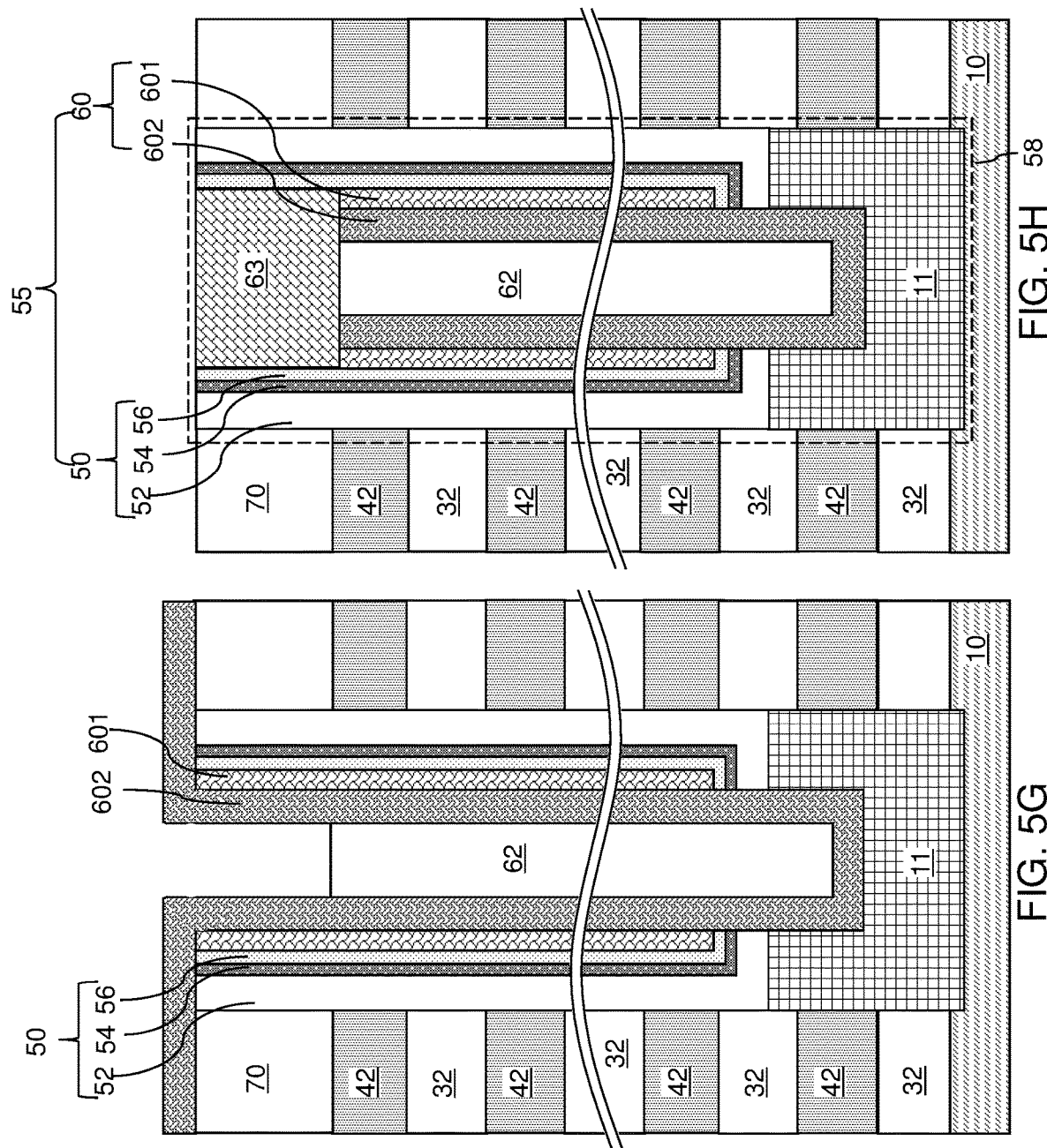

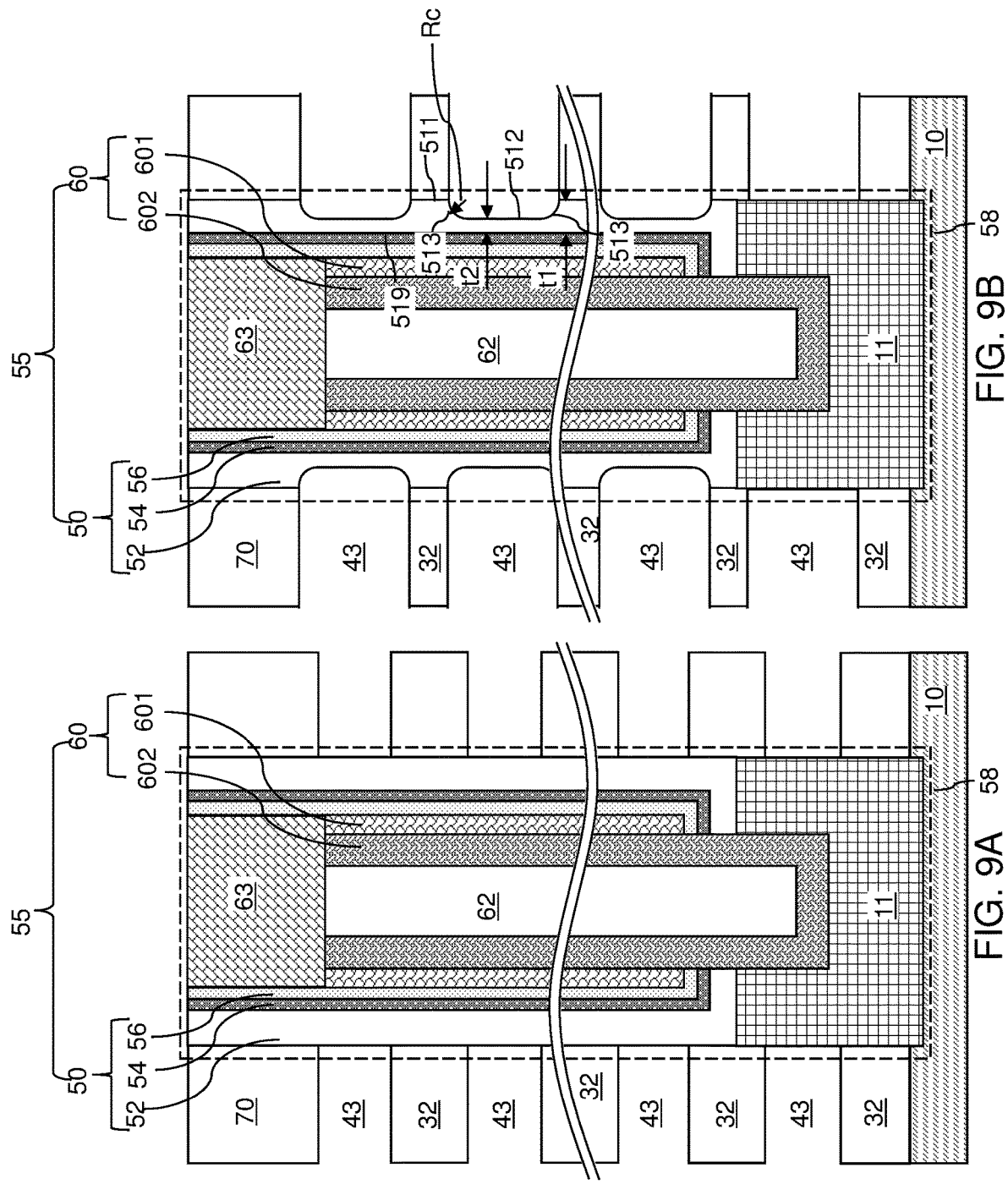

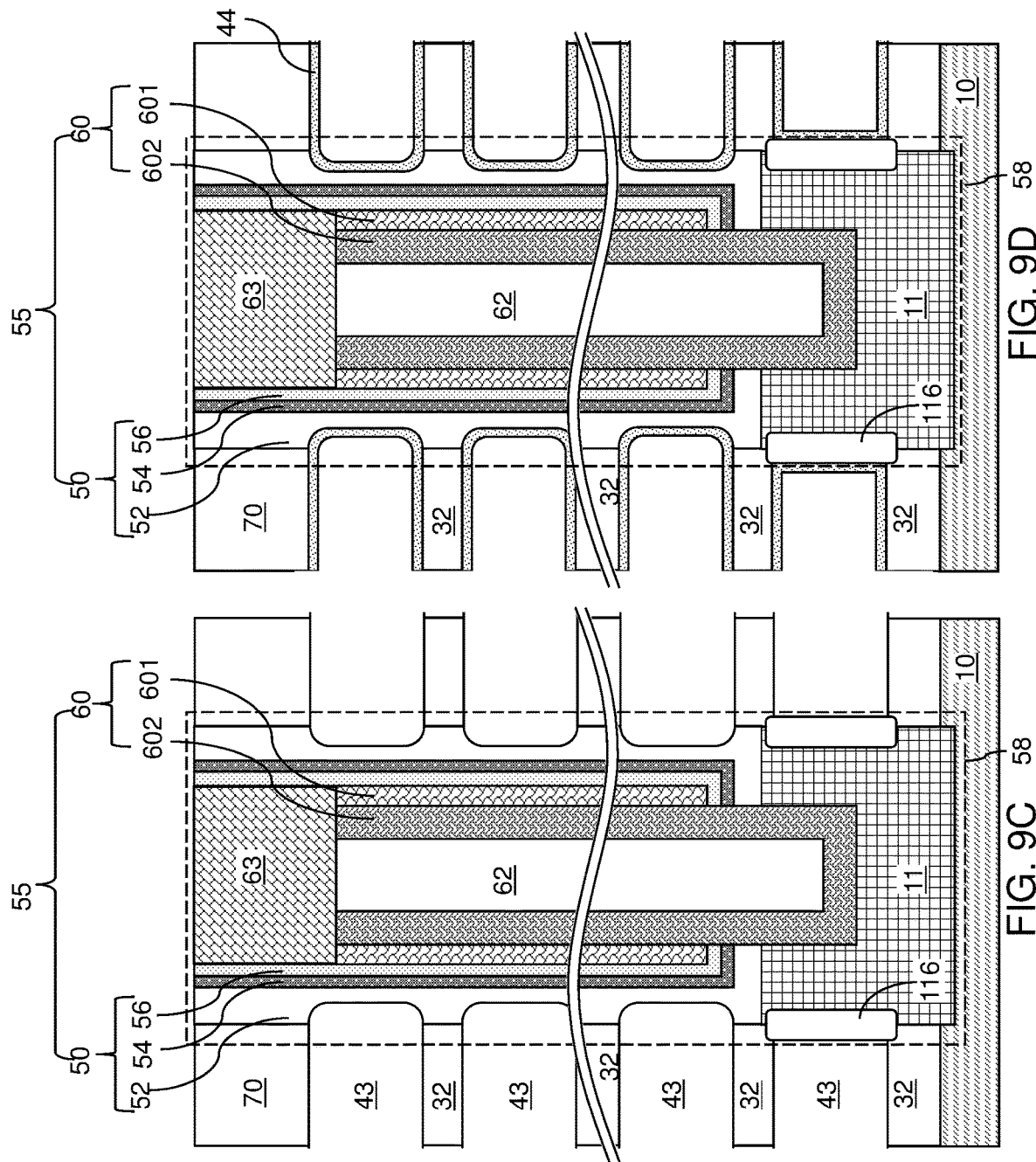

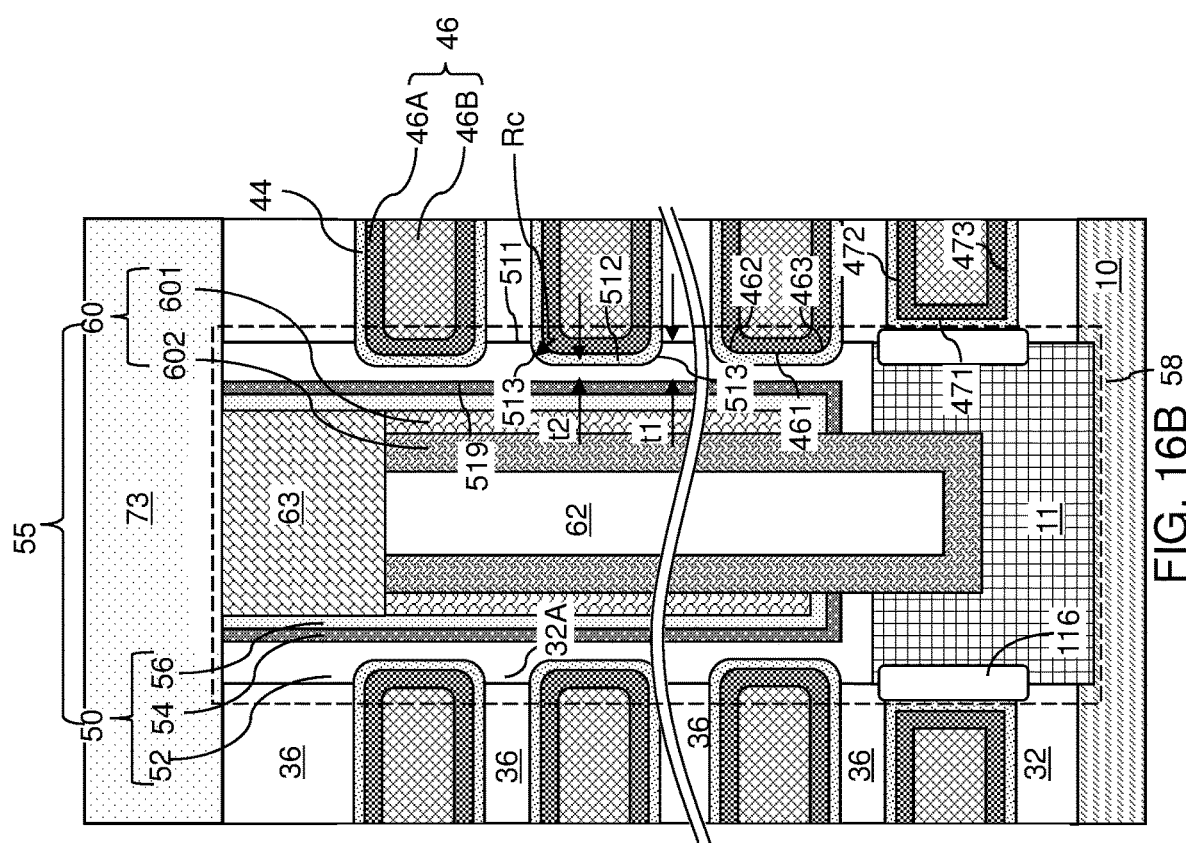

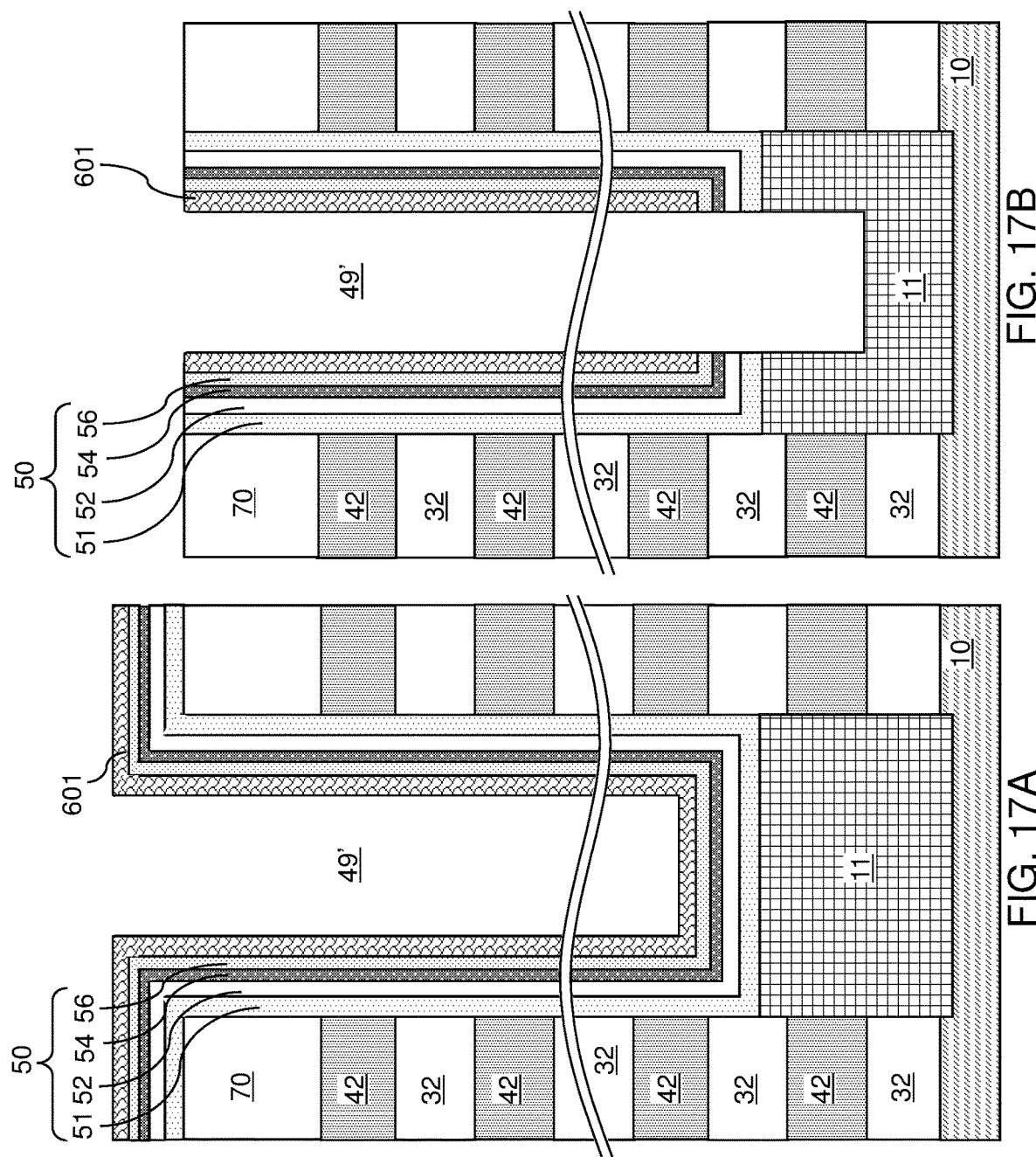

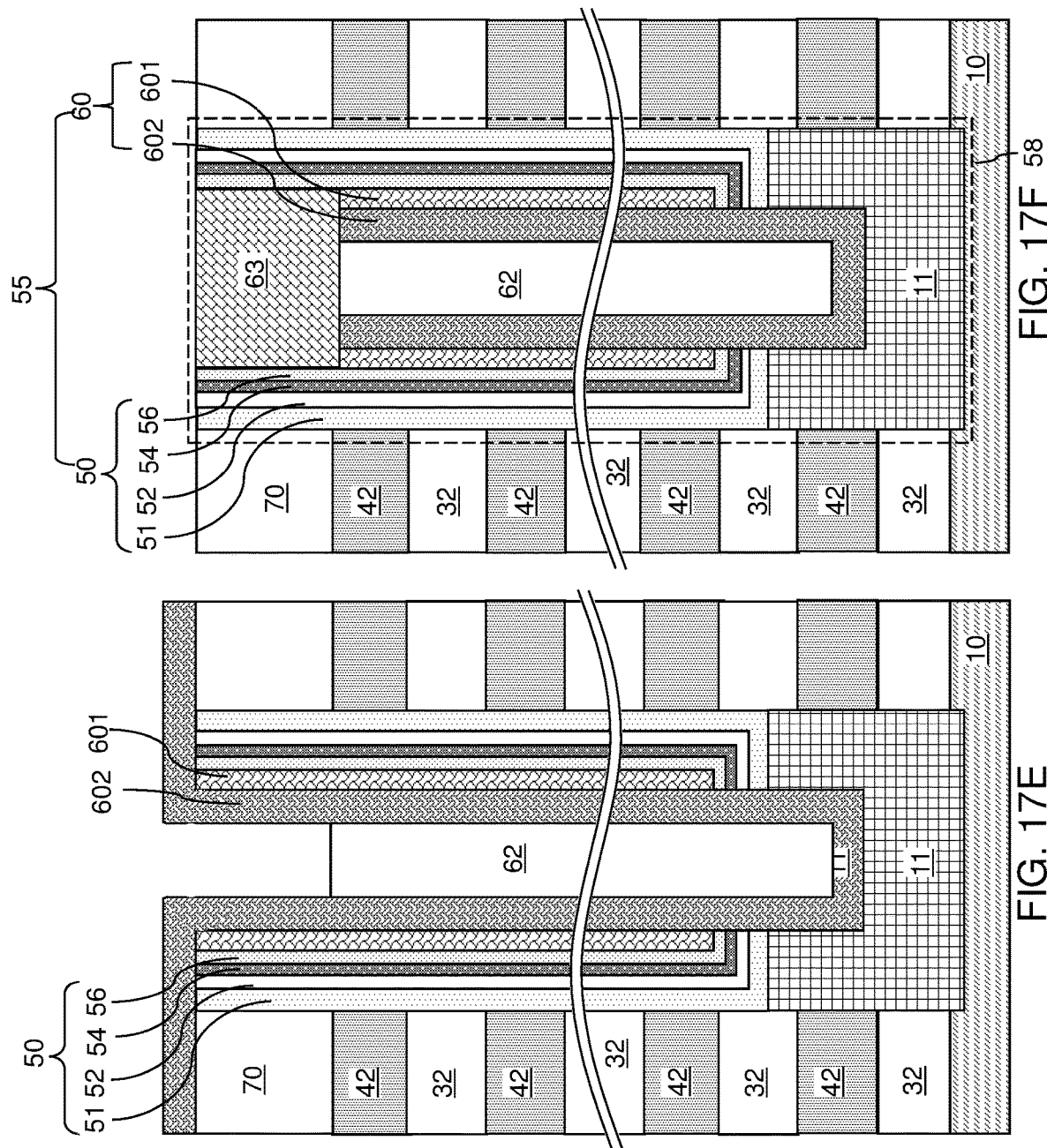

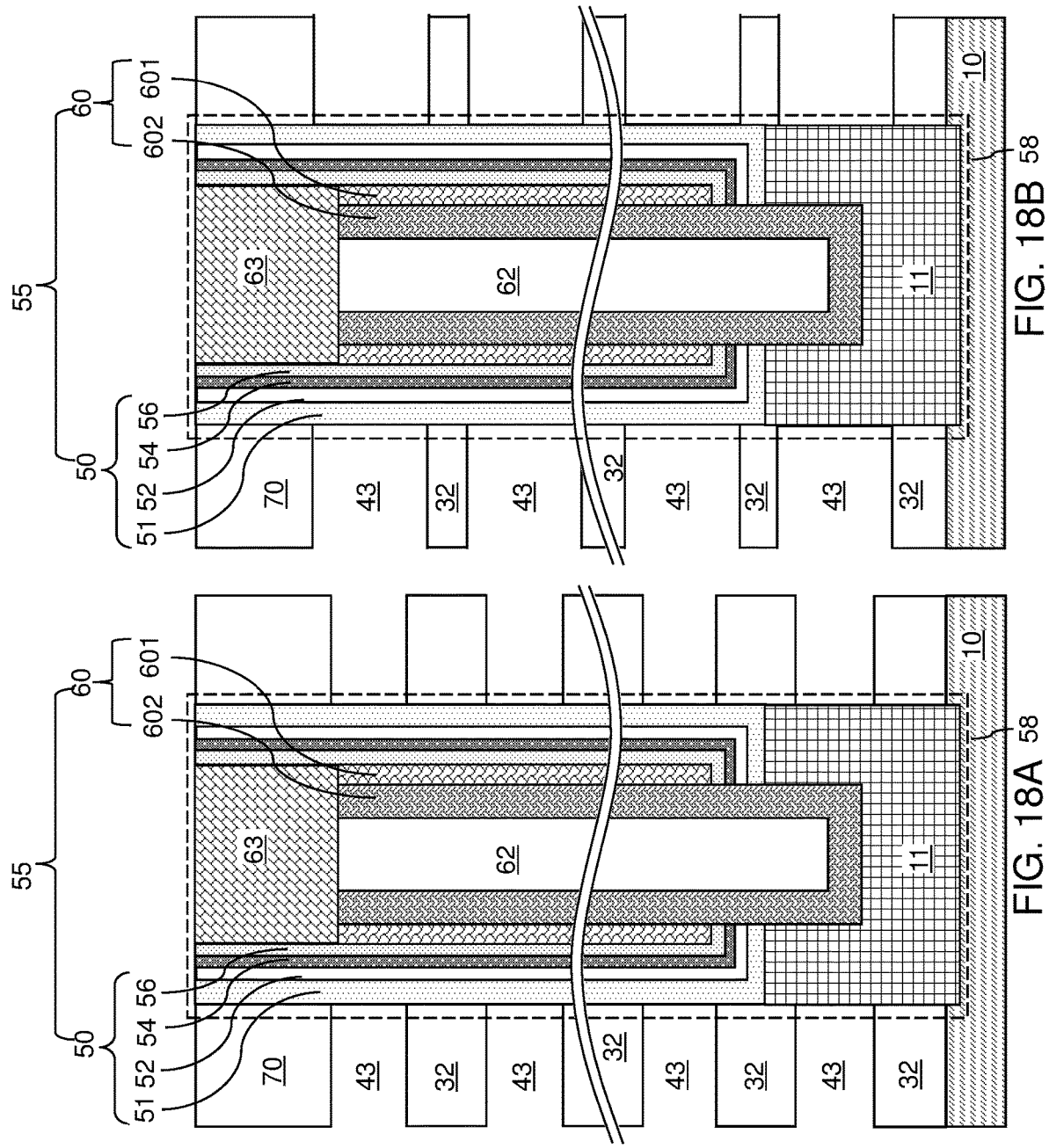

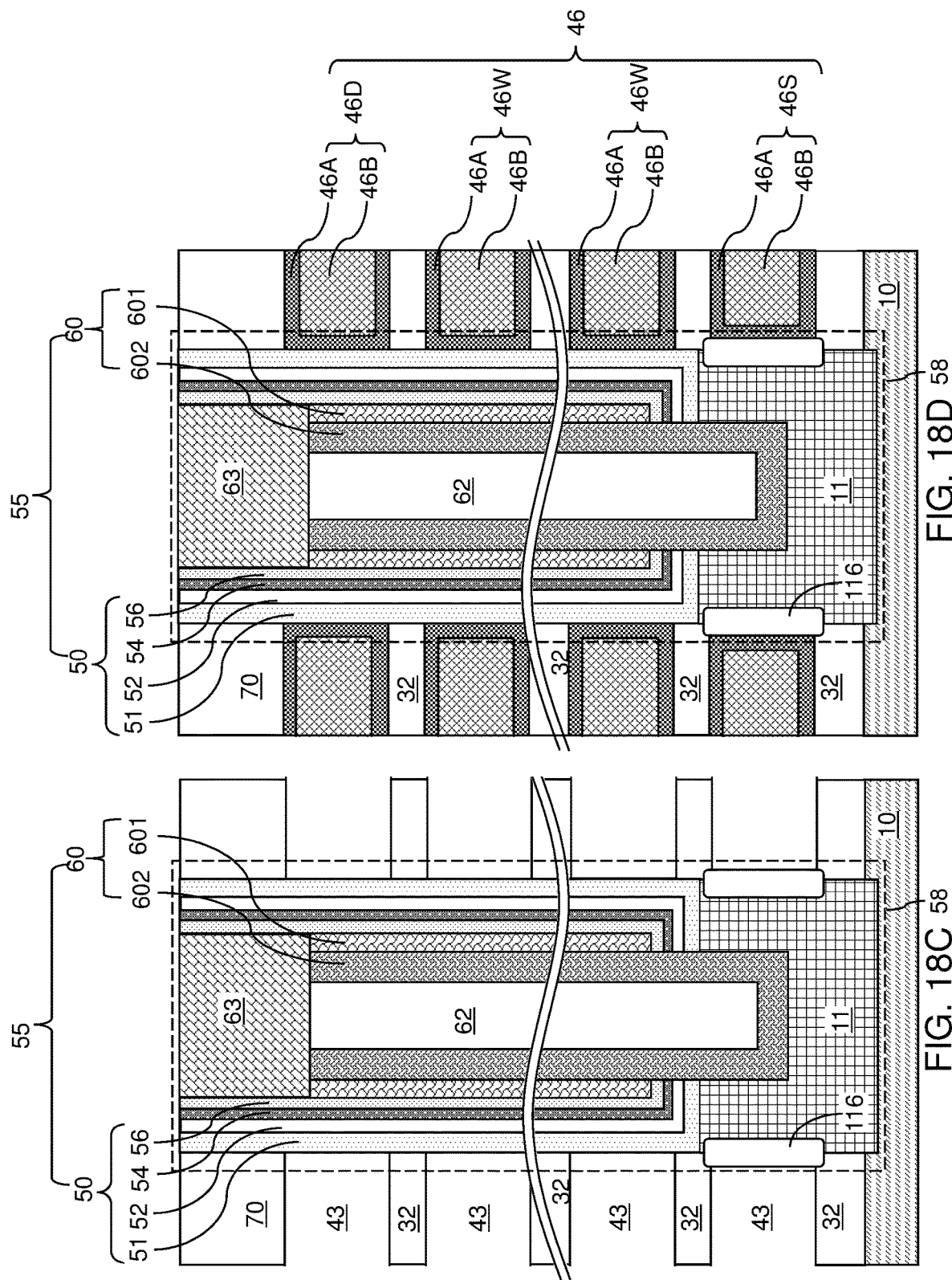

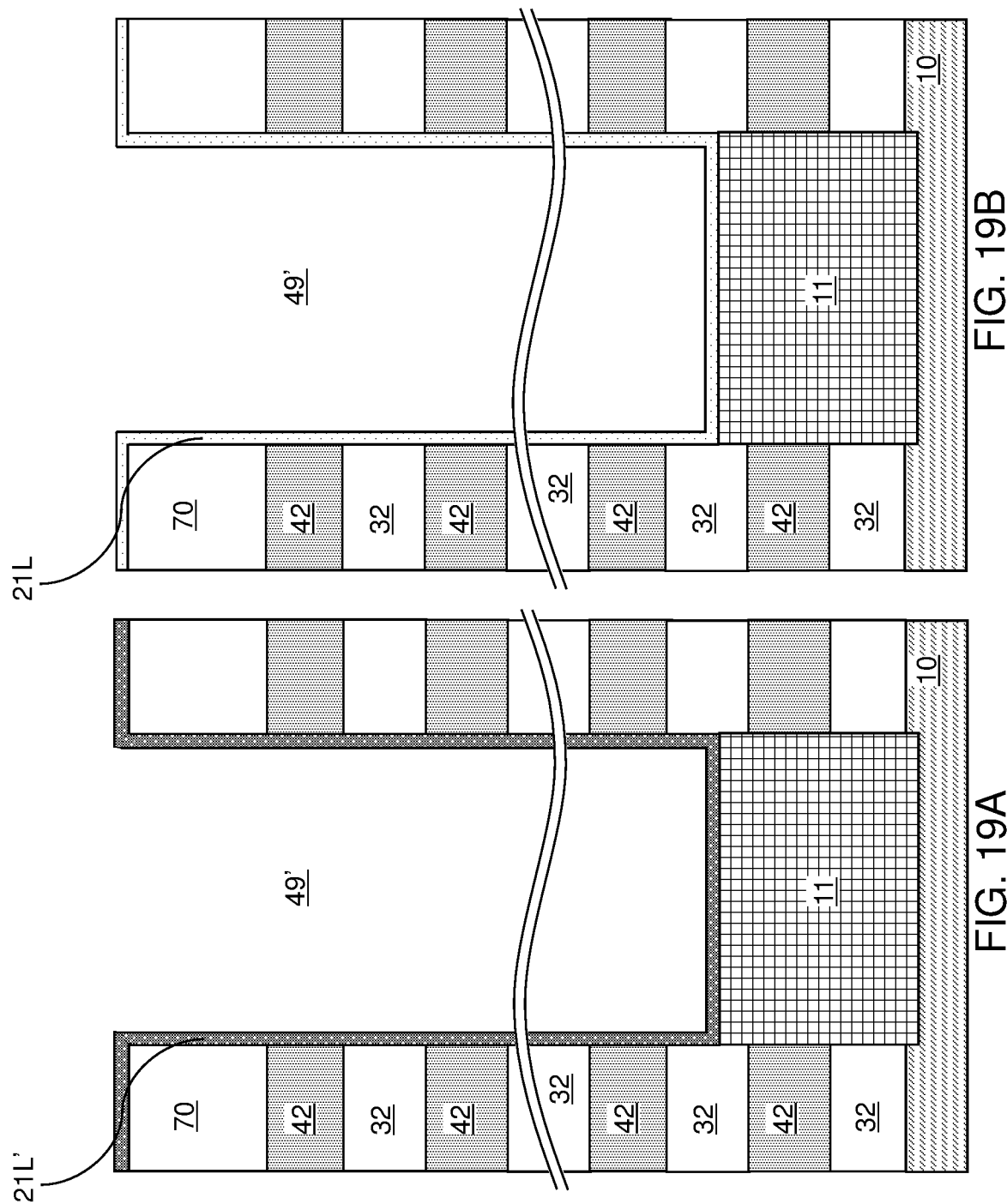

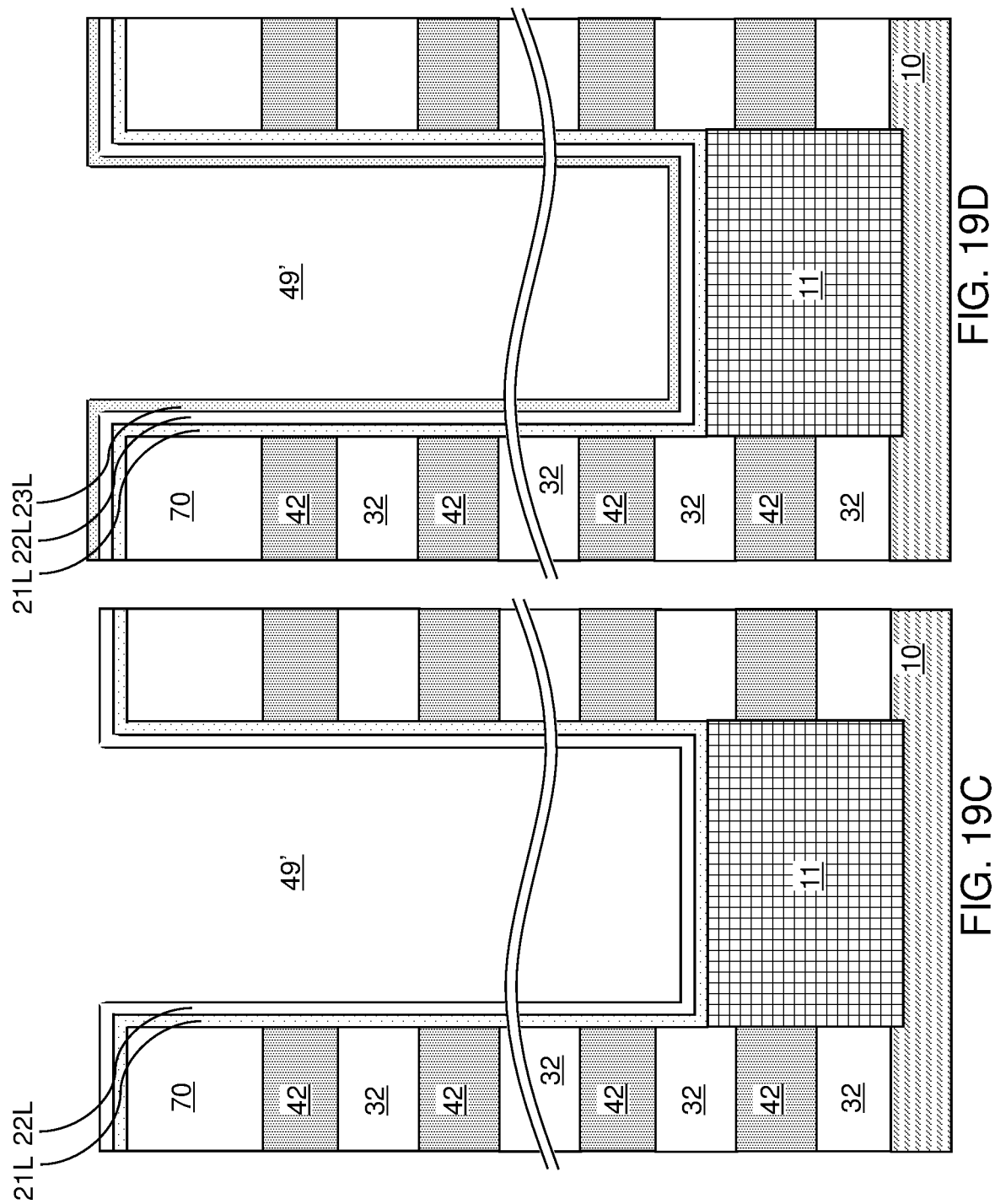

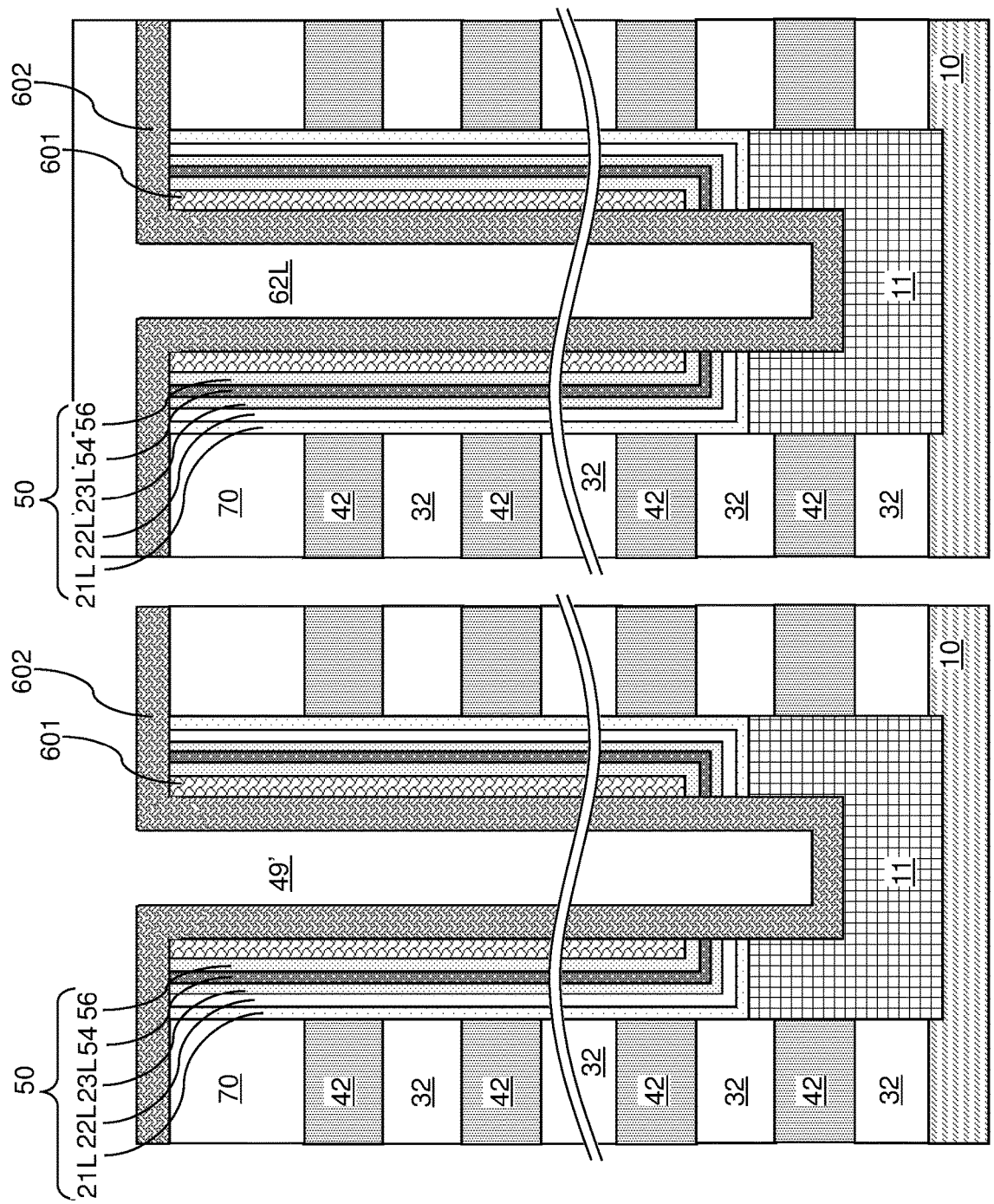

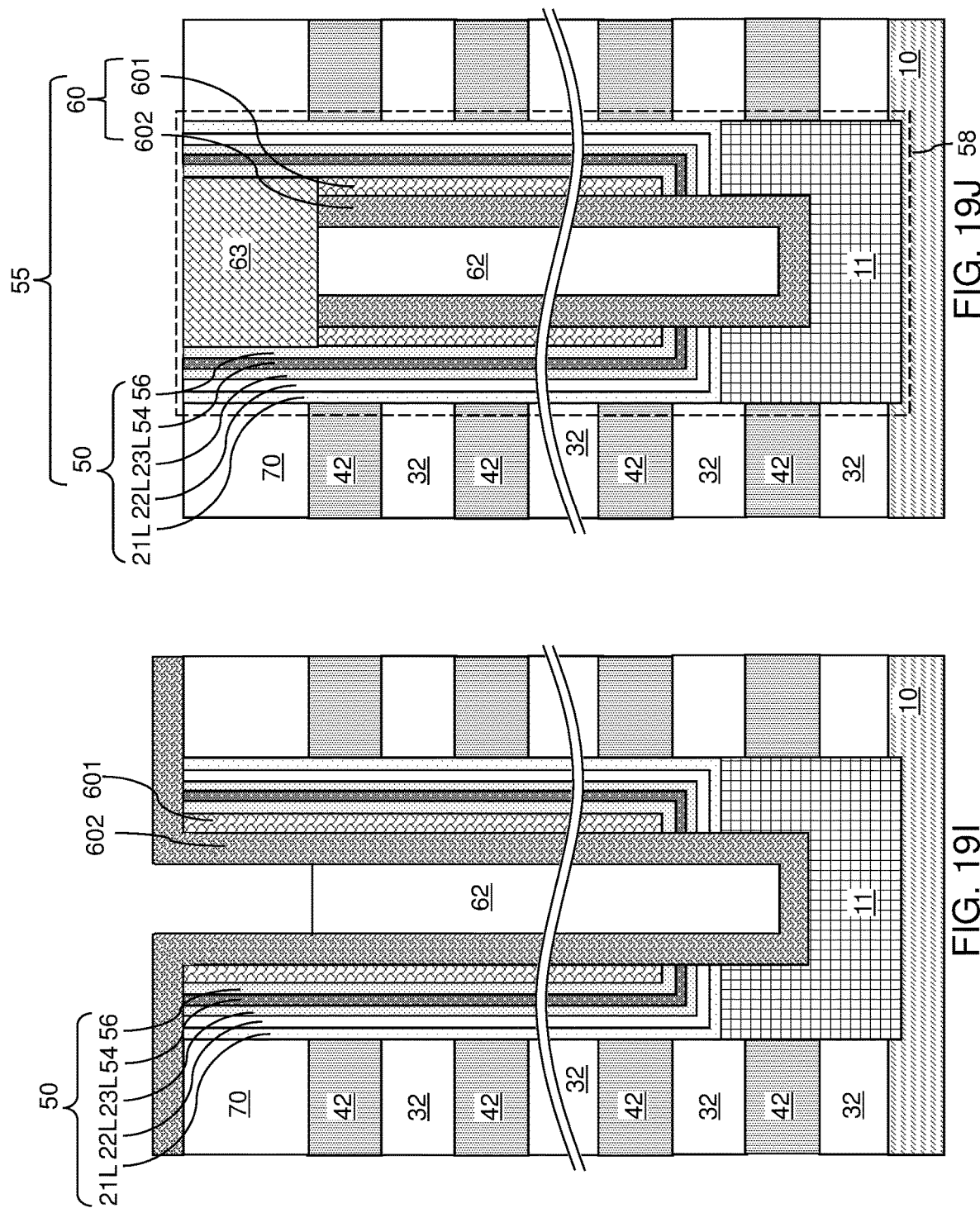

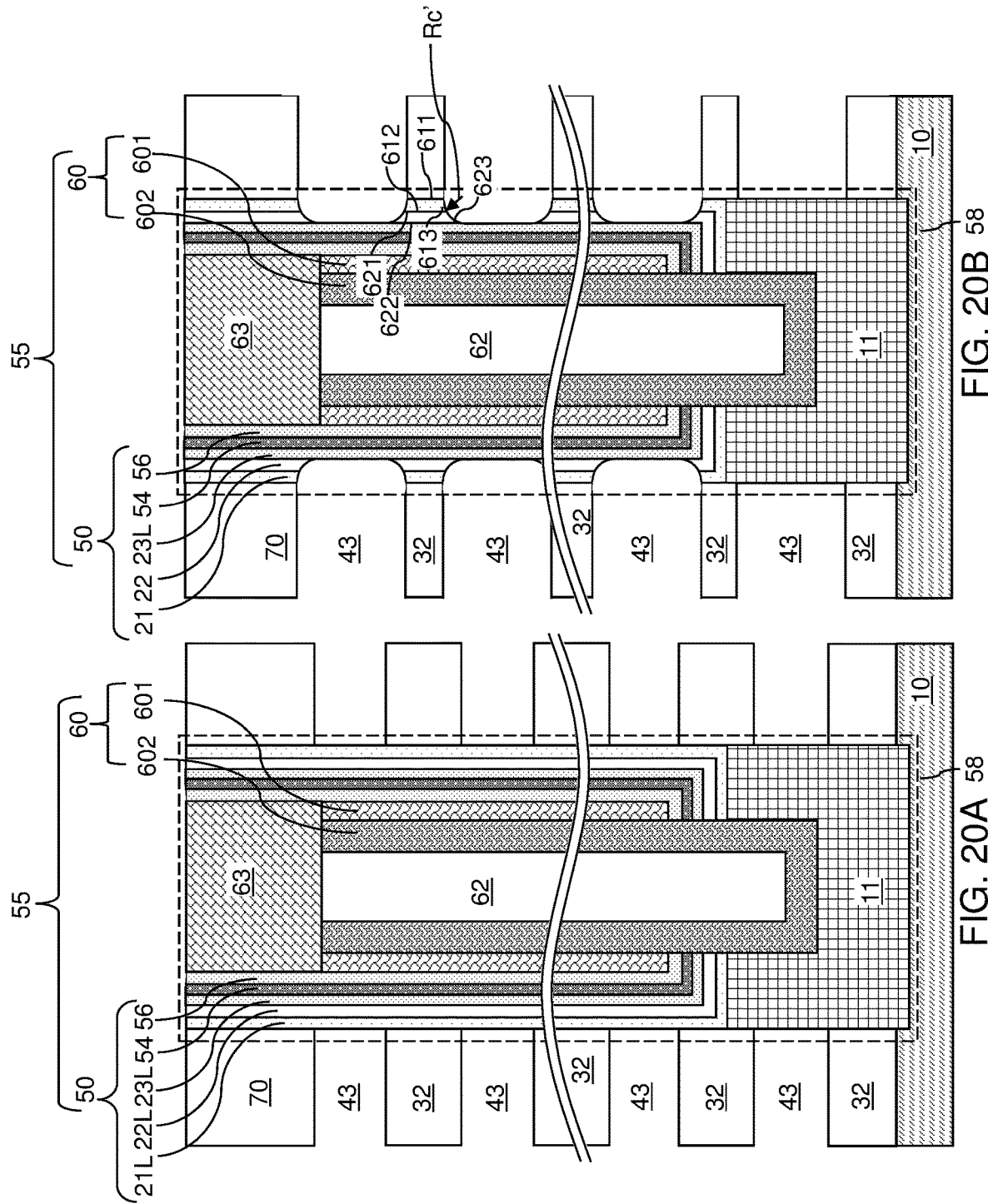

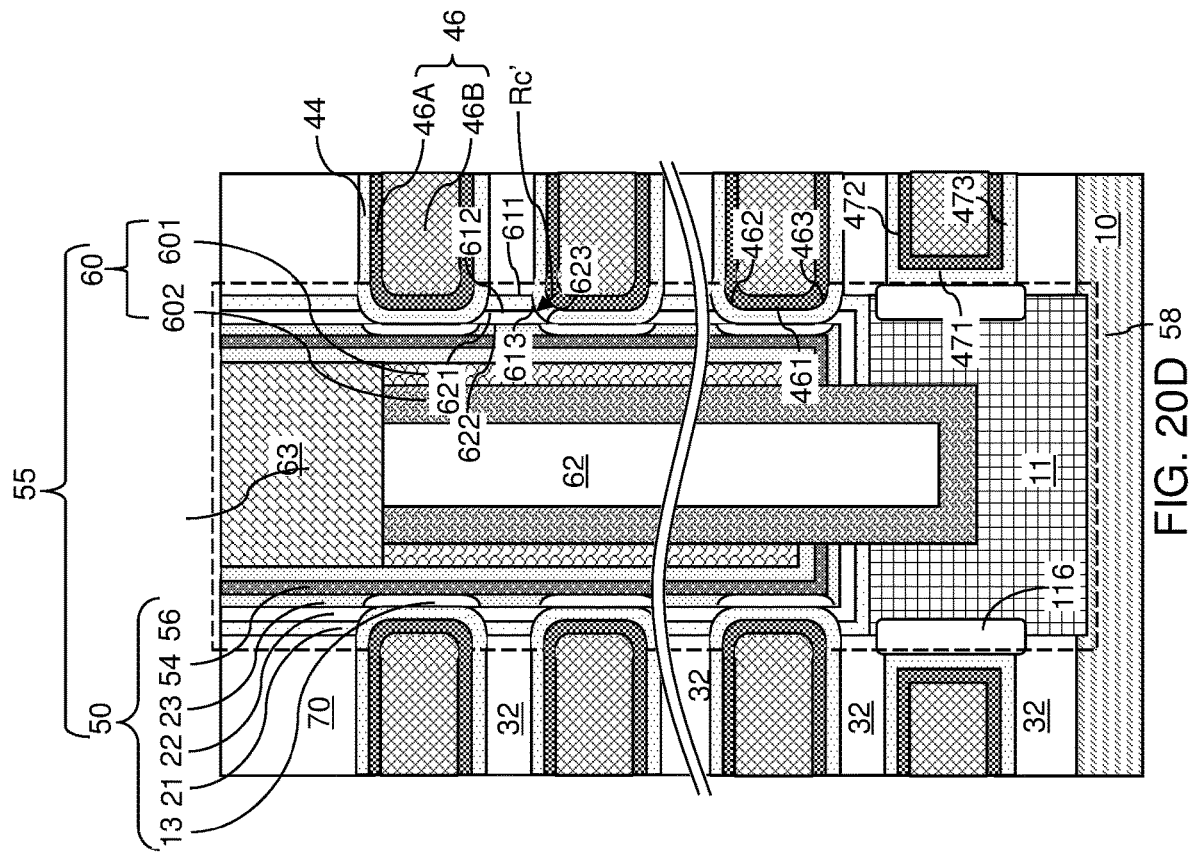
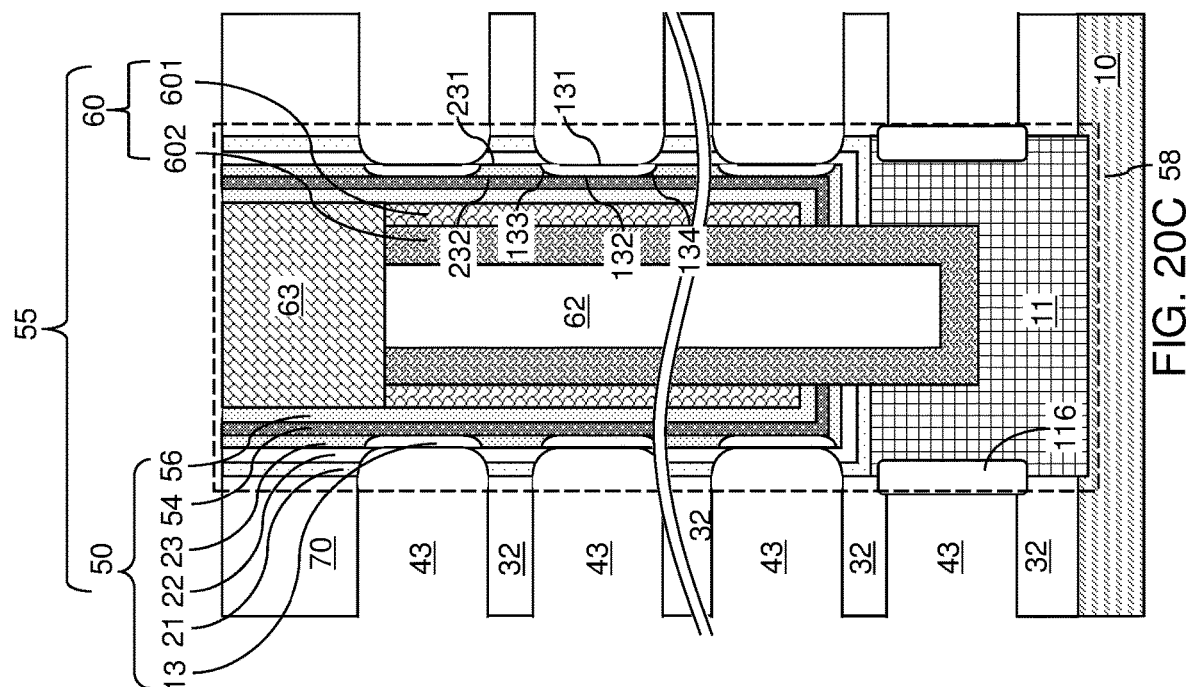
FIG. 20D
FIG. 20C

THREE-DIMENSIONAL MEMORY DEVICE EMPLOYING THINNED INSULATING LAYERS AND METHODS FOR FORMING THE SAME

FIELD

The present disclosure relates generally to the field of semiconductor devices, and particularly to a three-dimensional memory device employing thinned insulating layers and methods for manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and word lines located over a substrate, and a memory opening fill structure extending through the alternating stack, wherein: the memory opening fill structure comprises a memory film and a vertical semiconductor channel contacting an inner sidewall of the memory film, and the word lines are thicker than the insulating layers.

According to another aspect of the present disclosure, a method of forming a three-dimensional memory device is provided, which comprises: forming an alternating stack of insulating layers and sacrificial material layers over a substrate, forming a memory opening through the alternating stack, forming a memory opening fill structure in the memory opening, wherein the memory opening fill structure comprises a silicon oxide blocking dielectric layer, a charge storage material, a tunneling dielectric layer, and a vertical semiconductor channel, forming a backside trench through the alternating stack, forming backside recesses by removing the sacrificial material layers selective to the insulating layers, expanding the backside recesses by isotropically etching surface portions of the insulating layers employing a remote-plasma-assisted dry etch process or a chemical dry etch process, and forming electrically conductive layers in the backside recesses.

According to another aspect of the present disclosure, a three-dimensional memory device is provided, which comprises: an alternating stack of word lines and at least one insulating layers or air gaps located over a substrate, and a memory opening fill structure extending through the alternating stack. The memory opening fill structure comprises a memory film containing a dielectric metal oxide blocking dielectric and a charge storage material, and a vertical semiconductor channel contacting an inner sidewall of the memory film, and the word lines are thicker than the insulating layers or air gaps.

According to yet another aspect of the present disclosure, a three-dimensional memory device is provided, which comprises: an alternating stack of insulating layers and electrically conductive layers located over a substrate, a memory opening vertically extending through the alternating stack, and a memory opening fill structure vertically extending through the alternating stack, wherein: the memory opening fill structure comprises a memory film and a vertical semiconductor channel contacting an inner sidewall of the memory film, and the memory film comprises, from outside to inside, a vertical stack of silicon oxide material portions located at levels of a subset of the insulating layers, a vertical stack of silicon oxide blocking dielectric portions that is interlaced with a vertical stack of silicon nitride material portions, a charge storage layer, and a tunneling dielectric layer.

According to still another aspect of the present disclosure, a method of forming a three-dimensional memory device is provided, which comprises: forming an alternating stack of insulating layers and sacrificial material layers over a substrate, forming a memory opening through the alternating stack, forming a memory opening fill structure in the memory opening, wherein the memory opening fill structure comprises at least one silicon oxide blocking dielectric layer, a silicon nitride blocking dielectric layer, a charge storage layer, a tunneling dielectric layer, and a vertical semiconductor channel, forming a backside trench through the alternating stack, forming backside recesses by removing the sacrificial material layers selective to the insulating layers and the at least one silicon oxide blocking dielectric layer employing a first isotropic etch process, expanding the backside recesses by isotropically etching surface portions of the insulating layers and physically exposed portions of the at least one silicon oxide blocking dielectric layer selective to the silicon nitride blocking dielectric layer employing a second isotropic etch process, and forming electrically conductive layers in the backside recesses.

BRIEF DESCRIPTION OF THE DRAWINGS

FIGS. 5A-5H are sequential schematic vertical cross-sectional views of a memory opening within the first exemplary structure during formation of a first exemplary memory opening fill structure according to the first embodiment of the present disclosure.

FIGS. 9A-9E are sequential vertical cross-sectional views of a region of the first exemplary structure during formation of electrically conductive layers according to the first embodiment of the present disclosure.

FIG. 16B is a vertical cross-sectional view of a portion of the alternative embodiment of the first exemplary structure around a memory opening fill structure according to the first embodiment of the present disclosure.

FIGS. 17A-17F are sequential vertical cross-sectional views of a memory opening during formation of a second exemplary memory opening fill structure according to a second embodiment of the present disclosure.

FIGS. 18A-18D are sequential vertical cross-sectional views of a memory opening during replacement of sacrificial material layers with electrically conductive layers according to the second embodiment of the present disclosure.

FIGS. 19A-19J are sequential vertical cross-sectional views of a memory opening during formation of a third exemplary memory opening fill structure according to a third embodiment of the present disclosure.

FIGS. 20A-20D are sequential vertical cross-sectional views of a memory opening during replacement of sacrificial material layers with electrically conductive layers according to the third embodiment of the present disclosure.

DETAILED DESCRIPTION

Figure 1:
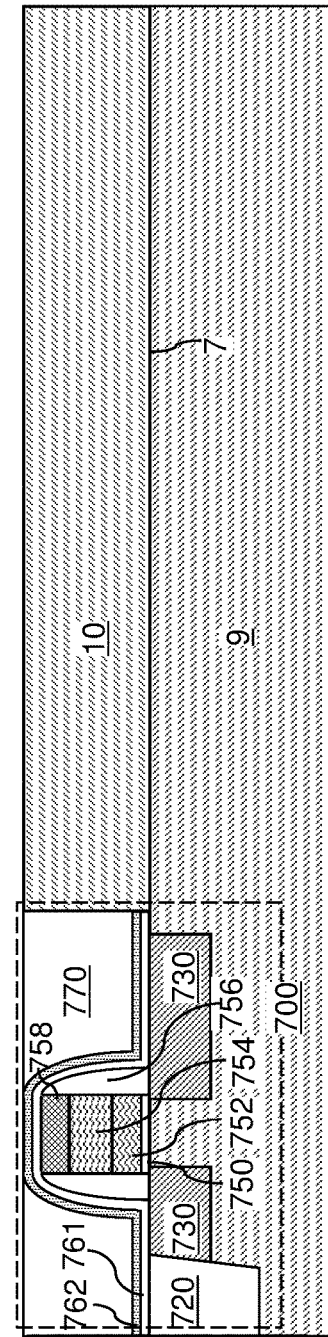
FIG. 1 is a schematic vertical cross-sectional view of a first exemplary structure after formation of at least one peripheral device and a semiconductor material layer according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 may be a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-5}$ S/m to $1.0 \times 10^5$ S/m. As used herein, a "semiconductor material" refers to a material having electrical conductivity in the range from $1.0 \times 10^{-5}$ S/m to 1.0 S/m in the absence of electrical dopants therein, and is capable of producing a doped material having electrical conductivity in a range from 1.0 S/m to $1.0 \times 10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0 \times 10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (750, 752, 754, 758), each of which can include a gate dielectric 750, a gate electrode (752, 754), and a gate cap dielectric 758. The gate electrode (752, 754) may include a stack of a first gate electrode portion 752 and a second gate electrode portion 754. At least one gate spacer 756 can be formed around the at least one gate structure (750, 752, 754, 758) by depositing and anisotropically etching a dielectric liner. Active regions 730 can be formed in upper portions of the substrate semiconductor layer 9, for example, by introducing electrical dopants employing the at least one gate structure (750, 752, 754, 758) as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200.

Figure 2:
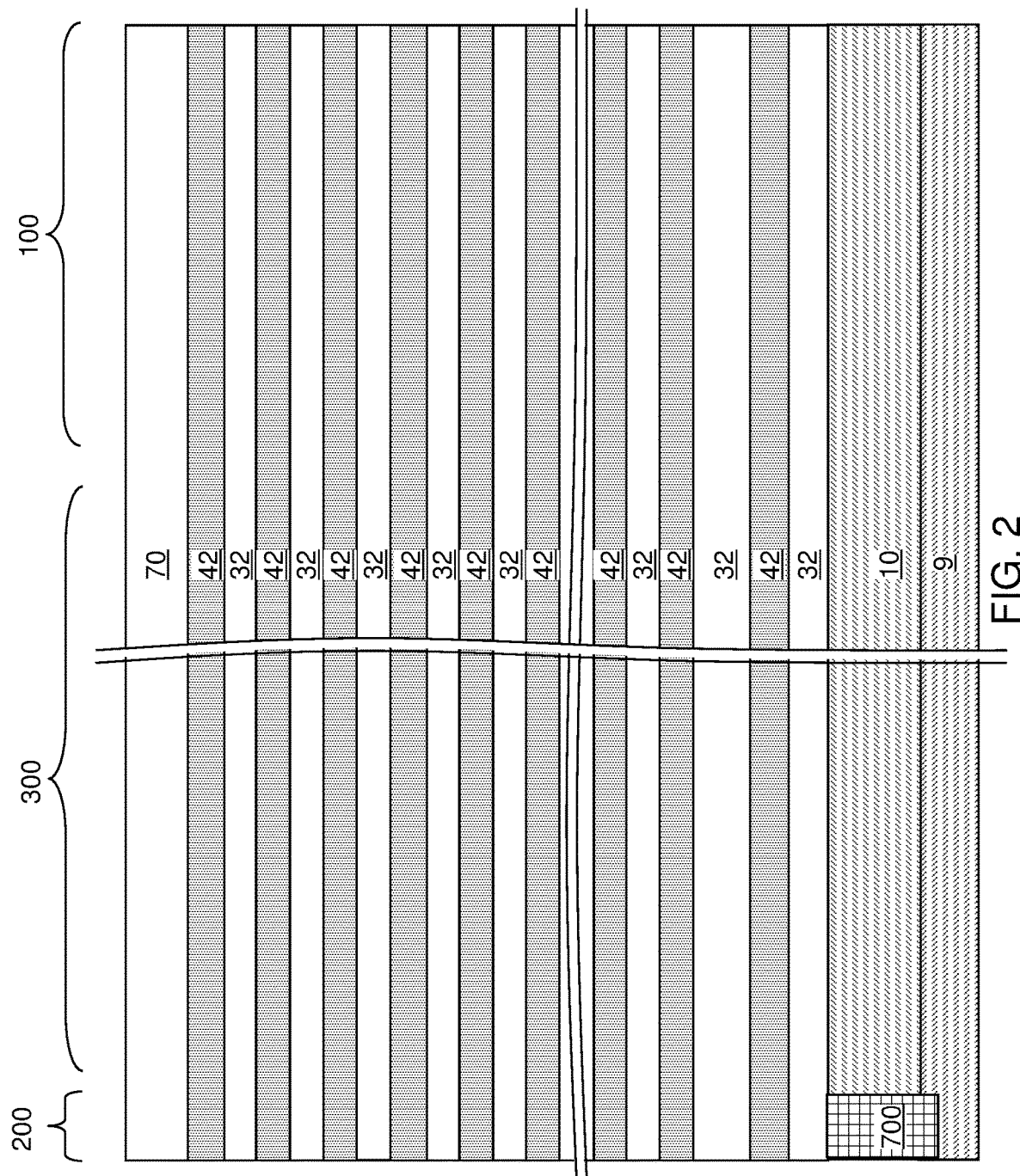
FIG. 2 is a schematic vertical cross-sectional view of the first exemplary structure after formation of an alternating stack of insulating layers and sacrificial material layers according to the first embodiment of the present disclosure.

In one alternative embodiment, the at least one semiconductor device 700 for the peripheral circuitry can be formed in the memory array region 100 under the alternating stack that will be formed in a subsequent step shown in FIG. 2. Thus, the least one semiconductor device 700 may comprise a CMOS device located under the memory array. In another alternative embodiment, the at least one semiconductor device 700 may be formed on a separate substrate which is subsequently bonded to the memory array. Thus, the least one semiconductor device 700 may comprise a CMOS device bonded to the memory array.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers 42 can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
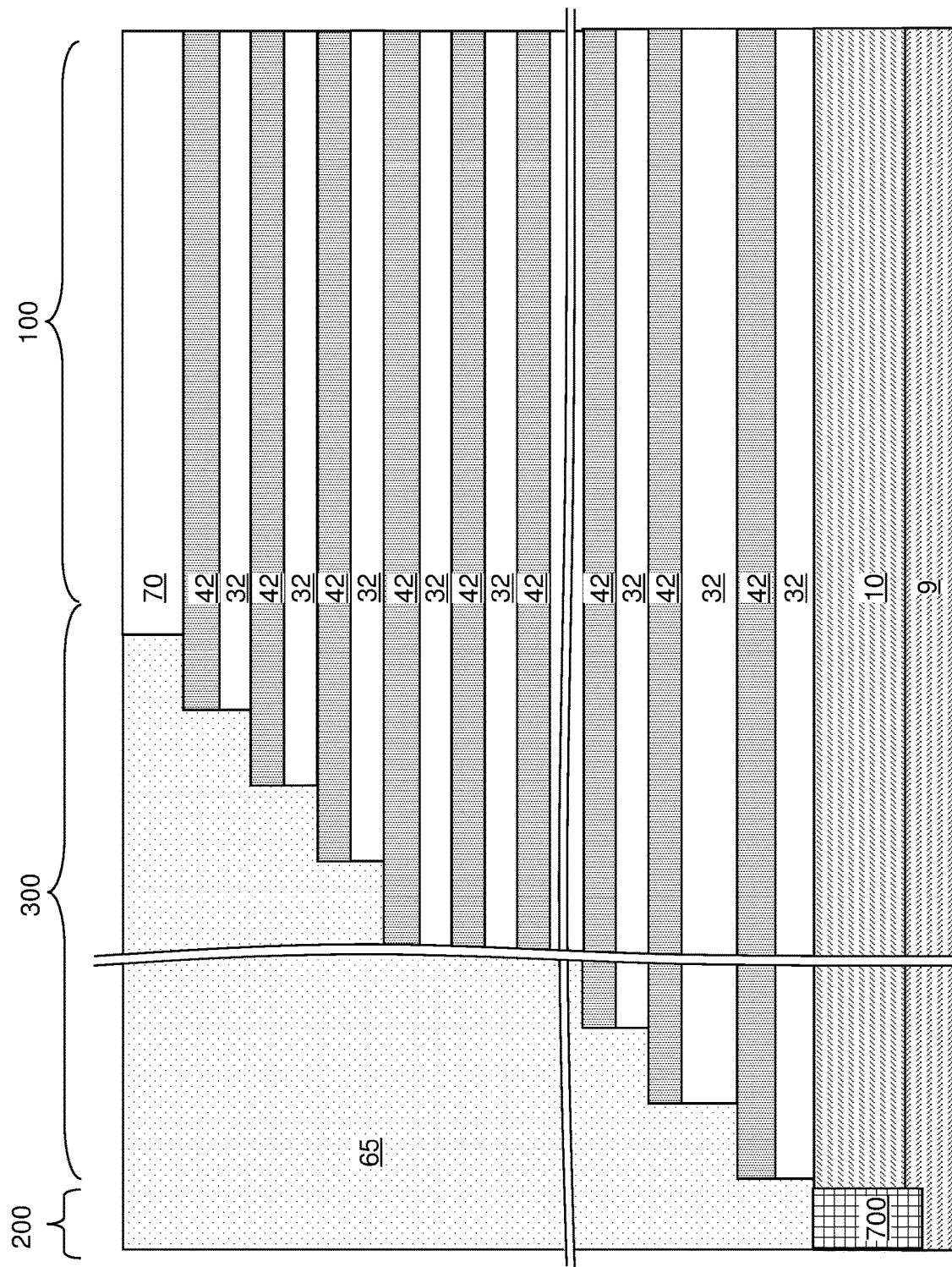
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
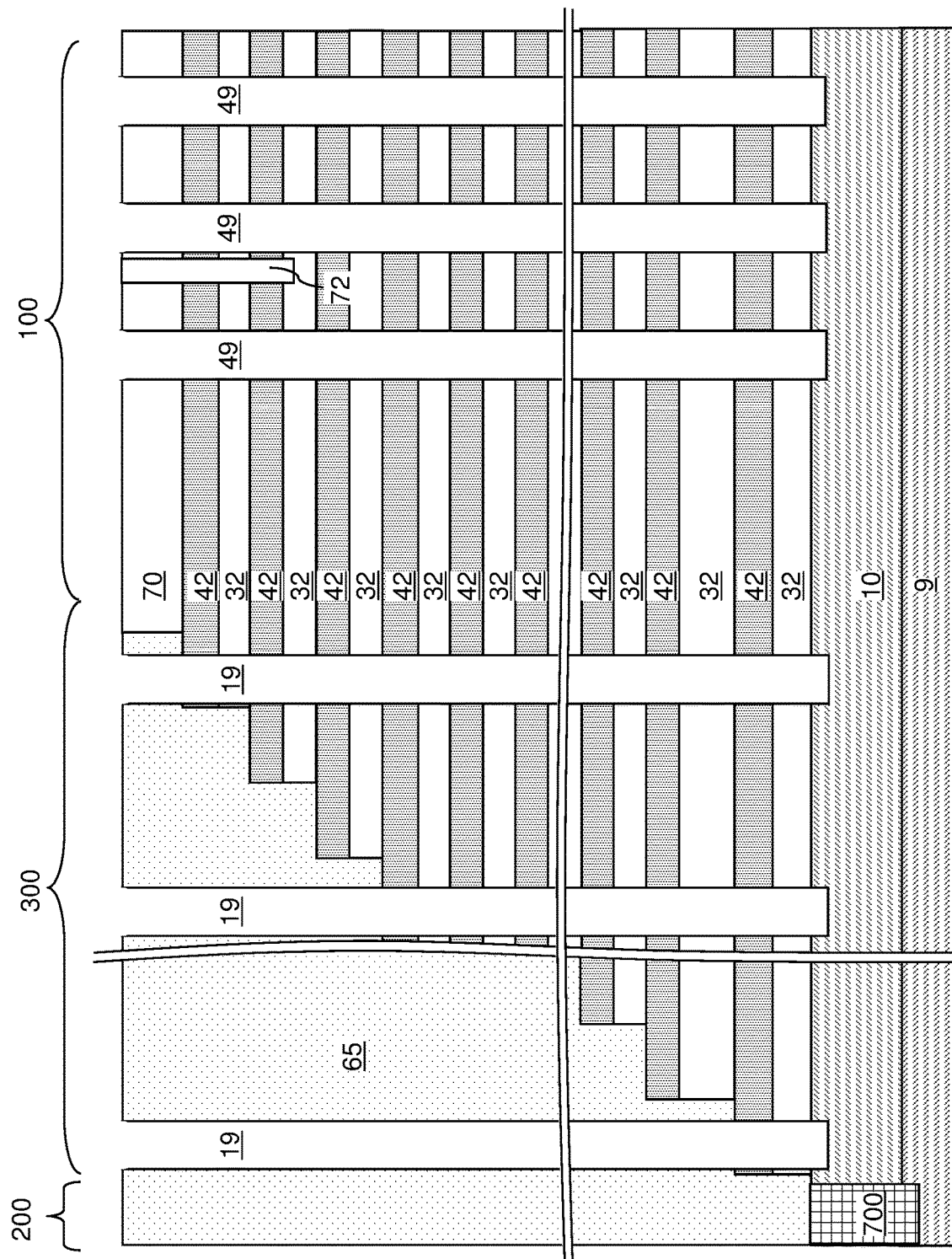
FIG. 4A is a schematic vertical cross-sectional view of the first exemplary structure after formation of memory openings and support openings according to the first embodiment of the present disclosure.
Figure 4B:
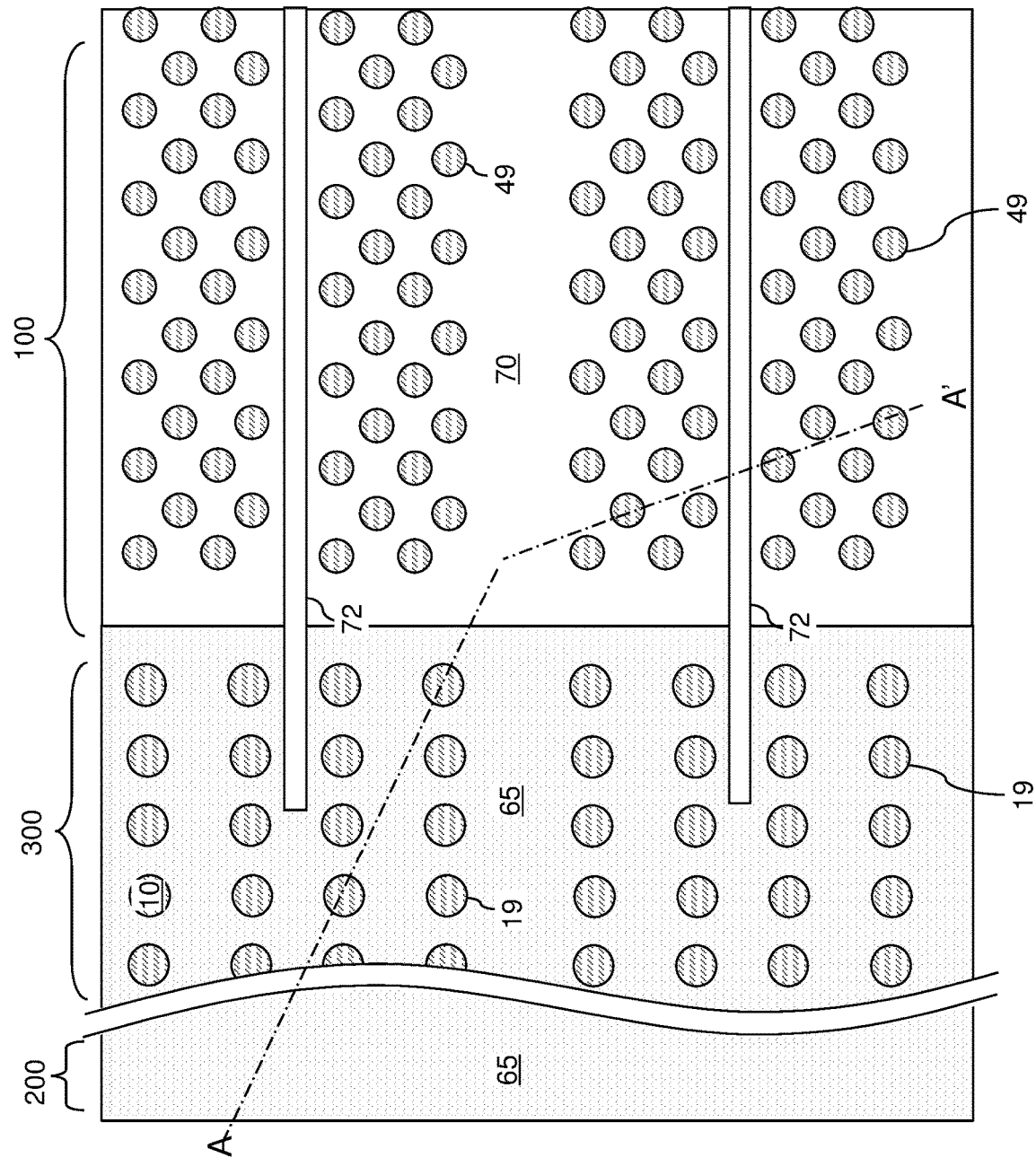
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitute a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper portion of the semiconductor material layer 10. At this processing step, each support opening 19 can extend through the retro-stepped dielectric material portion 65, a subset of layers in the alternating stack (32, 42), and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49. In one embodiment, the material of the blocking dielectric layer 52 is the same as the material of the insulating layers 32 (e.g., silicon oxide). In this case, the as deposited silicon oxide blocking dielectric layer 52 has a greater than usual thickness, and part of the thickness at the levels of the word lines will be removed during an isotropic etch of the insulating layers 32, as will be described below. In another embodiment, the blocking dielectric includes an outer sacrificial sublayer having the same material as the material of the insulating layers 32 (e.g., silicon oxide) and an inner blocking sublayer having a material (e.g., silicon oxynitride, metal oxide, etc.) which is different from the material of the insulating layers 32. In this case, portions of the outer sacrificial sublayer at the levels of the word lines will be removed during an isotropic etch of the insulating layers 32, while the inner sublayer may act as an etch stop and is not substantially etched.

For example, as described above, the entire blocking dielectric layer 52 includes silicon oxide to form a silicon oxide blocking dielectric. The silicon oxide blocking dielectric layer 52 can be formed by a conformal deposition method such as low pressure chemical vapor deposition, atomic layer deposition, or a combination thereof. The thickness of the silicon oxide blocking dielectric layer 52 can be in a range from 6 nm to 40 nm, such as from 10 nm to 20 nm, although lesser and greater thicknesses can also be employed. The thickness of the silicon oxide blocking dielectric layer 52 can be the same as, or about the same as, the sum of the isotropic etch distance by which the insulating layers 32 are to be subsequently trimmed and the thickness of portions of the silicon oxide blocking dielectric layer 52 at the levels of the sacrificial material layers in a final device structure.

Subsequently, the charge storage layer 54 can be formed. In one embodiment, the charge storage layer 54 can be a continuous layer of a charge trapping material. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer having a straight outer sidewall and a straight inner sidewall. In one embodiment, the charge storage layer 54 can have a uniform thickness throughout, which may be in a range from 2 nm to 20 nm, such as from 4 nm to 10 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the silicon oxide blocking dielectric layer 52 are sequentially anisotropically etched employing at least one anisotropic etch process. The portions of the first semiconductor channel layer 601, the tunneling dielectric layer 56, the charge storage layer 54, and the silicon oxide blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the silicon oxide blocking dielectric layer 52 at a bottom of each memory cavity 49' can be removed to form openings in remaining portions thereof. Each of the first semiconductor channel layer 601, the tunneling dielectric layer 56, the charge storage layer 54, and the silicon oxide blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, the charge storage layer 54 can include a vertical stack of charge storage elements, which are a vertical stack of charge storage regions that are located at levels of the sacrificial material layers 42 and store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the silicon oxide blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a silicon oxide blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the silicon oxide blocking dielectric layer 52 and the tunneling dielectric layer 56. In one embodiment, the first semiconductor channel layer 601, the tunneling dielectric layer 56, the charge storage layer 54, and the silicon oxide blocking dielectric layer 52 can have vertically coincident sidewalls.

Figure 5E:
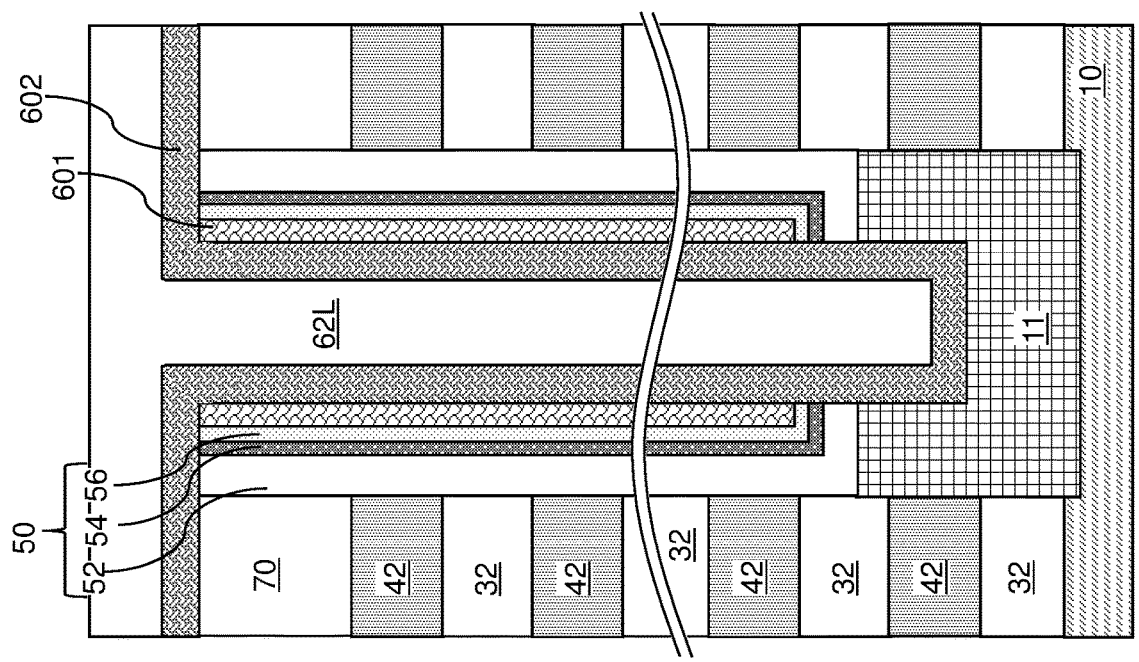

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
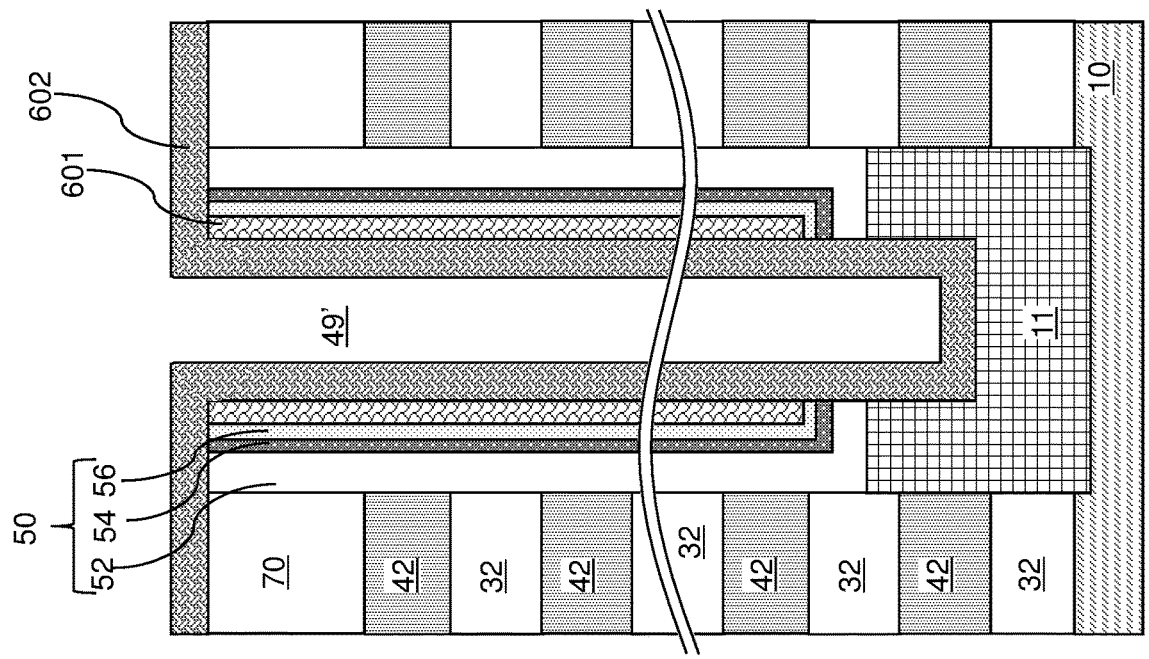

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the second semiconductor channel layer 602. Further, the material of the dielectric core layer 62L can be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 5H, a doped semiconductor material having a doping of a second conductivity type can be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material can be in a range from $5.0 \times 10^{18}/\text{cm}^3$ to $2.0 \times 10^{21}/\text{cm}^3$, although lesser and greater dopant concentrations can also be employed. The doped semiconductor material can be, for example, doped polysilicon.

Excess portions of the deposited semiconductor material can be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 can be concurrently removed by a planarization process. Each remaining portion of the second semiconductor channel layer 602 can be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a silicon oxide blocking dielectric layer 52 collectively constitutes a memory film 50, which includes a vertical stack of memory elements that can store a respective data bit with a macroscopic retention time. As used herein, a macroscopic retention time refers to a retention time suitable for operation of a memory device as a permanent memory device such as a retention time in excess of 24 hours.

Each combination of a memory film 50 and a vertical semiconductor channel 60 within a memory opening 49 constitutes a memory stack structure 55. Each memory film 50 comprises, from outside to inside, a silicon oxide blocking dielectric layer 52, a vertical stack of charge storage elements located at levels of the sacrificial material layers 42 (as embodied as the charge storage layer 54), and a tunneling dielectric layer 56. The memory stack structure 55 is a combination of a semiconductor channel 60, a tunneling dielectric layer 56, a vertical stack of charge storage elements as embodied as portions of the charge storage layer 54 located at levels of the sacrificial material layers 42, and a silicon oxide blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
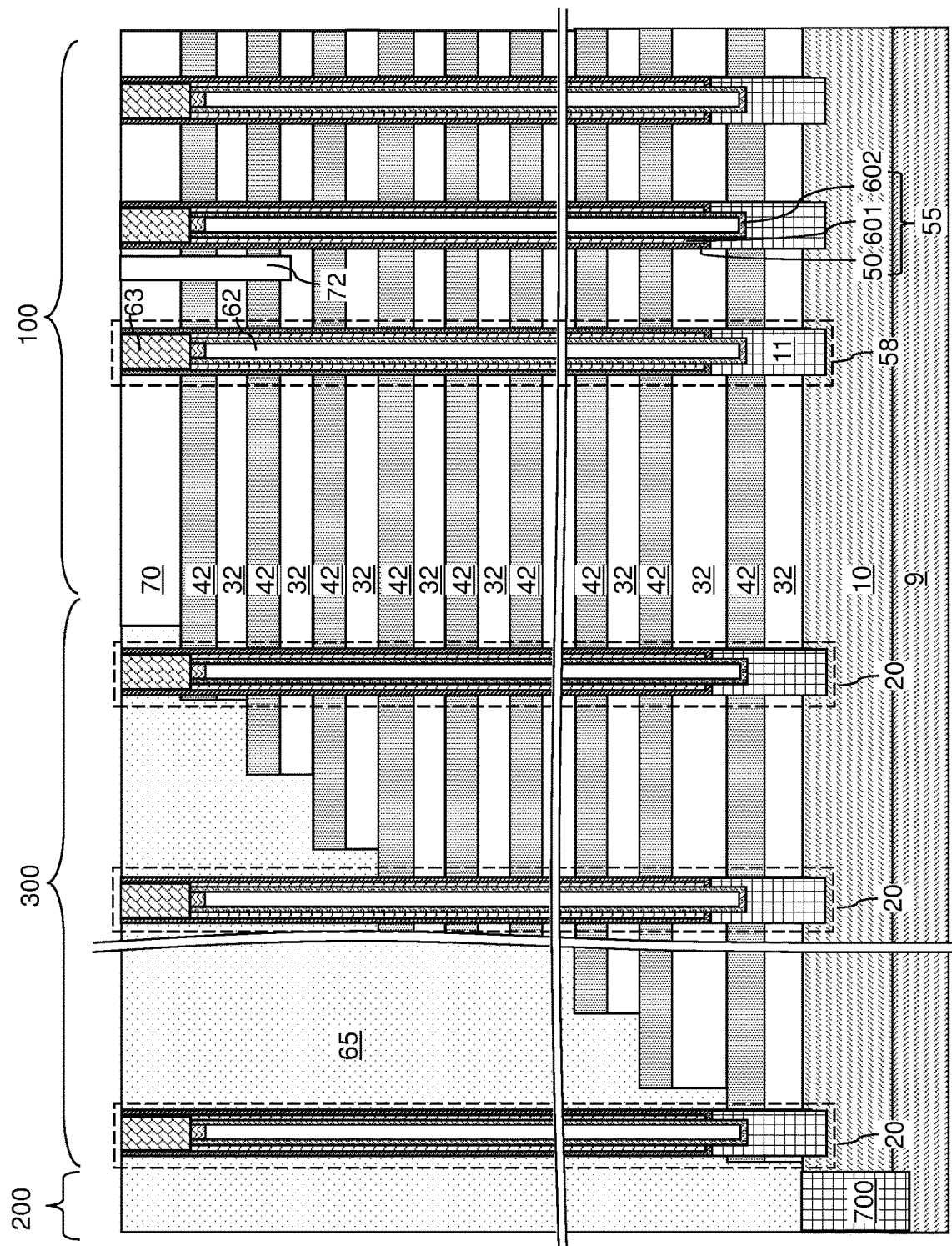
FIG. 6 is a schematic vertical cross-sectional view of the first exemplary structure after formation of memory opening fill structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60, a vertical stack of charge storage regions (as embodied as a charge storage layer 54) laterally surrounding the tunneling dielectric layer 56, and an optional silicon oxide blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
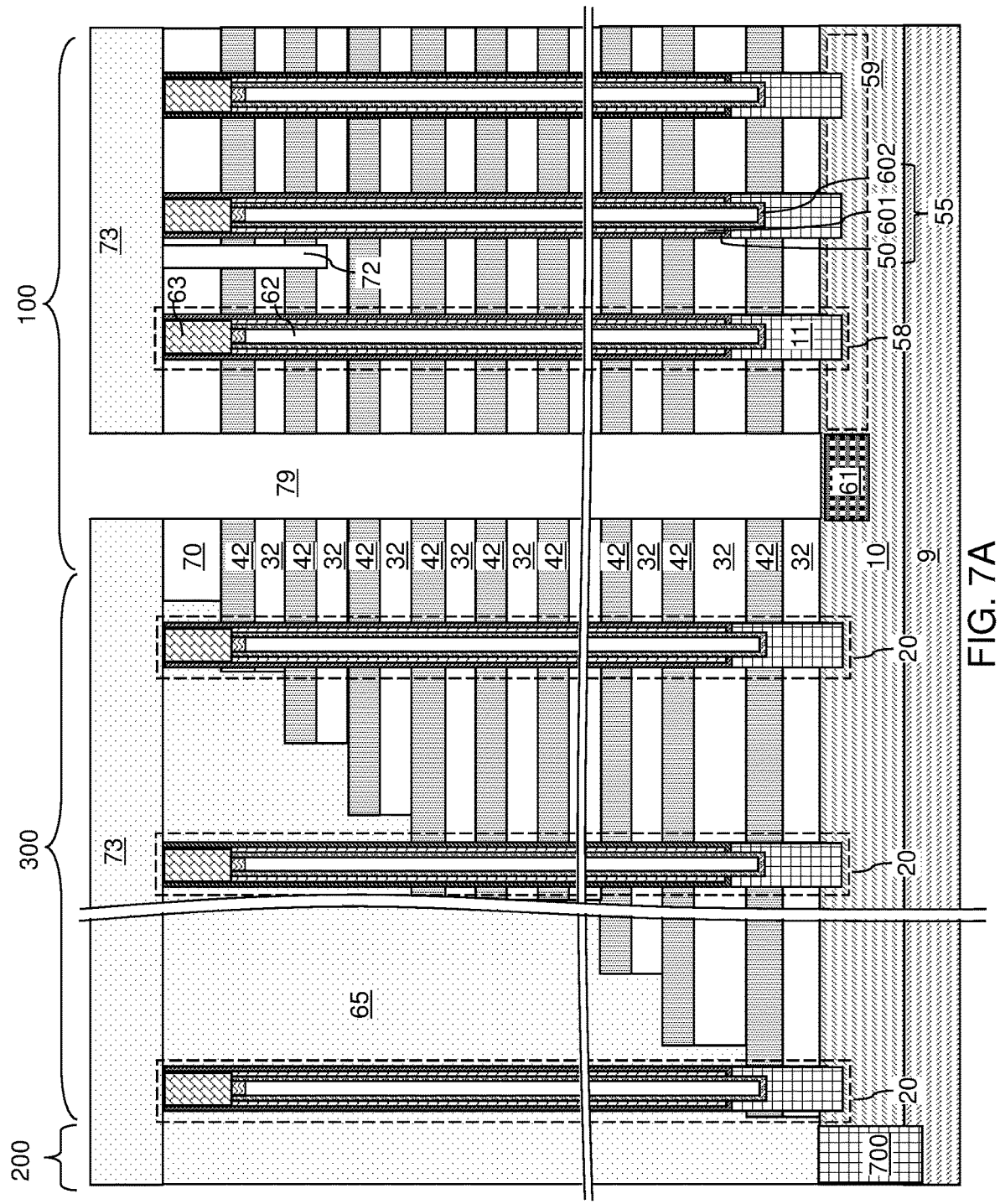
FIG. 7A is a schematic vertical cross-sectional view of the first exemplary structure after formation of backside trenches according to the first embodiment of the present disclosure.
Figure 7B:
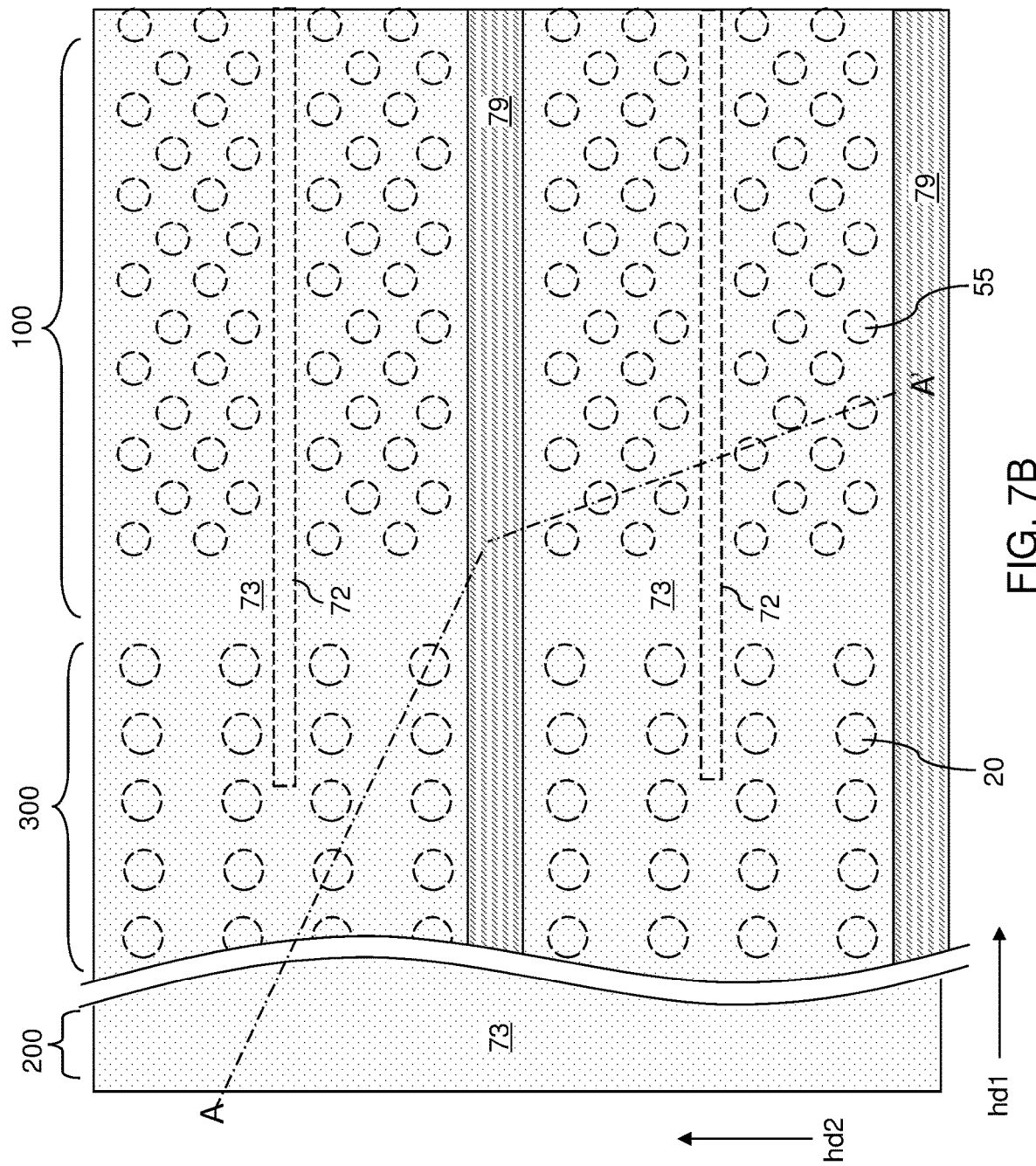
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact-level dielectric layer 73 can be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 can include silicon oxide. The contact-level dielectric layer 73 can have a thickness in a range from 50 nm to 500 nm, although lesser and greater thicknesses can also be employed.

A photoresist layer (not shown) can be applied over the contact-level dielectric layer 73, and is lithographically patterned to form openings in areas between clusters of memory stack structures 55. The pattern in the photoresist layer can be transferred through the contact-level dielectric layer 73, the alternating stack (32, 42) and/or the retro-stepped dielectric material portion 65 employing an anisotropic etch to form backside trenches 79, which vertically extend from the top surface of the contact-level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Dopants of the second conductivity type can be implanted into portions of the semiconductor material layer 10 that underlie the backside trenches 79 to form source regions 61. The atomic concentration of the dopants of the second conductivity type in the source regions 61 can be in a range from $5.0 \times 10^{18}/cm^3$ to $2.0 \times 10^{21}/cm^3$, although lesser and greater atomic concentrations can also be employed. Surface portions of the semiconductor material layer 10 that extend between each source region 61 and adjacent memory opening fill structures 58 comprise horizontal semiconductor channels 59.

Figure 8:
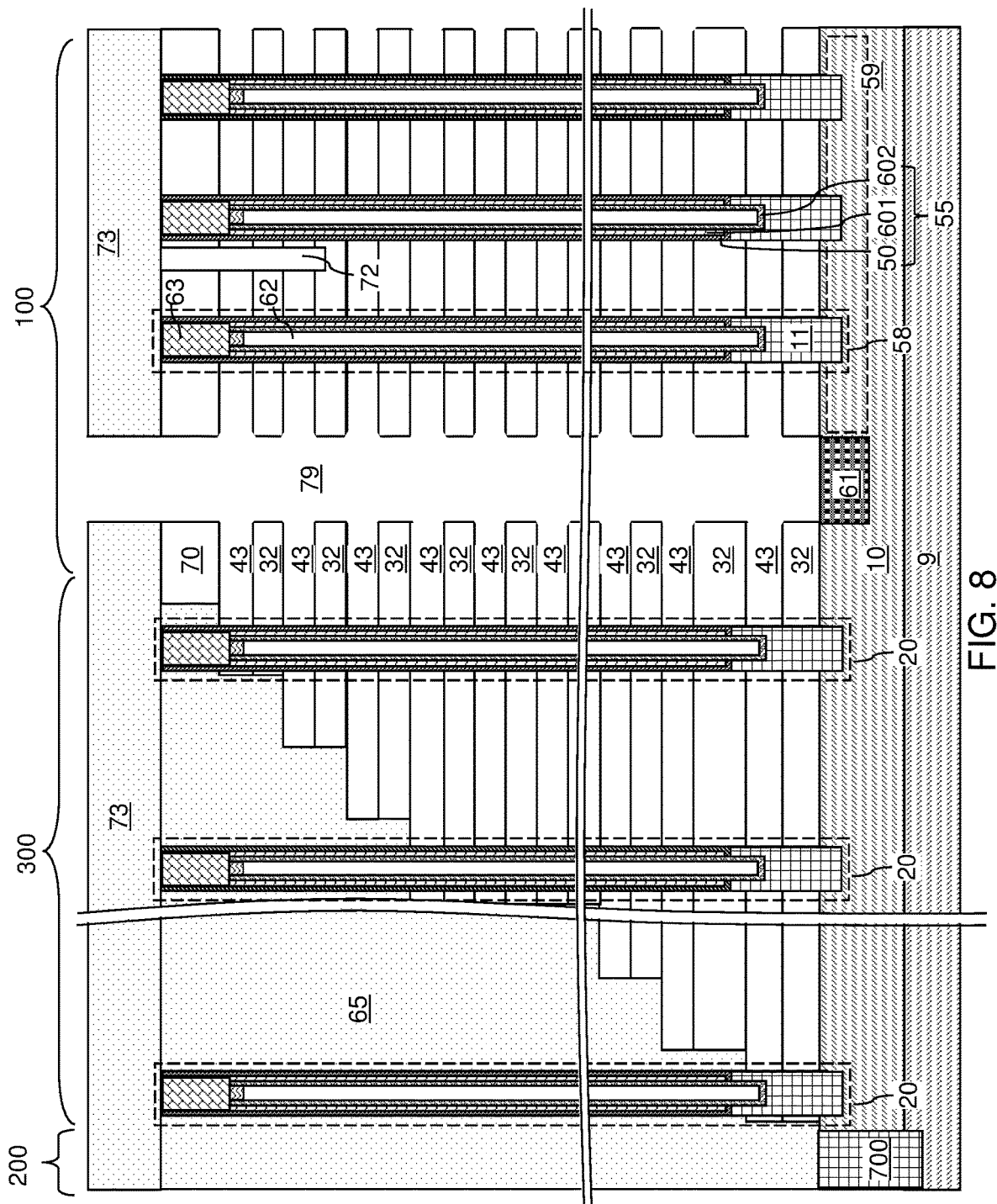
FIG. 8 is a schematic vertical cross-sectional view of the first exemplary structure after formation of backside recesses according to the first embodiment of the present disclosure.

Referring to FIGS. 8 and 9A, an etchant that selectively etches the second material of the sacrificial material layers 42 with respect to the first material of the insulating layers 32 can be introduced into the backside trenches 79 by performing a first isotropic etch process. FIG. 9A illustrates a region of the first exemplary structure of FIG. 8. Backside recesses 43 are formed in volumes from which the sacrificial material layers 42 are removed. The sacrificial material layers 42 are removed selective to the insulating layers 32 by an isotropic etch process that is selective to silicon oxide of the silicon oxide blocking dielectric layer 52. In one embodiment, the removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50, which is silicon oxide of the silicon oxide blocking dielectric layer 52. In one embodiment, the sacrificial material layers 42 can include silicon nitride, and the materials of the insulating layers 32 and the retro-stepped dielectric material portion 65 can be selected from silicon oxide and dielectric metal oxides.

The first isotropic etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structures 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings 49 in which the memory stack structures 55 are formed are herein referred to as front side openings or front side cavities in contrast with the backside recesses 43. Cylindrical surface segments of each silicon oxide blocking dielectric layer 52 are physically exposed to the backside recesses 43 after removing the sacrificial material layers 42 selective to the insulating layers 32. The capillary force that the wet etch process applied to the insulating layers 32 during the wet etch process can limit the minimum thickness of each insulating layer 32.

Referring to FIG. 9B, each of the backside recesses 43 can be expanded by isotropically etching surface portions of the insulating layers 32 by performing a second isotropic etch process. The second isotropic etch process includes an isotropic etch process that applies little or no capillary force on the insulating layers 32. In one embodiment, the second isotropic etch process can be a dry isotropic etch process such as a remote-plasma-assisted dry etch process or a chemical dry etch process. The chemistry of the second isotropic etch process can be selected to isotropically etch the insulating layers 32. For example, the chemistry of the second isotropic etch process can isotropically etch silicon oxide. The remote-plasma-assisted dry etch process or the chemical dry etch process isotropically recesses the cylindrical surface segments of the outer sidewall of the silicon oxide blocking dielectric layer 52 concurrently with isotropic recessing of physically exposed surfaces of the insulating layer 32.

A remote-plasma-assisted dry etch process which involves simultaneous exposure of the first exemplary structure to plasma by-products including hydrogen atoms and halogen atoms. Remote plasma excitation of the hydrogen-containing plasma and halogen-containing plasma prevents direct damage by the plasma. In one embodiment, the halogen-containing plasma may include fluorine-containing plasma. Such a remote-plasma-assisted dry etch process can isotropically etch silicon oxide selective to silicon. An exemplary remote-plasma-assisted dry etch process is the SiConi™ etch process provided by Applied Materials, Inc™, which includes the simultaneous exposure of the insulating layers 32 to $H_2$, $NF_3$ and $NH_3$ plasma by-products.

A chemical dry etch process is a process in which gaseous forms of chemicals are injected into a process chamber and reacts with a material to form a volatile compound to etch the material. A chemical dry etch process is isotropic, and the etch rate can be the same on all etched surfaces. For example, hydrofluoric acid vapor can be employed as an etchant in a chemical dry etch process for etching silicon oxide.

In one embodiment, each of the insulating layers 32 can have a respective pre-thinning thickness before and after formation of the backside recesses 43 using the first isotropic etch process, and prior to the second isotropic etch process. The respective pre-thinning thickness can be a respective thickness as provided within the alternating stack (32, 42) at the processing steps of FIG. 2. Each of the insulating layers 32 can have a respective post-thinning thickness that is in a range from 20% to 90% of the respective pre-thinning thickness after the second isotropic etch process, such as the remote-plasma-assisted dry etch process or the chemical dry etch process.

In one embodiment, an inner cylindrical sidewall 519 of the silicon oxide blocking dielectric layer 52 has a straight vertical profile through plural insulating layers 32 after the remote plasma assisted dry etch process or the chemical dry etch process, an outer sidewall of the silicon oxide blocking dielectric layer 52 has a laterally undulating vertical cross-sectional profile and has a greater thickness at levels of the insulating layers 32 than at levels of the backside recesses 43. The outer sidewall of the silicon oxide blocking dielectric layer 52 can have first vertical sidewall segments 511 that contact the insulating layers 32, and can have second vertical sidewall segments 512 located at levels of the backside recesses 43. The first vertical sidewall segments 511 are laterally offset outward with respect to the second vertical sidewall segments 512 by the etch distance of the second isotropic etch process into the silicon oxide blocking dielectric layer 52.

The inner cylindrical sidewall 519 of the silicon oxide blocking dielectric layer 52 has a straight vertical cross-sectional profile extending through each level of the first vertical sidewall segments 511 of the outer sidewall of the silicon oxide blocking dielectric layer 52, and extending through each level of the second vertical sidewall segments 512 of the outer sidewall of the silicon oxide blocking dielectric layer 52. In one embodiment, the first vertical sidewall segments 511 can be laterally spaced from the inner cylindrical sidewall 519 of the silicon oxide blocking dielectric layer 52 by a first thickness t1 of the silicon oxide blocking dielectric layer 52, and the second vertical sidewall segments 512 can be laterally spaced from the inner cylindrical sidewall 519 of the silicon oxide blocking dielectric layer 52 by a second thickness t2 of the silicon oxide blocking dielectric layer 52 that is less than the first thickness t1 of the silicon oxide blocking dielectric layer 52.

In one embodiment, one of the second vertical sidewall segments 512 of the outer sidewall of the silicon oxide blocking dielectric layer 52 can be connected to a pair of adjacent first vertical sidewall segments 511 through a pair of annular tapered connecting surface segments 513. In one embodiment, each of the second vertical sidewall segments 512 can be connected to a respective pair of adjacent first vertical sidewall segments 511 through a respective pair of annular tapered connecting surface segments 513. In one embodiment, each the pair of annular tapered connecting surfaces segments 513 has a respective concave tapered surface due to the isotropic nature of the second isotropic etch process. In one embodiment, each of the concave tapered surfaces can have a radius of curvature Rc that is the same as a lateral offset distance between the second vertical sidewall segments 512 and the first vertical sidewall segments 511.

In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. Since the thickness of the insulating layers 32 is thinned during the second isotropic etch, the height of the backside recesses 43 is increased, which permits subsequent formation of thicker electrically conductive layers with a lower resistance in the backside recesses 43.

Referring to FIG. 9C, physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10. Dopants in the drain regions 63, the source regions 61, and the semiconductor channels 60 can be activated during the anneal process that forms the planar dielectric portions 616 and the tubular dielectric spacers 116. Alternatively, an additional anneal process may be performed to active the electrical dopants in the drain regions 63, the source regions 61, and the semiconductor channels 60.

Referring to FIG. 9D, a backside blocking dielectric layer 44 can be optionally formed. The backside blocking dielectric layer 44, if present, comprises a dielectric material that functions as a control gate dielectric for the control gates to be subsequently formed in the backside recesses 43. In case the silicon oxide blocking dielectric layer 52 is present within each memory opening, the backside blocking dielectric layer 44 is optional. In case the silicon oxide blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9D, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 9E:
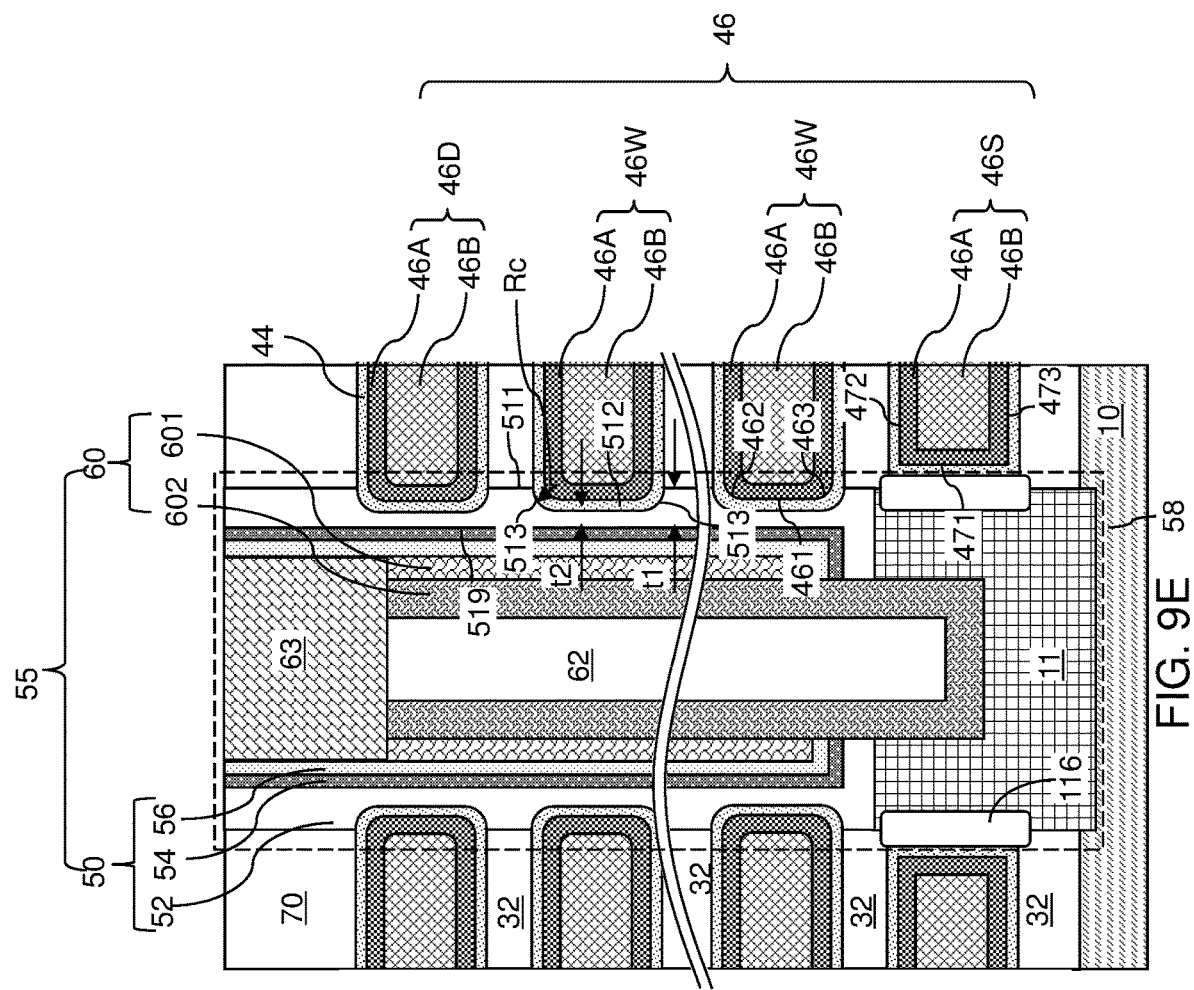
Figure 10:
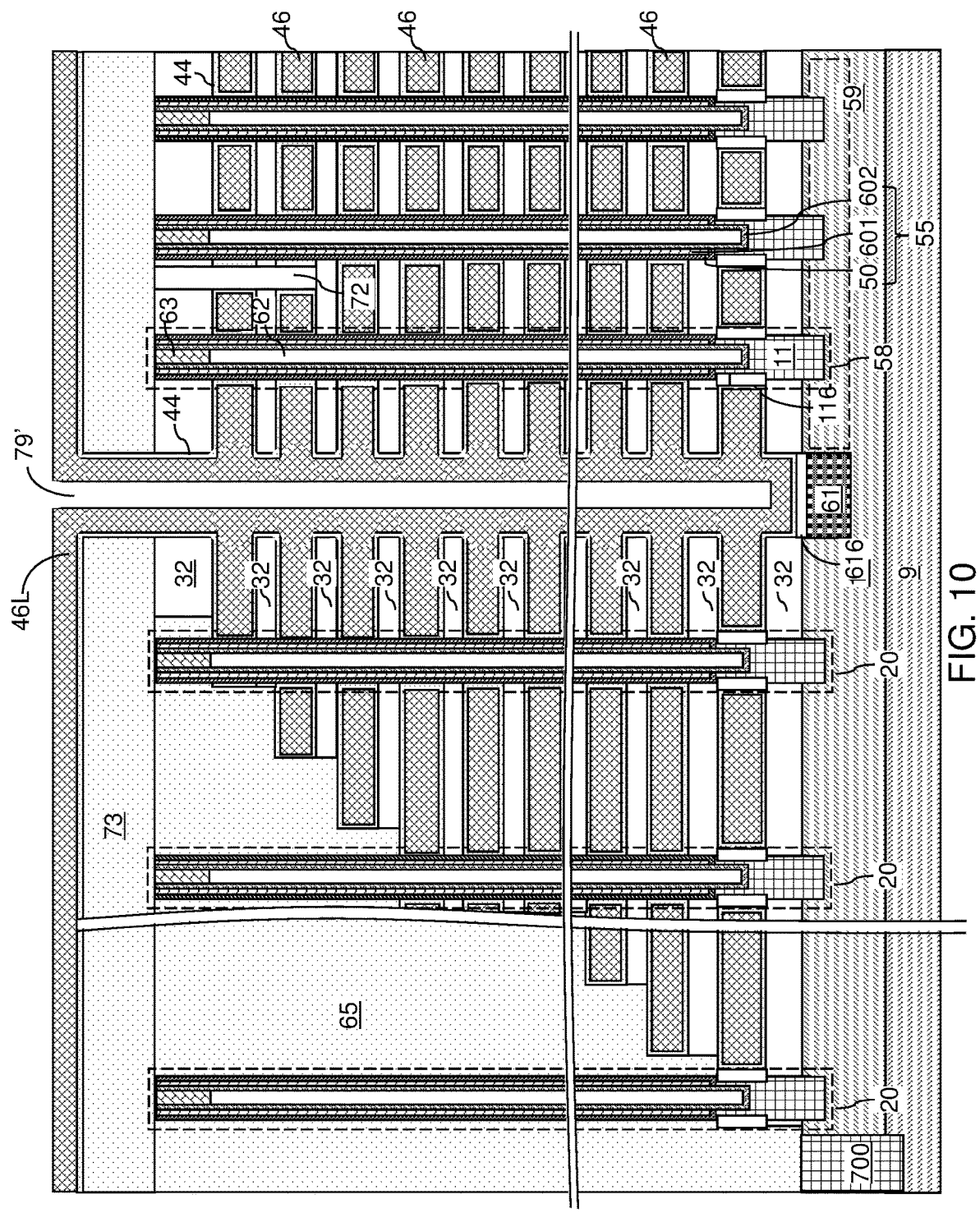
FIG. 10 is a schematic vertical cross-sectional view of the first exemplary structure at the processing step of FIG. 9E.

Referring to FIGS. 9E and 10, a metal fill material is deposited in the plurality of backside recesses 43, on the sidewalls of the at least one the backside trench 79, and over the top surface of the contact-level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which can block diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact-level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact-level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

In one embodiment shown in FIG. 9C, each electrically conductive layer 46 which comprises a word line 46W or optionally a drain select gate electrode 46D within a subset of the electrically conductive layers 46 has a vertical cylindrical sidewall 461 that laterally surrounds the memory opening fill structure 58, an upper convex surface 462 adjoined to an upper end of the vertical cylindrical sidewall 461, and a lower convex surface 463 adjoined to a lower end of the vertical cylindrical sidewall 461. In one embodiment, a bottommost one of the electrically conductive layers 46 (e.g., a source select gate electrode 46S) has a vertical cylindrical sidewall 471 having an upper periphery that coincides with an inner periphery of an upper horizontal surface 472 of the bottommost one of the electrically conductive layers 46 and having a lower periphery that coincides with an inner periphery of a lower horizontal surface 473 of the bottommost one of the electrically conductive layers 46. In other words, the source select gate electrode 46S lacks the upper and lower convex surfaces present in the word lines 46W.

Figure 11A:
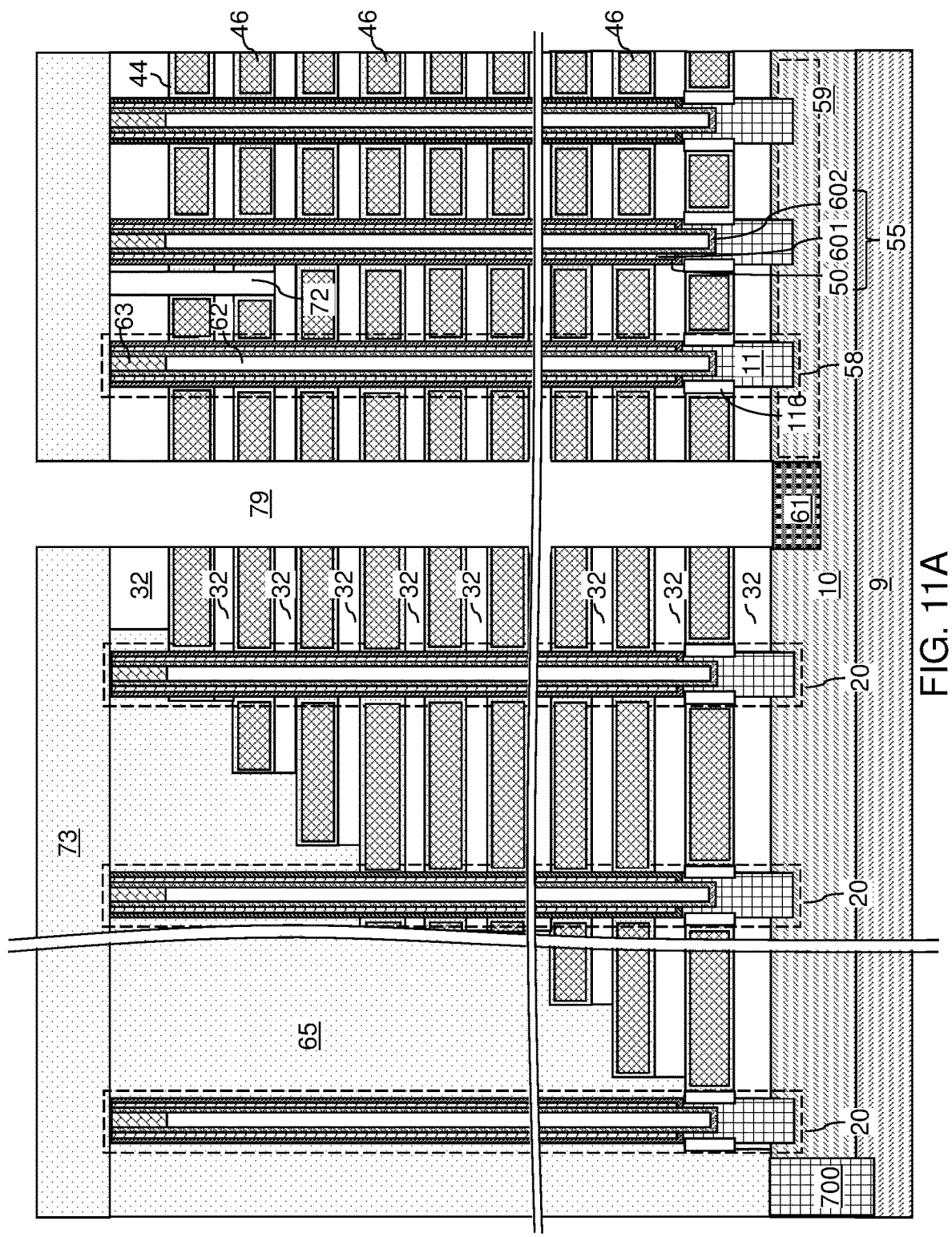
FIG. 11A is a schematic vertical cross-sectional view of the first exemplary structure after removal of a deposited conductive material from within the backside trench according to the first embodiment of the present disclosure.
Figure 11B:
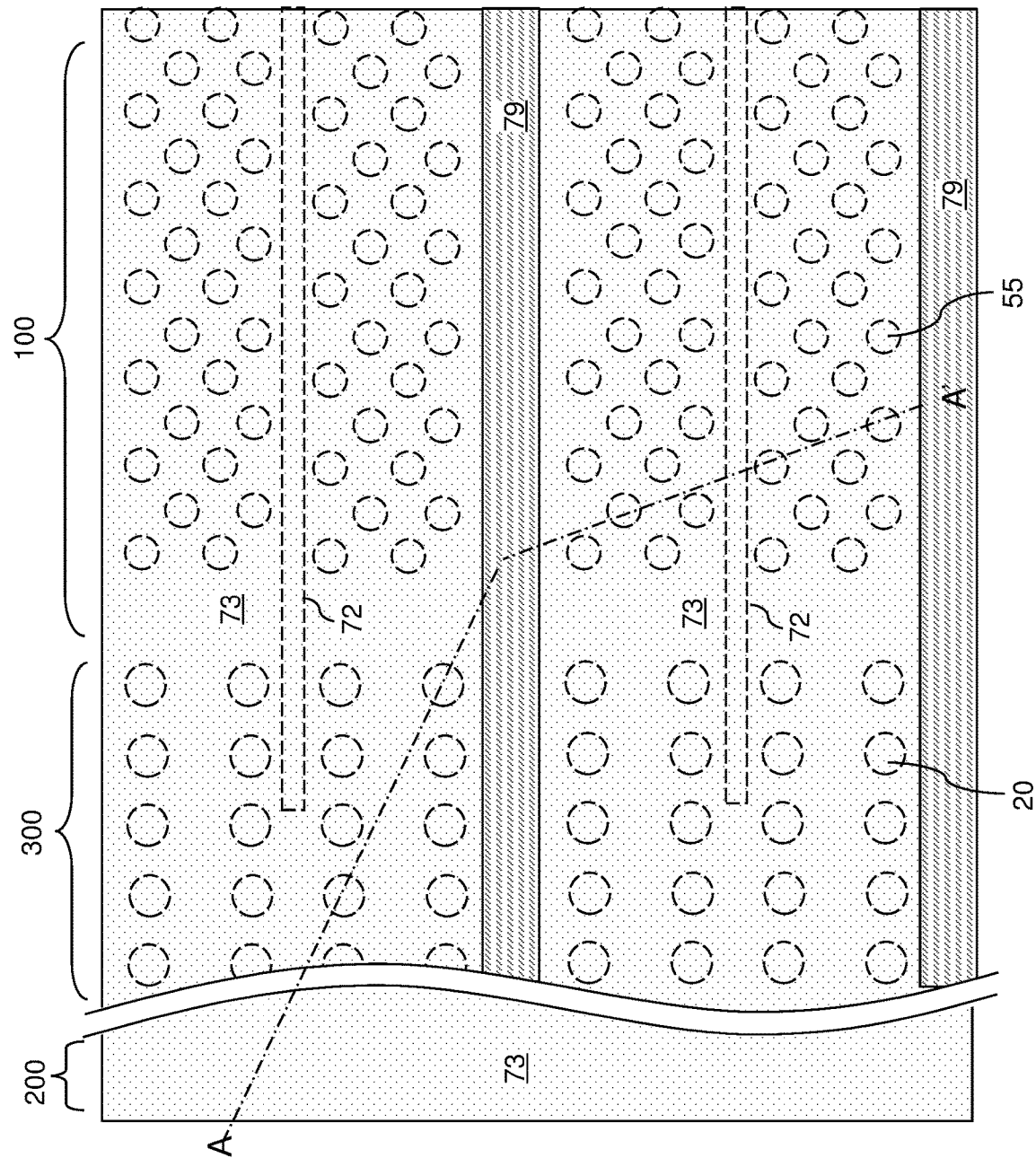
FIG. 11B is a partial see-through top-down view of the first exemplary structure of FIG. 11A. The vertical plane A-A' is the plane of the schematic vertical cross-sectional view of FIG. 11A.

Referring to FIGS. 11A and 11B, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12:
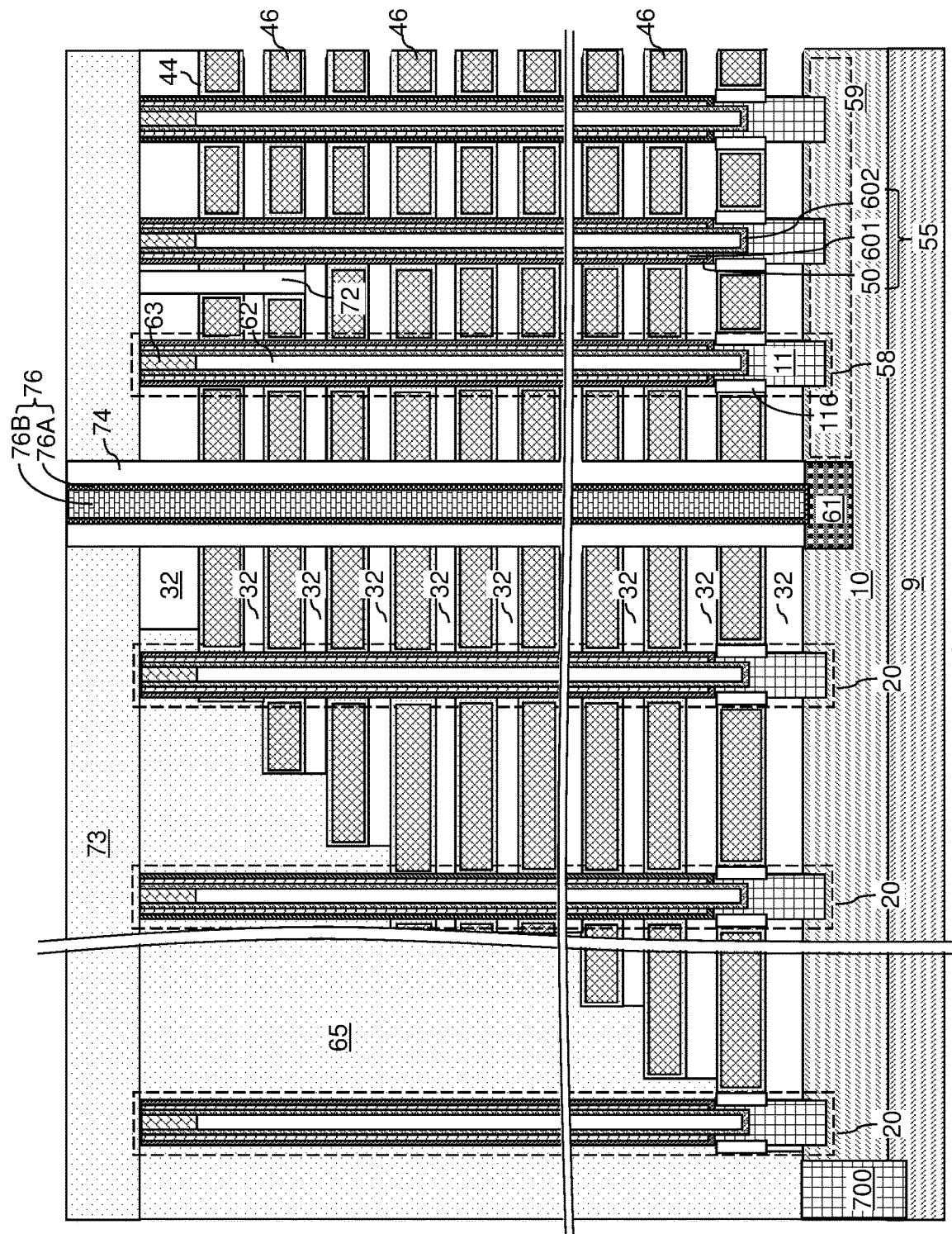
FIG. 12 is a schematic vertical cross-sectional view of the first exemplary structure after formation of an insulating spacer and a backside contact structure according to the first embodiment of the present disclosure.

Referring to FIG. 12, an insulating material layer can be formed in the backside trenches 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact-level dielectric layer 73 overlying the alternating stack (32, 46) as a stopping layer. If chemical mechanical planarization (CMP) process is employed, the contact-level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Figure 13A:
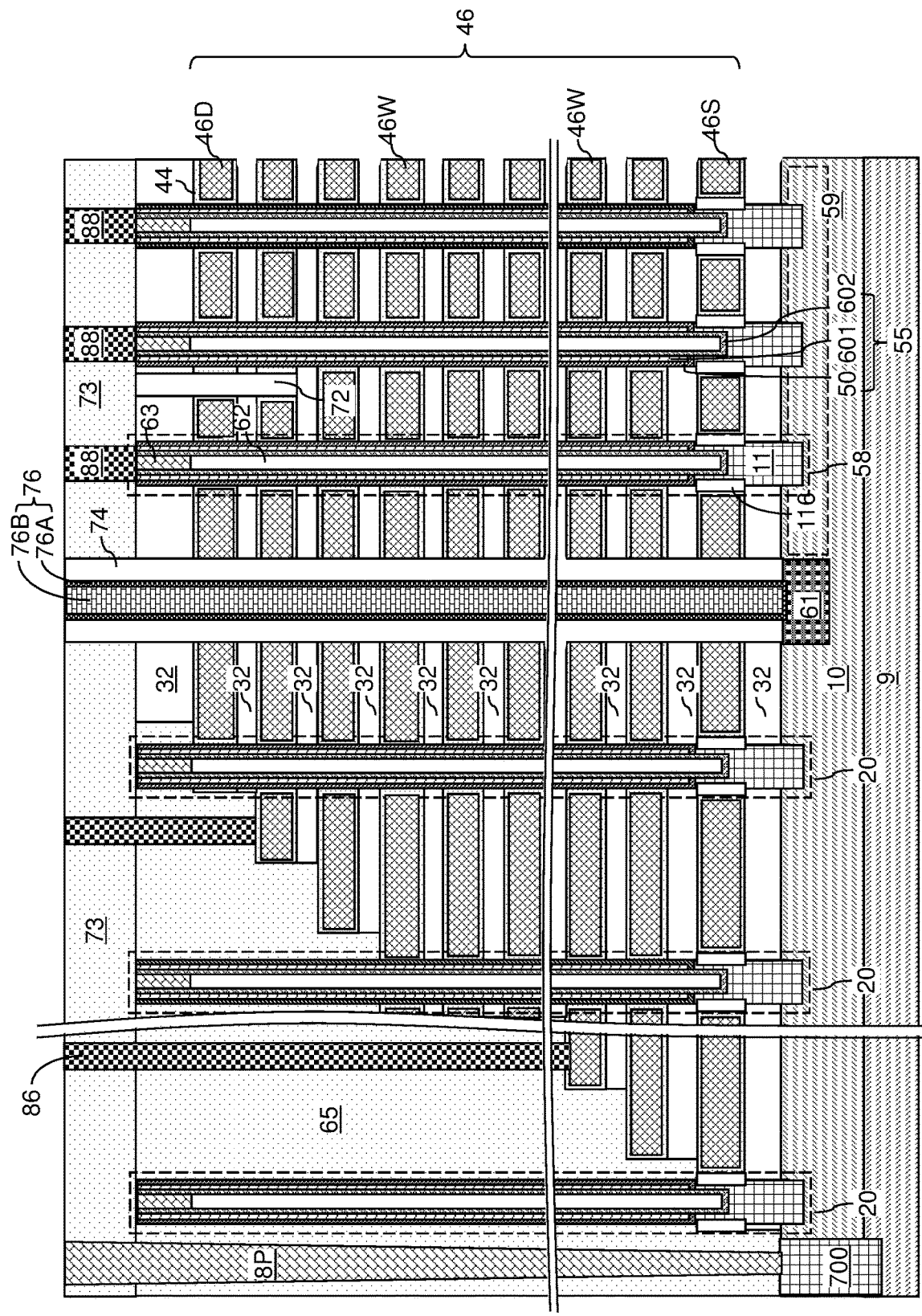
FIG. 13A is a schematic vertical cross-sectional view of the first exemplary structure after formation of additional contact via structures according to the first embodiment of the present disclosure.
Figure 13B:
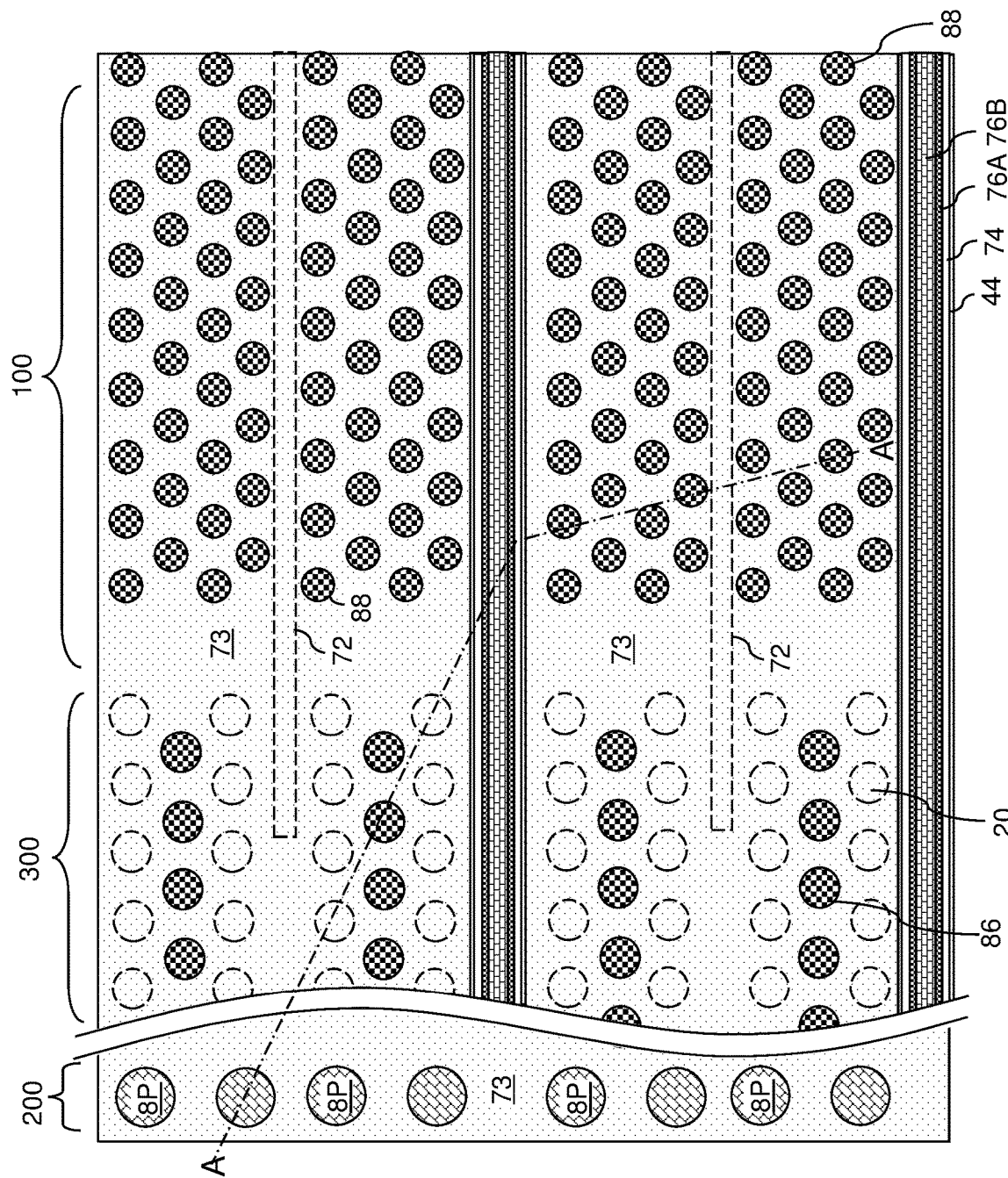
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact-level dielectric layer 73, and optionally through the retro-stepped dielectric material portion 65. For example, drain contact via structures 88 can be formed through the contact-level dielectric layer 73 on each drain region 63. Word line contact via structures 86 can be formed on the electrically conductive layers 46 through the contact-level dielectric layer 73, and through the retro-stepped dielectric material portion 65. Peripheral device contact via structures 8P can be formed through the retro-stepped dielectric material portion 65 directly on respective nodes of the peripheral devices.

Figure 14:
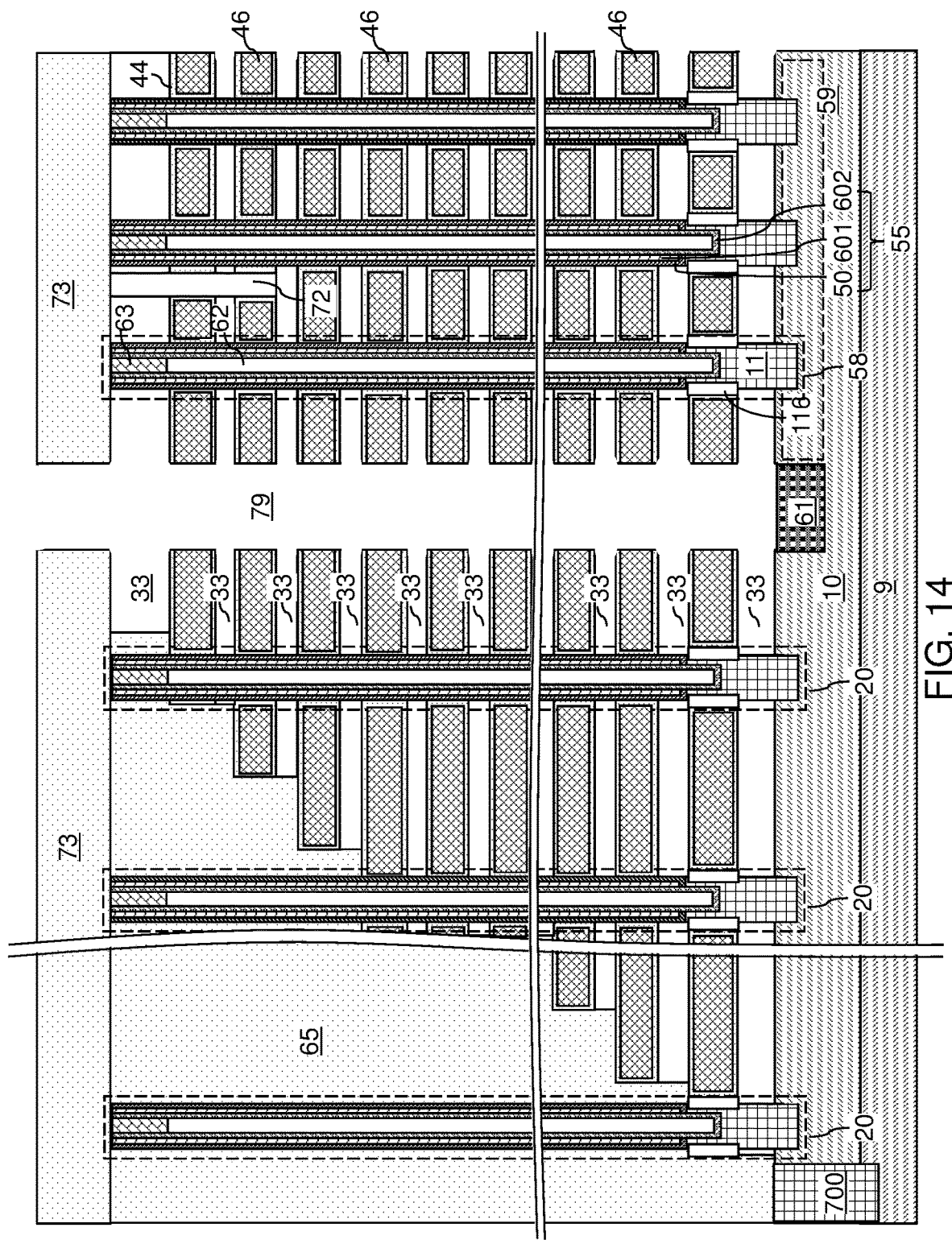
FIG. 14 is a vertical cross-sectional view of an alternative embodiment of the first exemplary structure after formation of insulating-level backside recesses according to the first embodiment of the present disclosure.

Referring to FIG. 14, an alternative embodiment of the first exemplary structure can be derived from the first exemplary structure of FIGS. 11A and 11B by removing the insulating layers 32 and the insulating cap layer 70 selective to the backside blocking dielectric layers 44, the electrically conductive layers 46, the source regions 61, and the contact-level dielectric layer 73. In this case, the contact-level dielectric layer 73 can include a dielectric material having a lower etch rate than the materials of the insulating layers 32 and the insulating cap layer 70. For example, the insulating layers 32 and the insulating cap layer 70 can include silicon oxide, and the contact-level dielectric layer 73 may include silicon carbide nitride (SiCN), and/or may include a dielectric metal oxide material such as aluminum oxide, hafnium oxide, or titanium oxide. Insulating-level backside recesses 33 are formed in volumes from which the insulating layers 32 and the insulating cap layers 70 are removed.

Figure 15:
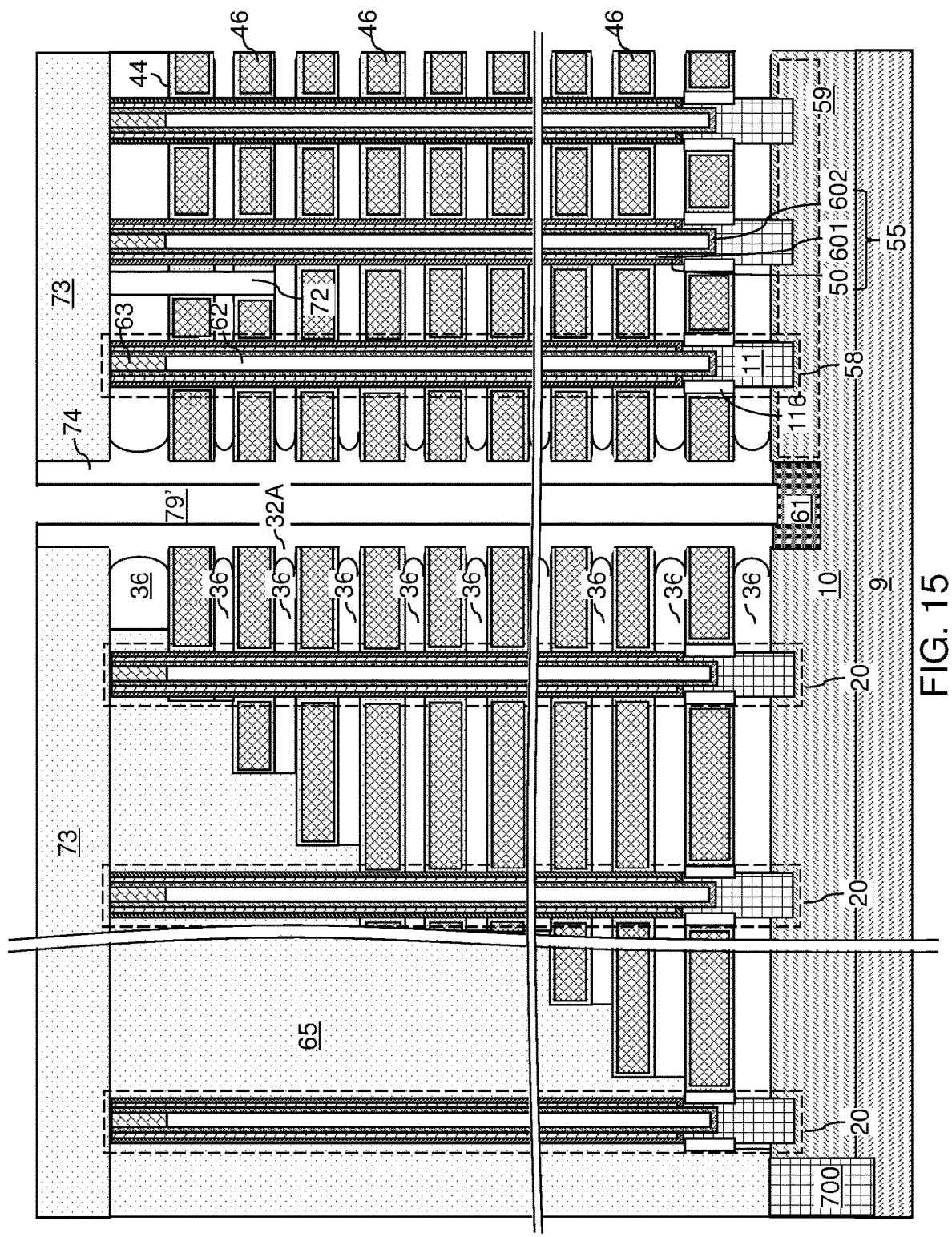
FIG. 15 is a vertical cross-sectional view of the alternative embodiment of the first exemplary structure after formation of air gaps according to the first embodiment of the present disclosure.

Referring to FIG. 15, an insulating material layer can be formed in the backside trenches 79 and over the contact-level dielectric layer 73 by a non-conformal deposition process. For example, plasma-enhanced chemical vapor deposition may be employed. The insulating material layer includes an insulating material such as silicon oxide, silicon nitride, a dielectric metal oxide, an organosilicate glass, or a combination thereof. In one embodiment, the insulating material layer can include silicon oxide. An anisotropic etch can be performed to remove horizontal portions of the insulating material layer from above the contact-level dielectric layer 73 and at the bottom of each backside trench 79. Each remaining portion of the insulating material layer in a respective backside trench 79 constitutes an insulating spacer 74. A backside cavity 79' is present within a volume surrounded by each insulating spacer 74. A top surface of the semiconductor material layer 10 can be physically exposed at the bottom of each backside trench 79.

Air gaps 36 can be formed at each level of the insulating-level backside recesses 33. Each air gap 36 can be laterally bounded by a neighboring pair of backside trenches 79, and can laterally surround each of the memory opening fill structures 58 located between the neighboring pair of backside trenches 79. In one embodiment, each air gap can be formed as a single contiguous volume that extends between a respective neighboring pair of backside trenches 79 and laterally surrounds, and encloses, each of the memory opening fill structures 58 located between the neighboring pair of backside trenches 79. Each air gap 36 can be formed between a vertically neighboring pair of electrically conductive layers 46, between the bottommost one of the electrically conductive layers 46 (e.g. 46S) and the top surface of the semiconductor material layer 10, or between the topmost one of the electrically conductive layers 46 (e.g., 46D) and the contact-level dielectric layer 73. Thus, the air gaps 36 constitute insulating regions that are interlaced with the electrically conductive layers 46 to provide an alternating stack of air gaps 36 and electrically conductive layers 46. In one embodiment, horizontal portions of the insulating spacer 74 which protrude into the backside recesses 43 form insulating layers 32A (e.g., silicon oxide layers) which at least partially surround the air gaps 36.

Figure 16A:
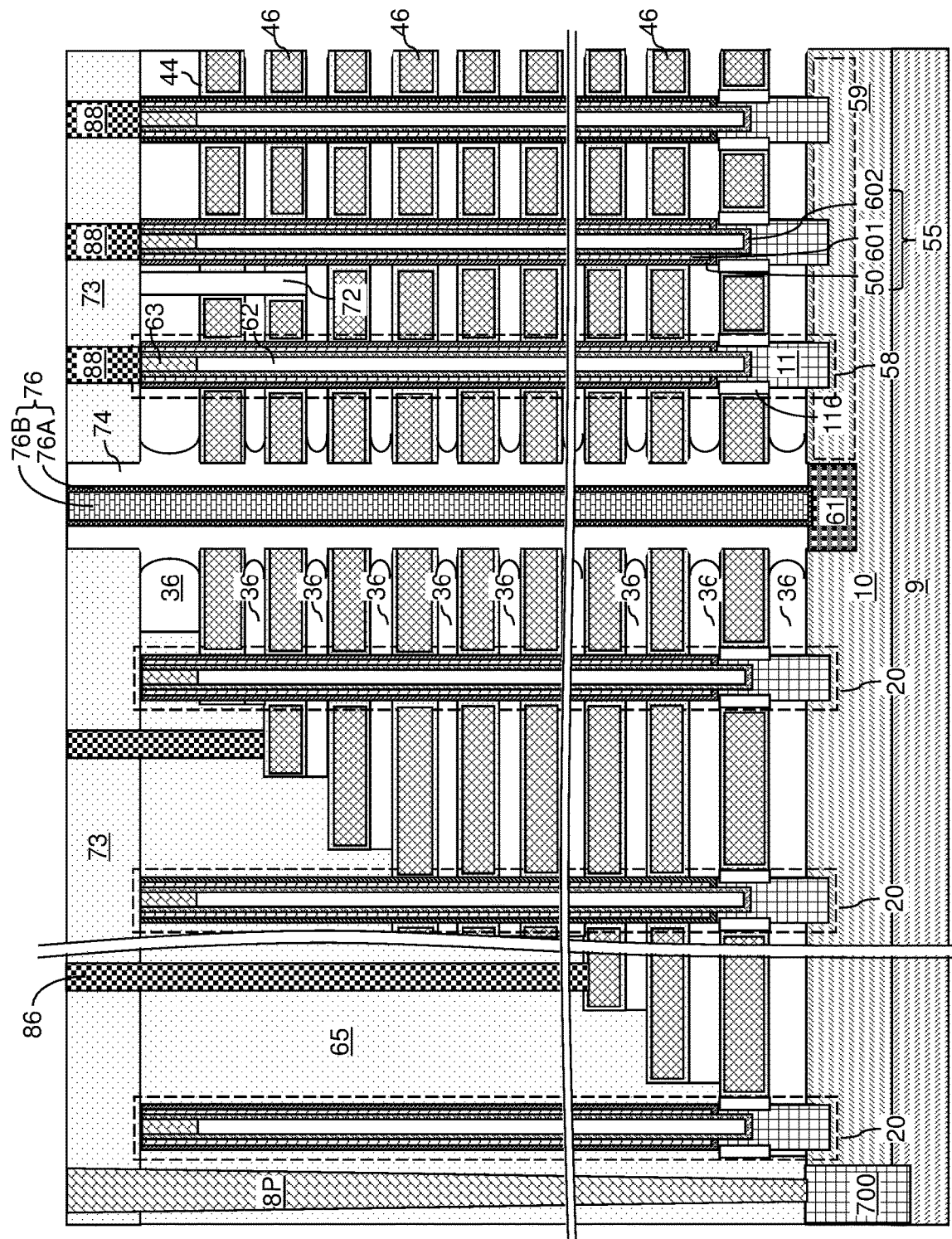
FIG. 16A is a schematic vertical cross-sectional view of the alternative embodiment of the first exemplary structure after formation of additional contact via structures according to the first embodiment of the present disclosure.

Referring to FIGS. 16A and 16B, the processing steps of FIGS. 12, 13A and 13B can be performed to form backside contact via structures 76 and the additional contact via structures (88, 86, 8P).

As shown in FIG. 16B, in this alternative embodiment, each word line 46W also has a vertical cylindrical sidewall 461 that laterally surrounds the memory opening fill structure 58, an upper convex surface 462 adjoined to an upper end of the vertical cylindrical sidewall 461, and a lower convex surface 463 adjoined to a lower end of the vertical cylindrical sidewall 461. In this alternative embodiment, a bottommost one of the electrically conductive layers 46 (e.g., the source select gate electrode 46S) also has a vertical cylindrical sidewall 471 having an upper periphery that coincides with an inner periphery of an upper horizontal surface 472 of the bottommost one of the electrically conductive layers 46S and having a lower periphery that coincides with an inner periphery of a lower horizontal surface 473 of the bottommost one of the electrically conductive layers 46S, but lacks the upper and lower convex surfaces.

Referring to FIGS. 1-16B and according to the first embodiment of the present disclosure, a three-dimensional memory device is provided, which comprises: an alternating stack of insulating layers 32 and word lines 46W located over a substrate (9, 10), and a memory opening fill structure 58 extending through the alternating stack (32, 46W), wherein: the memory opening fill structure comprises a memory film 50 and a vertical semiconductor channel 60 contacting an inner sidewall of the memory film 50, and the word lines 46W are thicker than the insulating layers 32. In other words, the thickness of each of the word lines 46W in the vertical direction perpendicular to the top surface of the substrate (9, 10) is greater than a thickness of each of the insulating layers 32 located between the word lines 46W by at least 10%, such as by at least 20%, for example by 20 to 100%, such as 25 to 50%.

In one embodiment, the memory film 50 comprises, from outside to inside, a silicon oxide blocking dielectric layer 52, a charge storage material (e.g., the charge storage layer 54 or discrete floating gates or dielectric charge storage material portions), and a tunneling dielectric layer 56, and an outer sidewall of the silicon oxide blocking dielectric layer 52 has a laterally undulating vertical cross-sectional profile in which first vertical sidewall segments 511 contacting the insulating layers (32, 36) are laterally offset outward with respective to second vertical sidewall segments 512 located at levels of the word lines 46W.

In one embodiment, an inner cylindrical sidewall 519 of the silicon oxide blocking dielectric layer 52 has a straight vertical cross-sectional profile extending through each level of the first vertical sidewall segments 511 of the outer sidewall of the silicon oxide blocking dielectric layer 52 and extending through each level of the second vertical sidewall segments 512 of the outer sidewall of the silicon oxide blocking dielectric layer 52. In one embodiment, the first vertical sidewall segments 511 are laterally spaced from the inner cylindrical sidewall 519 of the silicon oxide blocking dielectric layer 52 by a first thickness t1, and the second vertical sidewall segments 512 are laterally spaced from the inner cylindrical sidewall 519 of the silicon oxide blocking dielectric layer 52 by a second thickness t2 that is less than the first thickness t1.

In one embodiment, one of the second vertical sidewall segments 512 of the outer sidewall of the silicon oxide blocking dielectric layer 52 is connected to a pair of first vertical sidewall segments 511 through a pair of annular tapered connecting surface segments 513. In one embodiment, each the pair of annular tapered connecting surfaces segments 513 has a respective concave tapered surface. In one embodiment, each of the concave tapered surfaces has a radius of curvature Rc that is the same as a lateral offset distance between the one of the second vertical sidewall segments 512 and the pair of first vertical sidewall segments 511.

In one embodiment, each of the word lines 46W is spaced from the silicon oxide blocking dielectric layer 52 by a respective backside blocking dielectric layer 44. In one embodiment, one of the second vertical sidewall segments 512 of the outer sidewall of the silicon oxide blocking dielectric layer 52 contacts a vertical sidewall of one of the backside blocking dielectric layers 44, and the pair of annular tapered connecting surface segments 513 contacts concave tapered surfaces of the one of the backside blocking dielectric layers 44. In one embodiment, the charge storage material comprises the silicon nitride layer 54 that vertically extend through the alternating stack (32, 46W).

In one embodiment, the memory opening fill structure 58 comprises: a pedestal channel portion 11 contacting a top surface of a semiconductor material layer 10 located in, or over, the substrate (9, 10), and a tubular dielectric spacer 116 comprising a dielectric oxide material of a semiconductor material of the pedestal channel portion 11. In one embodiment, a periphery of a bottom surface of the silicon oxide blocking dielectric layer 52 coincides with a periphery of a top surface of the pedestal channel portion 11, and the vertical semiconductor channel 60 contacts a sidewall of the pedestal channel portion 11 and a recessed surface of the pedestal channel portion 11 that is adjoined to a bottom edge of the sidewall of the pedestal channel portion.

Referring to FIGS. 14-16B and according to the alternative configuration of the first embodiment of the present disclosure, a three-dimensional memory device is provided, which comprises: an alternating stack of air gaps 36 and word lines 46W located over a substrate (9, 10), and a memory opening fill structure 58 extending through the alternating stack (32, 46W), wherein: the memory opening fill structure comprises a memory film 50 and a vertical semiconductor channel 60 contacting an inner sidewall of the memory film 50, and the word lines 46W are thicker than the air gaps 32. In other words, the thickness of each of the word lines 46W in the vertical direction perpendicular to the top surface of the substrate (9, 10) is greater than a thickness of each of the air gaps 32 located between the word lines 46W by at least 10%, such as by at least 20%, for example by 20 to 100%, such as 25 to 50%.

According to an aspect of the present disclosure, a second exemplary structure according to a second embodiment of the present disclosure can be derived from the first exemplary structure of FIGS. 13A and 13B or the alternative embodiment thereof as illustrated in FIGS. 16A and 16B by employing a second exemplary memory opening fill structure 58 in lieu of each first exemplary memory opening fill structure 58. Support pillar structures 20 in the second exemplary structure can have a same type of structural modification relative to the support pillar structures 20 in the first exemplary structure as the changes in the second exemplary memory opening fill structures 58 relative to the first exemplary memory opening fill structures 58 of the first embodiment. FIGS. 17A-17F are sequential vertical cross-sectional views of a memory opening during formation of a second exemplary memory opening fill structure 58 according to the second embodiment of the present disclosure.

Referring to FIG. 17A, the second exemplary structure according to the second embodiment of the present disclosure can be derived from the first exemplary structure of FIG. 5C by forming a layer stack of a dielectric metal oxide blocking dielectric layer 51 and a silicon oxide blocking dielectric layer 52 in lieu of a silicon oxide blocking dielectric layer 52 of the first exemplary structure in each of the memory openings 49 and the support openings 19. In an alternative configuration of the second exemplary structure illustrated in FIG. 17G, an additional sacrificial material layer 53 is deposited into the memory opening 49 prior to depositing the layer stack of a dielectric metal oxide blocking dielectric layer 51 and a silicon oxide blocking dielectric layer 52 into the memory opening, such that the sacrificial material layer 53 contacts the metal oxide blocking dielectric layer 51 and the alternating stack of the insulating layers 32 and the sacrificial material layers 42.

The dielectric metal oxide blocking dielectric layer 51 includes a dielectric metal oxide material. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the dielectric metal oxide blocking dielectric layer 51 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide blocking dielectric layer 51 can be in a range from 1 nm to 20 nm, although lesser and greater thicknesses can also be employed. The dielectric metal oxide blocking dielectric layer 51 can subsequently function as an etch stop layer. In one embodiment, the dielectric metal oxide blocking dielectric layer 51 includes, and/or consists essentially of, aluminum oxide. In one embodiment, the dielectric metal oxide blocking dielectric layer 51 can include multiple dielectric metal oxide layers having different material compositions.

The silicon oxide blocking dielectric layer 52 of the second exemplary structure may have a thickness in a range from 2 nm to 15 nm, such as from 3 nm to 10 nm. The silicon oxide blocking dielectric layer 52 can be formed on the dielectric metal oxide blocking dielectric layer 51, and can be laterally surrounded by the dielectric metal oxide blocking dielectric layer 51. Subsequently, the charge storage layer 54, the tunneling dielectric layer 56, and the optional first semiconductor channel layer 601 can be sequentially deposited in the same manner as in the first embodiment.

Figures 17C, 17D:
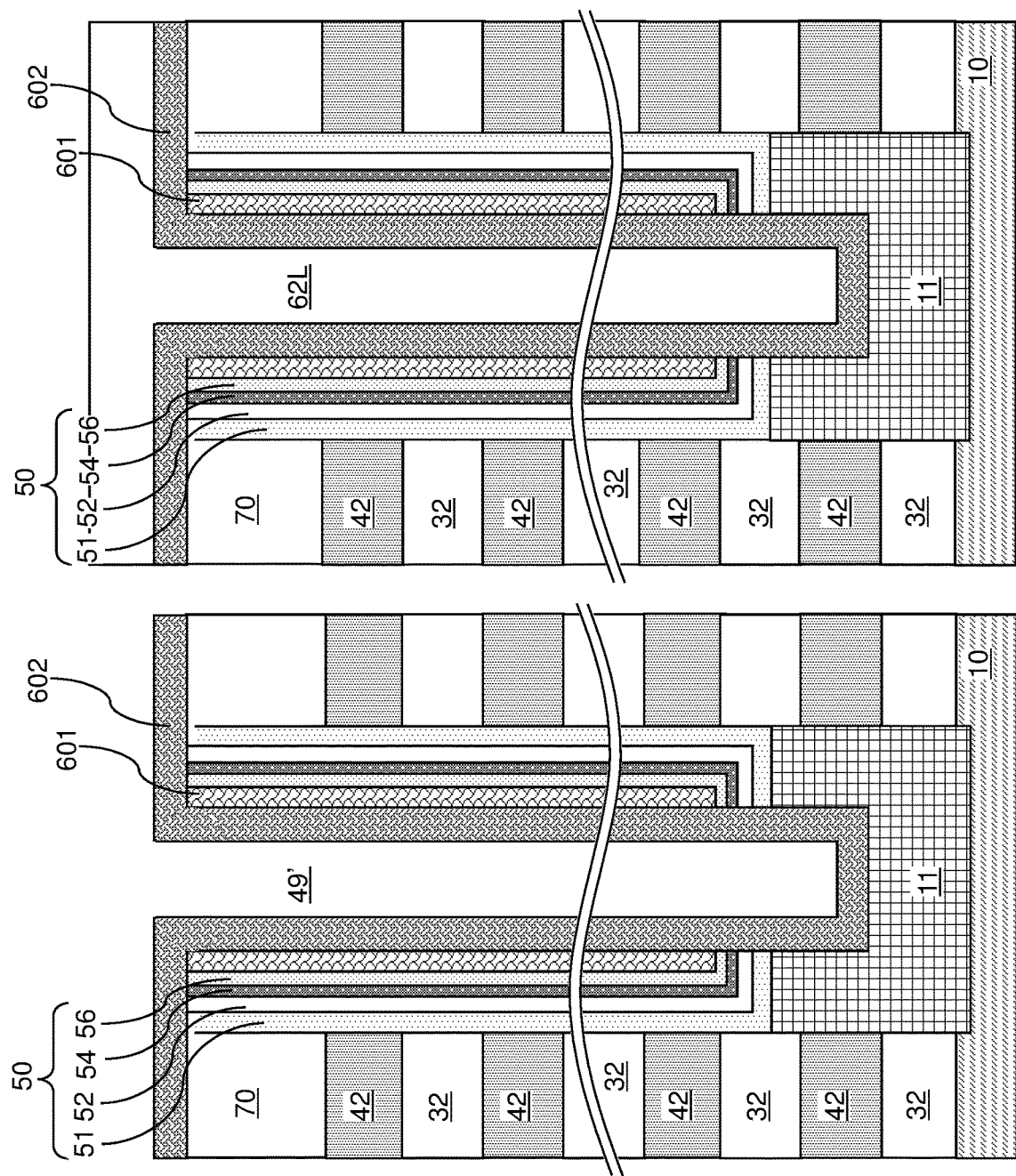
Figure 17G:
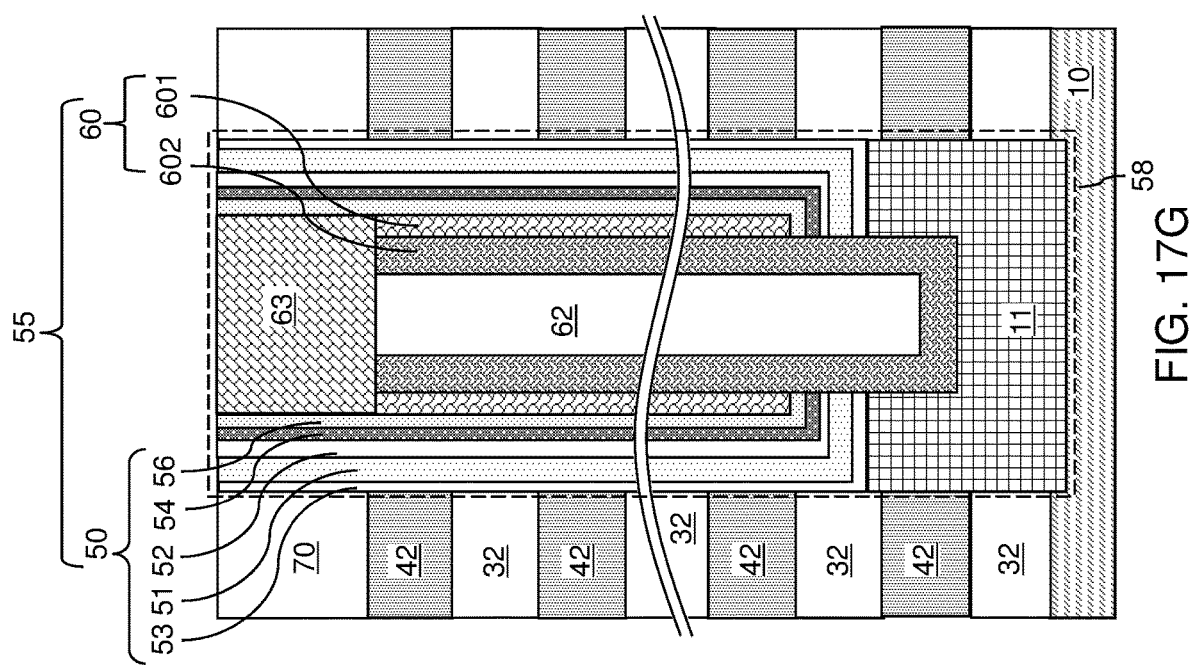
FIG. 17G is cross-sectional view of a memory opening during formation of an alternative configuration of the second exemplary memory opening fill structure according to the second embodiment of the present disclosure.

If the sacrificial material layer 53 is present, as shown in FIG. 17G, then it comprises the same material as the material of the insulating layers 32. For example, the sacrificial material layer 53 and the insulating layers 32 may comprise silicon oxide. The thickness of the sacrificial material layer 53 should be about the same as the amount of insulating layers 32 that will be removed during the subsequent etching which thins the insulating layers 32, such as a thickness in a range from 2 nm to 10 nm, such as from 3 nm to 8 nm.

Referring to FIG. 17B, the processing steps of FIG. 5D can be performed with a modification in the etch chemistry to etch horizontal portions of the first semiconductor channel layer 601, the tunneling dielectric layer 56, the charge storage layer 54, the silicon oxide blocking dielectric layer 52, and the dielectric metal oxide blocking dielectric layer 51.

Referring to FIG. 17C, the processing steps of FIG. 5E can be performed to deposit a second semiconductor channel layer 602.

Referring to FIG. 17D, the processing steps of FIG. 5F can be performed to deposit a dielectric core layer 62L.

Referring to FIG. 17E, the processing steps of FIG. 5G can be performed to form a dielectric core 62 within each memory opening 49 and within each support opening 19.

Referring to FIG. 17F, the processing steps of FIG. 5H can be performed to form a drain region 63 within each memory opening 49 and within each support opening 19.

Within each memory opening 49, a tunneling dielectric layer 56 is surrounded by a charge storage layer 54, and laterally surrounds a portion of the vertical semiconductor channel 60. Each adjoining set of a tunneling dielectric layer 56, a charge storage layer 54, a silicon oxide blocking dielectric layer 52, and a dielectric metal oxide blocking dielectric layer 51 collectively constitutes a memory film 50, which includes a vertical stack of memory elements that can store a respective data bit with a macroscopic retention time. In the alternative embodiment shown in FIG. 17G, the memory film also includes the sacrificial material layer 53.

Each combination of a memory film 50 and a vertical semiconductor channel 60 within a memory opening 49 constitutes a memory stack structure 55. Each memory film 50 comprises, from outside to inside, the optional sacrificial material layer 53, the dielectric metal oxide blocking dielectric layer 53, the silicon oxide blocking dielectric layer 52, the charge storage material (e.g., the charge storage layer 54 or discrete floating gates or portions of dielectric charge storage material), and a tunneling dielectric layer 56. The memory stack structure 55 is a combination of a semiconductor channel 60 and the memory film 50. Each combination of a pedestal channel portion 11 (if present), a memory stack structure 55, a dielectric core 62, and a drain region 63 within a memory opening 49 constitutes a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Subsequently, the processing steps FIGS. 7A and 7B, and 8 and 9A can be performed to form backside trenches 79 and backside recesses 43.

Referring to FIG. 18A, a second exemplary memory opening fill structure 58 is illustrated at the processing step that corresponds to the processing steps of FIGS. 8 and 9A.

Figure 18E:
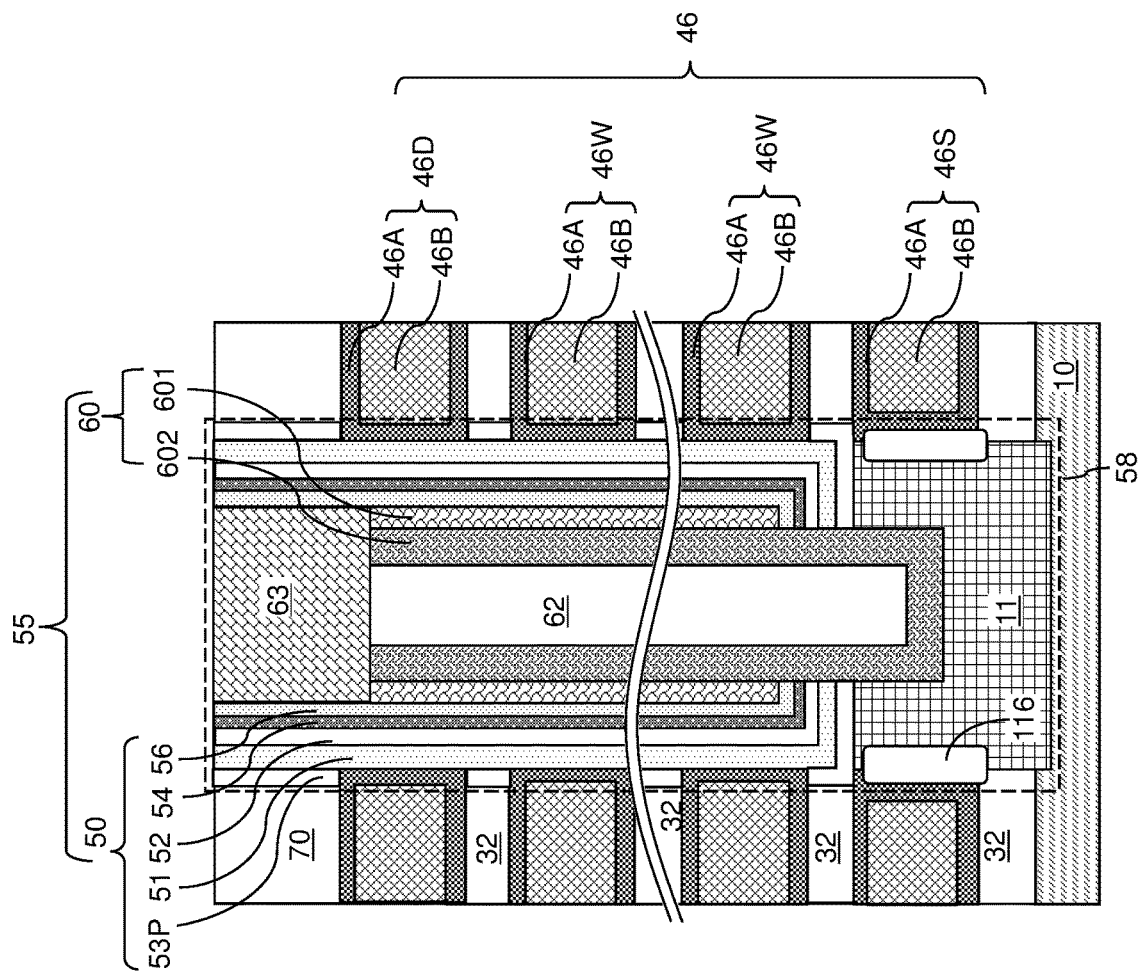
FIG. 18E is a cross-sectional views of a memory opening after replacement of sacrificial material layers with electrically conductive layers in the structure of FIG. 17G according to the alternative configuration of the second embodiment of the present disclosure.

According to an aspect of the present disclosure, a first isotropic etch process that etches the second material of the sacrificial material layers 42 selective to the first material of the insulating layers 32 can be selective to the material of the dielectric metal oxide blocking dielectric layer 51 or the sacrificial material layer 53 (if present, as shown in FIG. 18E). Thus, the dielectric metal oxide blocking dielectric layer 51 or the sacrificial material layer 53 (if present) can function as an etch stop structure during formation of the backside recesses 43. Cylindrical surface segments of the dielectric metal oxide blocking dielectric layer 51 or the sacrificial material layer 53 (if present) are physically exposed to the backside recesses 43 after removing the sacrificial material layers 42 selective to the insulating layers 32. In one embodiment, the insulating layers 32 can include undoped silicate glass or a doped silicate glass (such as borosilicate glass), the sacrificial material layers 42 can include silicon nitride, the dielectric metal oxide blocking dielectric layer 51 can include aluminum oxide and or the sacrificial material layer 53 (if present) includes doped or undoped silicate glass (i.e., silicon oxide). In this case, the first isotropic etch process can include a wet etch process that employs hot phosphoric acid. Generally, the first isotropic etch process can include a wet etch process that can etch the sacrificial material layers 42 selective to the insulating layers 32 and the dielectric metal oxide blocking dielectric layer 51 or the sacrificial material layer 53 (if present). As such, an upper limit to the pre-thinning thickness of each insulating layer 32 (i.e., the thickness as provided in the alternating stack of insulating layers 32 and sacrificial material layers 42 as formed at the processing steps of FIG. 2) can have a lower limit imposed by the requirement of structural integrity while capillary force is applied during extraction of a wet etchant at the end of the wet etch process of the first isotropic etch process. In case the insulating layers 32 include silicon oxide, the lower limit on the thickness of each insulating layer 32 imposed by the requirement of structural integrity during application of capillary force is about 18 nm. In this case, the pre-thinning thickness of the insulating layers 32 can be above 18 nm, and the post thinning thickness of the insulating layers 32 can be below 18 nm such as from 9 nm to 18 nm and/or from 12 nm to 16 nm.

Referring to FIG. 18B, the processing steps of FIG. 9B can be performed to expand the backside recesses 43. Specifically, each of the backside recesses 43 can be expanded by isotropically etching surface portions of the insulating layers 32 by performing a second isotropic etch process. The second isotropic etch process includes an isotropic etch process that does not apply any capillary force on the insulating layers 32. In one embodiment, the second isotropic etch process can be a dry isotropic etch process such as a remote-plasma-assisted dry etch process or a chemical dry etch process. The chemistry of the second isotropic etch process can be selected to isotropically etch the insulating layers 32. For example, the chemistry of the second isotropic etch process can isotropically etch silicon oxide. In one embodiment, the remote-plasma-assisted dry etch process or the chemical dry etch process isotropically recesses the cylindrical surface segments of the outer sidewall of the silicon oxide blocking dielectric layer 52 concurrently with isotropic recessing of physically exposed surfaces of the insulating layer 32.

In one embodiment, each of the insulating layers 32 can have a respective pre-thinning thickness before formation of the backside recesses 43, and after the first isotropic etch process that forms the backside recesses and prior to the second isotropic etch process. The respective pre-thinning thickness can be a respective thickness as provided within the alternating stack (32, 42) at the processing steps of FIG. 2. Each of the insulating layers 32 can have a respective post-thinning thickness that is in a range from 20% to 90% of the respective pre-thinning thickness after the second isotropic etch process, such as the remote-plasma-assisted dry etch process or the chemical dry etch process.

If the sacrificial material layer 53 is present, as shown in FIG. 18E, then the portions of the sacrificial material layer 53 exposed in the backside trenches are also etched because the sacrificial material layer 53 has the same material composition as the insulating layers 32. In one embodiment, the portions of the sacrificial material layer 53 exposed in the backside trenches are completely removed during the second isotropic etch process. The portions 53P of the sacrificial material layer 53 located between the insulating layers 32 and the dielectric metal oxide blocking dielectric layer 51 remain after the second isotropic etch process, as shown in FIG. 18E.

The dielectric metal oxide blocking dielectric layer 51 may be resistant to the second isotropic etch process or may have a lower etch rate than the insulating layers 32 during the second isotropic etch process. In this case, the dielectric metal oxide blocking dielectric layer 51 acts as an etch stop during the second isotropic etch process. If the sacrificial material layer 53 is present as shown in FIG. 18E and if the dielectric metal oxide blocking dielectric layer 51 is not completely resistant to the second isotropic etch process, then the sacrificial material layer 53 delays the time the etchant reaches the dielectric metal oxide blocking dielectric layer 51, and thus reduces or prevents undesirable thinning of the dielectric metal oxide blocking dielectric layer 51 during the second isotropic etch process. The outer cylindrical sidewall of the dielectric metal oxide blocking dielectric layer 51 can have a straight vertical cross-sectional profile. In one embodiment, the memory array region 100 comprises an array of monolithic three-dimensional NAND strings having a plurality of device levels disposed above the substrate (9, 10). In this case, each backside recess 43 can define a space for receiving a respective word line or select gate electrode of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32.

Referring to FIG. 18C, the processing steps of FIG. 9C can be performed to convert physically exposed surface portions of the pedestal channel portions 11 into tubular dielectric spacer 116. A planar dielectric portion may be formed at the bottom of each backside trench 79 in the same manner as in the first embodiment.

Referring to FIG. 18D, the processing steps of FIGS. 9E and 10 can be performed to form an electrically conductive layer 46 within each backside recess 43. In the second exemplary structure, the backside recesses 43 may not have any corner rounding or convex surfaces. As such, each cylindrical vertical surface of the electrically conductive layers 46 that laterally surrounds a respective one of the memory opening fill structures 58 can have an upper periphery that coincides within an inner periphery of a top surface of a respective one of the electrically conductive layers 46, and can have a lower periphery that coincides with an inner periphery of a bottom surface of the respective one of the electrically conductive layers 46.

Subsequently, the processing steps of FIGS. 11A and 11B, 12, and 13A and 13B can be performed to form insulating spacers 74, backside contact via structures 76, and the additional contact via structures (88, 86, 8P) in the second exemplary structure.

Alternatively, the processing steps of FIGS. 11A and 11B, 14, 15, and 16A can be performed to form air gaps 36, insulating spacers 74, backside contact via structures 76, and the additional contact via structures (88, 86, 8P) in the alternative embodiment of the second exemplary structure.

In the second exemplary structure, each memory opening fill structure 58 can comprise a dielectric metal oxide blocking dielectric layer 51. A silicon oxide blocking dielectric layer 52 is formed on the dielectric metal oxide blocking dielectric layer 51, and is laterally surrounded by the dielectric metal oxide blocking dielectric layer 51. Cylindrical surface segments of the dielectric metal oxide blocking dielectric layer 51 are physically exposed to the backside recesses 43 after removing the sacrificial material layers 42 selective to the insulating layers 32 employing the first isotropic etch process. Optionally, vertically separated portions of the sacrificial material layer 53 may be present between the insulating layers 32 and portions of the continuous dielectric metal oxide blocking dielectric layer 51 located at the levels of the insulating layers 32.

In one embodiment, the remote-plasma-assisted dry etch process or the chemical dry etch process has an etch chemistry that is selective to the dielectric metal oxide blocking dielectric layer 51, and the electrically conductive layers 46 are formed on the cylindrical surface segments of the dielectric metal oxide blocking dielectric layer 51.

In one embodiment, each of the insulating layers has a respective pre-thinning thickness before formation of the backside recesses 43. The respective pre-thinning thickness is a respective thickness as provided within the alternating stack (32, 42) at the processing steps of FIG. 2. Each of the insulating layers 32 has a respective post-thinning thickness that is in a range from 20% to 90% of the respective pre-thinning thickness after the remote-plasma-assisted dry etch process or the chemical dry etch process.

According to the second embodiment of the present disclosure, a three-dimensional memory device includes an alternating stack of word lines 46W and at least one insulating layers 32 or air gaps 36 located over a substrate (9, 10), and a memory opening fill structure 58 extending through the alternating stack. The memory opening fill structure 58 comprises a memory film 50 containing a dielectric metal oxide blocking dielectric 51 and a charge storage material 54, and a vertical semiconductor channel 60 contacting an inner sidewall of the memory film 60. The word lines 46W are thicker than the insulating layers 32 or air gaps 36.

In one embodiment shown in FIG. 18E, a vertical stack of discrete (i.e., vertically separated) silicon oxide portions 53P is located between the insulating layers 32 or air gaps 36 and portions of the dielectric metal oxide blocking dielectric layer 51 at levels of the insulating layers 32.

According to a third embodiment of the present disclosure, a third exemplary structure according to a third embodiment of the present disclosure can be derived from the first exemplary structure of FIGS. 13A and 13B or the alternative embodiment thereof as illustrated in FIGS. 16A and 16B by employing a third exemplary memory opening fill structure 58 in lieu of each first exemplary memory opening fill structure 58. Support pillar structures 20 in the third exemplary structure can have a same type of structural modification relative to the support pillar structures 20 in the first exemplary structure as the changes in the third exemplary memory opening fill structures 58 relative to the first exemplary memory opening fill structures 58 of the first embodiment. FIGS. 19A-19J are sequential vertical cross-sectional views of a memory opening during formation of a third exemplary memory opening fill structure 58 according to the third embodiment of the present disclosure.

Referring to FIG. 19A, the third exemplary structure according to the third embodiment of the present disclosure can be derived from the first exemplary structure of FIG. 5B by depositing a conformal silicon nitride layer 21L'. The conformal silicon nitride layer 21L can include, and/or can consist essentially of, silicon nitride, and can be formed by a conformal deposition process such as a low pressure chemical vapor deposition (LPCVD) process. The thickness of the conformal silicon nitride layer 21L' can be in a range from 2 nm to 10 nm, such as from 3 nm to 6 nm, although lesser and greater thicknesses can also be employed.

Referring to FIG. 19B, the conformal silicon nitride layer 21L' can be entirely or partially oxidized into an outer silicon oxide blocking dielectric layer 21L. For example, a thermal or plasma oxidation process can be performed to convert at least a portion of the conformal silicon nitride layer 21L' into the outer silicon oxide blocking dielectric layer 21L. Either the entire thickness or the inner portion of the thickness the conformal silicon nitride layer 21L' is converted into the outer silicon oxide blocking dielectric layer 21L depending on the duration of the oxidation process.

Referring to FIG. 19C, an inner silicon oxide blocking dielectric layer 22L can be formed on the physically exposed surface of the outer silicon oxide blocking dielectric layer 21L by conformal or non-conformal deposition of a silicon oxide material. For example, a lower pressure chemical vapor deposition (LPCVD) process or a plasma-enhanced physical vapor deposition (PECVD) process can be performed to deposit the inner silicon oxide blocking dielectric layer 22L. The average thickness of the vertically extending portion of the inner silicon oxide blocking dielectric layer 22L can be in a range from 2 nm to 20 nm, such as from 3 nm to 10 nm, although lesser and greater thicknesses can also be employed. The inner silicon oxide blocking dielectric layer 22L may have a lower nitrogen impurity concentration than the outer silicon oxide blocking dielectric layer 21L.

Generally, at least one silicon oxide blocking dielectric layer (21L, 22L) can be formed on the sidewall of each memory opening 49, on the physically exposed top surface of each pedestal channel portion 11, and on the physically exposed surfaces of the insulating cap layer 70. In one embodiment, the at least one silicon oxide blocking dielectric layer (21L, 22L) comprises an outer silicon oxide blocking dielectric layer 21L and an inner silicon oxide blocking dielectric layer 22L. Alternatively, the outer silicon oxide blocking dielectric layer 21L may be omitted, and the at least one silicon oxide blocking dielectric layer can include only the inner silicon oxide blocking dielectric layer 22L. Yet alternatively, the inner silicon oxide blocking dielectric layer 22L may be omitted, and the at least one silicon oxide blocking dielectric layer can include only the outer silicon oxide blocking dielectric layer 21L. While the present disclosure is described employing an embodiment in which the at least one silicon oxide blocking dielectric layer (21L, 22L) comprises a layer stack of an outer silicon oxide blocking dielectric layer 21L and an inner silicon oxide blocking dielectric layer 22L, embodiments are expressly contemplated herein in which the at least one silicon oxide blocking dielectric layer (21L, 22L) includes only an outer silicon oxide blocking dielectric layer 21L, or includes only an inner silicon oxide blocking dielectric layer 22L.

Referring to FIG. 19D, a silicon nitride blocking dielectric layer 23L can be formed on, and over, the at least one silicon oxide blocking dielectric layer (21L, 22L) by a conformal deposition process. For example, the silicon nitride blocking dielectric layer 23L can be deposited by low pressure chemical vapor deposition. The silicon nitride blocking dielectric layer 23L can consist essentially of silicon nitride. The thickness of the silicon nitride blocking dielectric layer 23L can be in a range from 2 nm to 10 nm, such as from 3 nm to 6 nm, although lesser and greater thicknesses can also be employed.

Figure 19F:
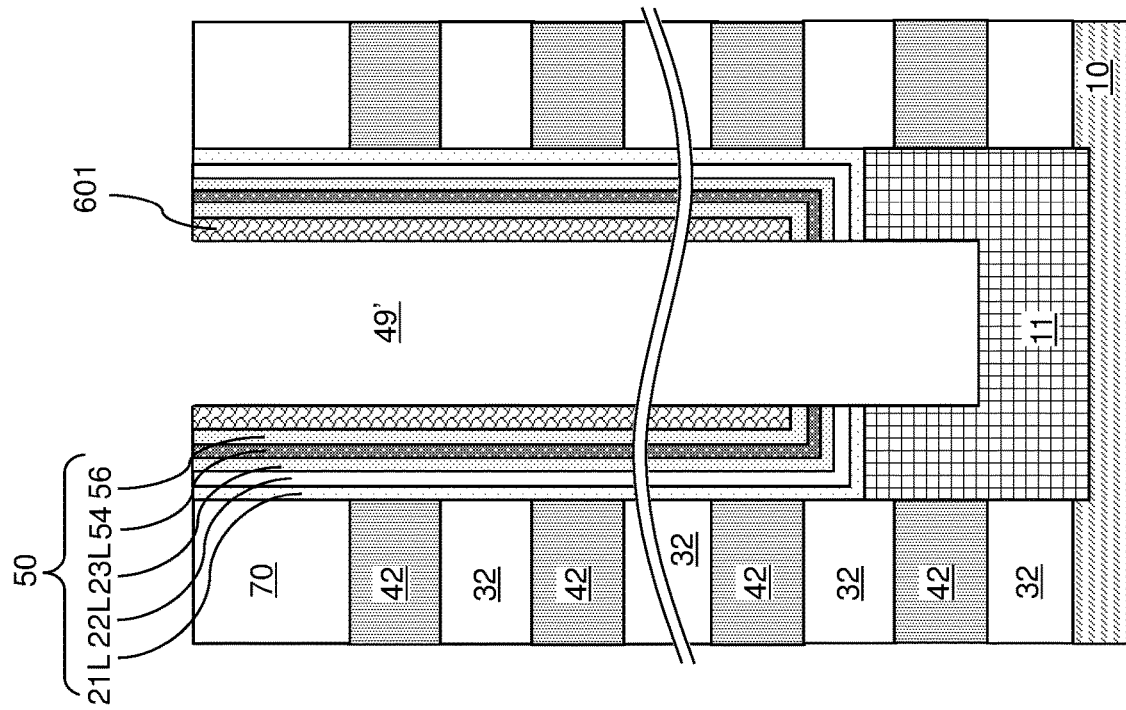
Figure 19E:
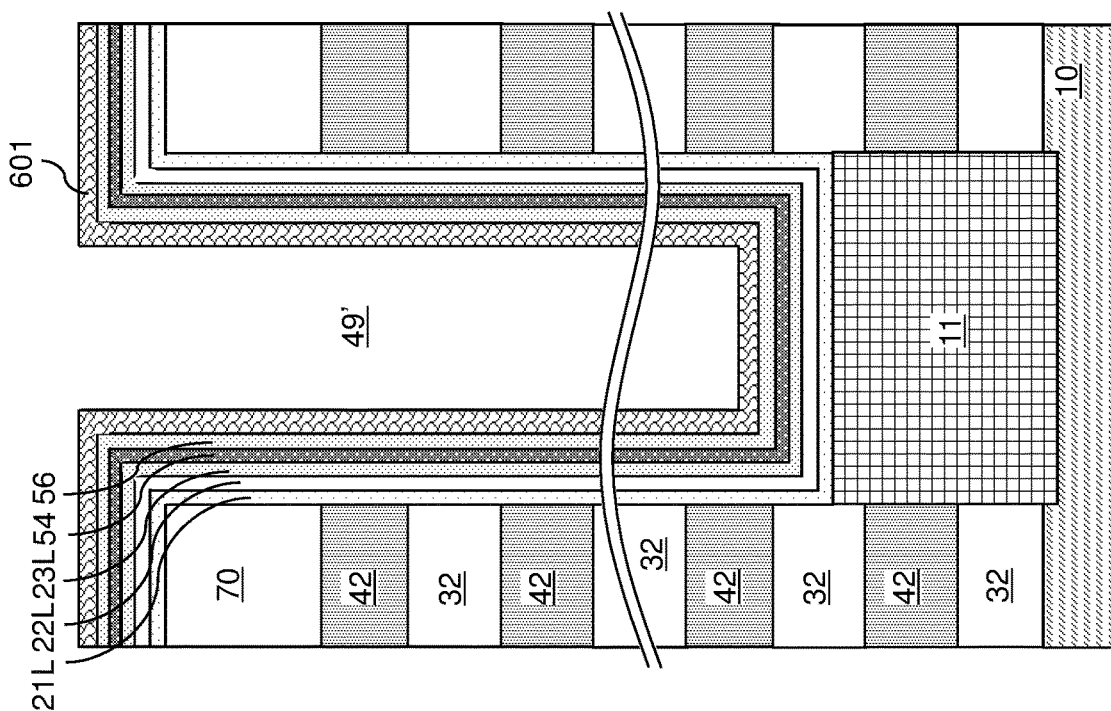

Referring to FIG. 19E, the processing steps of FIG. 5C can be performed to sequentially form a charge storage layer 54, a tunneling dielectric layer 56, and a first semiconductor channel layer 601 over the silicon nitride blocking dielectric layer 23L. The silicon nitride blocking dielectric layer 23L and the charge storage layer 54 may have the same material composition, or may have different material compositions. For example, the charge storage layer 54 may include silicon nitride or any dielectric charge trapping material. In case the charge storage layer 54 includes silicon nitride, the silicon nitride material of the charge storage layer 54 may, or may not, be stoichiometric silicon nitride. In one embodiment, the silicon nitride blocking dielectric layer 23L may include stoichiometric silicon nitride, and the charge storage layer 54 may include stoichiometric silicon nitride or non-stoichiometric silicon nitride (such as silicon-rich silicon nitride). In another embodiment, the silicon nitride blocking dielectric layer 23L may include non-stoichiometric silicon nitride, and the charge storage layer 54 may include stoichiometric silicon nitride or non-stoichiometric silicon nitride. In one embodiment, the silicon nitride blocking dielectric layer 23L and the charge storage layer 54 have a same material composition (such as stoichiometric silicon nitride or non-stoichiometric silicon nitride), and the silicon nitride blocking dielectric layer 23L and the charge storage layer 54 can be formed as a single continuous silicon nitride layer having a same material composition throughout.

Referring to FIG. 19F, the processing steps of FIG. 5D can be performed with a modification in the etch chemistry to etch horizontal portions of the first semiconductor channel layer 601, the tunneling dielectric layer 56, the charge storage layer 54, the silicon nitride blocking dielectric layer 23L and the at least one silicon oxide blocking dielectric layer (21L, 22L).

Referring to FIG. 19G, the processing steps of FIG. 5E can be performed to deposit a second semiconductor channel layer 602. Referring to FIG. 19H, the processing steps of FIG. 5F can be performed to deposit a dielectric core layer 62L. Referring to FIG. 19I, the processing steps of FIG. 5G can be performed to form a dielectric core 62 within each memory opening 49 and within each support opening 19. Referring to FIG. 19J, the processing steps of FIG. 5H can be performed to form a drain region 63 within each memory opening 49 and within each support opening 19. Subsequently, the processing steps FIGS. 7A and 7B, and 8 and 9A can be performed to form backside trenches 79 and backside recesses 43.

Referring to FIG. 20A, a third exemplary memory opening fill structure 58 is illustrated at the processing step that corresponds to the processing steps of FIGS. 8 and 9A. According to an aspect of the present disclosure, a first isotropic etch process that etches the second material of the sacrificial material layers 42 selective to the first material of the insulating layers 32 and the material of the at least one silicon oxide blocking dielectric layer (21L, 22L) (e.g., silicon oxide). Thus, the at least one silicon oxide blocking dielectric layer (21L, 22L) can function as an etch stop structure during formation of the backside recesses 43. Cylindrical surface segments of the at least one silicon oxide blocking dielectric layer (21L, 22L) are physically exposed to the backside recesses 43 after removing the sacrificial material layers 42 selective to the insulating layers 32. In one embodiment, the insulating layers 32 can include undoped silicate glass or a doped silicate glass (such as borosilicate glass) and the sacrificial material layers 42 can include silicon nitride. In this case, the first isotropic etch process can include a wet etch process that employs hot phosphoric acid. Generally, the first isotropic etch process can include a wet etch process that can etch the sacrificial material layers 42 selective to the insulating layers 32 and the at least one silicon oxide blocking dielectric layer (21L, 22L). As such, an upper limit to the pre-thinning thickness of each insulating layer 32 (i.e., the thickness as provided in the alternating stack of insulating layers 32 and sacrificial material layers 42 as formed at the processing steps of FIG. 2) can have a lower limit imposed by the requirement of structural integrity while capillary force is applied during extraction of a wet etchant at the end of the wet etch process of the first isotropic etch process. In case the insulating layers 32 include silicon oxide, the lower limit on the thickness of each insulating layer 32 imposed by the requirement of structural integrity during application of capillary force is about 18 nm. In this case, the pre-thinning thickness of the insulating layers 32 can be above 18 nm, and the post thinning thickness of the insulating layers 32 can be below 18 nm such as from 9 nm to 18 nm and/or from 12 nm to 16 nm.

Referring to FIG. 20B, the processing steps of FIG. 9B can be performed to expand the backside recesses 43. Specifically, each of the backside recesses 43 can be expanded by isotropically etching surface portions of the insulating layers 32 by performing a second isotropic etch process. The second isotropic etch process includes an isotropic etch process that does not apply any capillary force on the insulating layers 32. In one embodiment, the second isotropic etch process can be a dry isotropic etch process such as a remote-plasma-assisted dry etch process or a chemical dry etch process. The chemistry of the second isotropic etch process can be selected to isotropically etch the insulating layers 32. For example, the chemistry of the second isotropic etch process can isotropically etch silicon oxide. In one embodiment, the remote-plasma-assisted dry etch process or the chemical dry etch process isotropically recesses the cylindrical surface segments of the outer sidewall of the silicon oxide blocking dielectric layer 52 concurrently with isotropic recessing of physically exposed surfaces of the insulating layer 32. Generally, the backside recesses 43 can be expanded by isotropically etching surface portions of the insulating layers 32 and physically exposed portions of the at least one silicon oxide blocking dielectric layer (21L, 22L) selective to the silicon nitride blocking dielectric layer 23L employing the second isotropic etch process.

In one embodiment, each of the insulating layers 32 can have a respective pre-thinning thickness before formation of the backside recesses 43, and after the first isotropic etch process that forms the backside recesses and prior to the second isotropic etch process. The respective pre-thinning thickness can be a respective thickness as provided within the alternating stack (32, 42) at the processing steps of FIG. 2. Each of the insulating layers 32 can have a respective post-thinning thickness that is in a range from 20% to 90% of the respective pre-thinning thickness after the second isotropic etch process, such as the remote-plasma-assisted dry etch process or the chemical dry etch process.

The second isotropic etch process collaterally etches through the physically exposed portions of the at least one silicon oxide blocking dielectric layer (21L, 22L). The silicon oxide blocking dielectric layer 23L may be used as an etch stop layer during the second isotropic etch process. At least one vertical stack of silicon oxide material portions (21, 22) can be formed at levels of a subset of the insulating layers 32 that is located above the horizontal plane including the top surface of the pedestal channel portions 11. The at least one vertical stack of silicon oxide material portions (21, 22) can include a vertical stack of inner silicon oxide material portions 22 that are remaining portions of the inner silicon oxide blocking dielectric layer 22L, and a vertical stack of outer silicon oxide material portions 21 that are remaining portions of the outer silicon oxide blocking dielectric layer 21L.

In one embodiment, each silicon oxide material portion (21, 22) within each vertical stack of silicon oxide material portions (21, 22) includes a vertical cylindrical outer sidewall (611, 621), a vertical cylindrical inner sidewall (612, 622) that is laterally offset inward from the vertical cylindrical outer sidewall (611, 621) by a uniform lateral offset distance (which is the thickness of the respective silicon oxide material portion (21, 22)), and a pair of tapered concave annular surfaces (613, 623) that connects the vertical cylindrical outer sidewall (611, 621) to the vertical cylindrical inner sidewall (612, 622). For example, each outer silicon oxide material portion 21 within each vertical stack of outer silicon oxide material portions 21 includes a vertical cylindrical outer sidewall 611, a vertical cylindrical inner sidewall 612 that is laterally offset inward from the vertical cylindrical outer sidewall 611 by a uniform lateral offset distance (which is the thickness of an outer silicon oxide material portion 21), and a pair of tapered concave annular surfaces 613 that connect the vertical cylindrical outer sidewall 611 to the vertical cylindrical inner sidewall 612. Each inner silicon oxide material portion 22 within each vertical stack of inner silicon oxide material portions 22 includes a vertical cylindrical outer sidewall 621, a vertical cylindrical inner sidewall 622 that is laterally offset inward from the vertical cylindrical outer sidewall 621 by a uniform lateral offset distance (which is the thickness of an inner silicon oxide material portion 22), and a pair of tapered concave annular surfaces 623 that connect the vertical cylindrical outer sidewall 621 to the vertical cylindrical inner sidewall 622. Each of the tapered concave annular surfaces (613, 623) can have a same radius of curvature Rc'. In one embodiment, the radius of curvature Rc' may be the same as the vertical recess distance (i.e., the vertical etch distance) of the second isotropic etch process on the insulating layers 32.

In one embodiment, a silicon oxide material portion (such as an outer silicon oxide material portion 21) within the at least one vertical stack of silicon oxide material portions (21, 22) can comprise an outer cylindrical sidewall 611 that contacts an entirety of a cylindrical sidewall of one of the insulating layers 32. An upper periphery of the outer cylindrical sidewall 611 of the silicon oxide material portion (such as the outer silicon oxide material portion 21) coincides with an upper periphery of the cylindrical sidewall of the one of the insulating layers 32 that laterally surrounds a memory opening fill structure 58. A lower periphery of the outer cylindrical sidewall 611 of the silicon oxide material portion (such as the outer silicon oxide material portion 21) coincides with a lower periphery of the cylindrical sidewall of the one of the insulating layers 32.

In one embodiment, the at least one vertical stack of silicon oxide material portions (21, 22) can include a vertical stack of silicon oxide material portions (such as vertical stack of outer silicon oxide material portions 21) and an additional vertical stack of additional silicon oxide material portions (such as a vertical stack of inner silicon oxide material portions 22). In this case, each of the silicon oxide material portions (such as each outer silicon oxide material portion 21) contacts a sidewall of a respective one of the additional silicon oxide material portions (such as a respective inner silicon oxide material portion 22) and contacts a cylindrical sidewall of a respective one of the insulating layers 32.

In one embodiment, the memory array region 100 comprises an array of monolithic three-dimensional NAND strings having a plurality of device levels disposed above the substrate (9, 10). In this case, each backside recess 43 can define a space for receiving a respective word line or a select gate electrode of the array of monolithic three-dimensional NAND strings. Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32.

Referring to FIG. 20C, the processing steps of FIG. 9C can be performed to convert physically exposed surface portions of the pedestal channel portions 11 into tubular dielectric spacer 116. A planar dielectric portion may be formed at the bottom of each backside trench 79 in the same manner as in the first embodiment.

The oxidation process that forms the tubular dielectric spacers 116 can convert physically exposed portions of the silicon nitride blocking dielectric layer 23L into silicon oxide blocking dielectric portions 13. In one embodiment, a thermal or plasma oxidation process can be employed to thermally oxidize physically exposed portions of the silicon nitride blocking dielectric layer 23L into the silicon oxide blocking dielectric portions 13. The processing conditions (such as the temperature and the duration of the thermal oxidation process) can be selected such that thermal conversion of silicon nitride into silicon oxide proceeds through the entire thickness of the silicon nitride blocking dielectric layer 23L at each level of the backside recesses 43 without reaching the silicon nitride charge storage layer 54. Thus, each silicon oxide blocking dielectric portion 13 can contact an outer sidewall of the charge storage layer 54. The unoxidized portions of the silicon nitride blocking dielectric layer 23L includes a vertical stack of silicon nitride material portions 23. A vertical stack of silicon oxide blocking dielectric portions 13 is interlaced with a vertical stack of silicon nitride material portions 23 (i.e., a portion 13 is located between two vertically adjacent portions 23 and vice-versa) within each memory opening fill structure 58.

In one embodiment, each of the silicon oxide blocking dielectric portions 13 has a respective outer cylindrical sidewall 131 and a respective inner cylindrical sidewall 132 having a lesser vertical extent than the respective outer cylindrical sidewall 131. In one embodiment, the respective inner cylindrical sidewall 132 of each of the silicon oxide blocking dielectric portions 13 is connected to the respective outer cylindrical sidewall 131 of each of the silicon oxide blocking dielectric portions by a respective upper annular interconnection surface 133 and by a respective lower annular interconnection surface 134. In one embodiment, the respective upper annular interconnection surface 133 and the respective lower annular interconnection surface 134 have tapered convex surfaces that contact a respective tapered concave surface of a respective silicon nitride material portion 23 within the vertical stack of silicon nitride material portions 23.

The thermal oxidation process can proceed isotropically with gradual oxidation of the silicon nitride material over a finite compositional transition thickness, which may be in a range from 0.5 nm to 3 nm. In one embodiment, each of the silicon oxide blocking dielectric portions 13 comprises interfacial regions adjacent to the respective upper annular interconnection surface 133 and the respective lower annular interconnection surface 134. In this case, each of the interfacial regions comprises nitrogen atoms at an atomic concentration less than 1% due to residual nitrogen content near oxidation interfaces, and the atomic concentration can decrease with a distance from the respective upper annular interconnection surface 133 or with a distance from the respective lower annular interconnection surface 134.

In one embodiment, a silicon oxide material portion (such as an inner silicon oxide material portion 22) within a vertical stack of silicon oxide material portions (such as the inner silicon oxide material portions 22) can contact an entirety of an outer cylindrical sidewall 231 of one of the silicon nitride material portions 23, a portion of an outer cylindrical sidewall 131 of one of the silicon oxide blocking dielectric portions 13, and a portion of an outer cylindrical sidewall 131 of another of the silicon oxide blocking dielectric portions 13.

Referring to FIG. 20D, the processing steps of FIG. 9D can be performed to deposit an optional backside blocking dielectric layer 44 on the physically exposed surfaces of the backside recesses 43. Subsequently, the processing steps of FIGS. 9E and 10 can be performed to form an electrically conductive layer 46 on the backside blocking dielectric layer 44 within each backside recess 43.

In one embodiment, the physically exposed surfaces of the backside blocking dielectric layer 44 within each backside recess 43 adjacent to the silicon oxide blocking dielectric portions 13 can have corner rounding, and the physically exposed surfaces of the backside blocking dielectric layer 44 adjacent to the tubular dielectric spacers 116 may not have any corner rounding. In this case, each electrically conductive layer 46 (e.g., word line and/or drain select gate electrode) within a subset of the electrically conductive layers 46 located at levels of silicon oxide blocking dielectric portions 13 has a vertical cylindrical sidewall 461 that laterally surrounds the memory opening fill structure 58, an upper convex surface 462 adjoined to an upper end of the vertical cylindrical sidewall 461, and a lower convex surface 463 adjoined to a lower end of the vertical cylindrical sidewall 461. A bottommost one of the electrically conductive layers 46 (e.g., the source select gate electrode) can have a vertical cylindrical sidewall 471 having an upper periphery that coincides with an inner periphery of an upper horizontal surface 472 of the bottommost one of the electrically conductive layers 46 and having a lower periphery that coincides with an inner periphery of a lower horizontal surface 473 of the bottommost one of the electrically conductive layers 46 without including any convex surfaces In one embodiment, each of the electrically conductive layers 46 can be spaced from the vertical stack of silicon oxide blocking dielectric portions 13 by a respective backside blocking dielectric layer 44. In one embodiment, each backside blocking dielectric layer 44 contacts one of the silicon oxide blocking dielectric portions 13 and at least one of the silicon nitride material portions 23 (which may be two silicon nitride material portions 23).

In one embodiment, the charge storage layer 54 has a straight cylindrical sidewall that contacts each inner cylindrical sidewall of the silicon oxide blocking dielectric portions 13 and each inner cylindrical sidewall of the silicon nitride material portions 23.

Subsequently, the processing steps of FIGS. 11A and 11B, 12, and 13A and 13B can be performed to form insulating spacers 74, backside contact via structures 76, and the additional contact via structures (88, 86, 8P) in the second exemplary structure.

Alternatively, the processing steps of FIGS. 11A and 11B, 14, 15, and 16A can be performed to form air gaps 36, insulating spacers 74, backside contact via structures 76, and the additional contact via structures (88, 86, 8P) in the alternative embodiment of the second exemplary structure. In this case, the alternating stack comprises air gaps 36 and electrically conductive layers 46.

Figure 21:
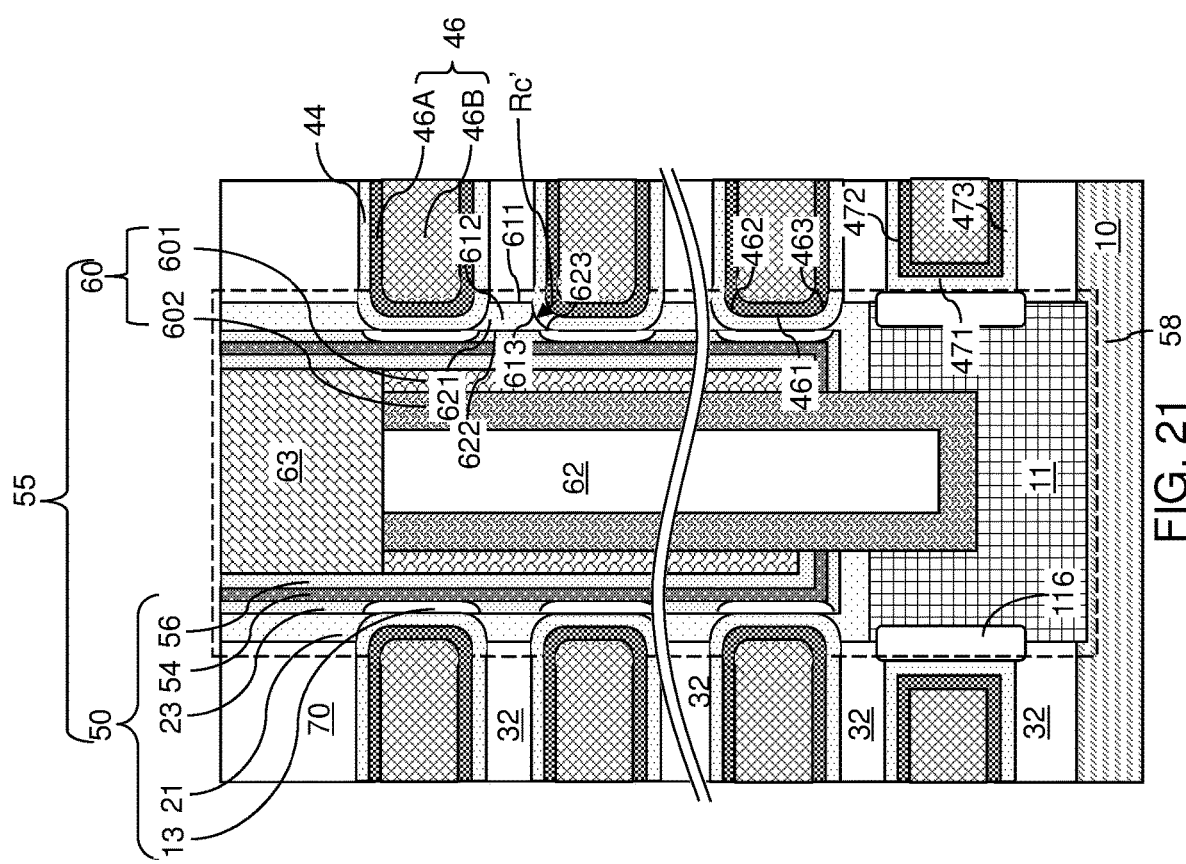
FIG. 21 is a first alternative embodiment of the third exemplary memory opening fill structure according to the third embodiment of the present disclosure.

Referring to FIG. 21, a first alternative embodiment of the third exemplary memory opening fill structure 58 can be derived from the third exemplary memory opening fill structure 58 illustrated in FIG. 20D by omitting formation of the inner silicon oxide blocking dielectric layer 22L. In this case, the at least one vertical stack of silicon oxide material portions includes only a vertical stack of outer silicon oxide material portions 21, which is referred to as a vertical stack of silicon oxide material portions.

Figure 22:
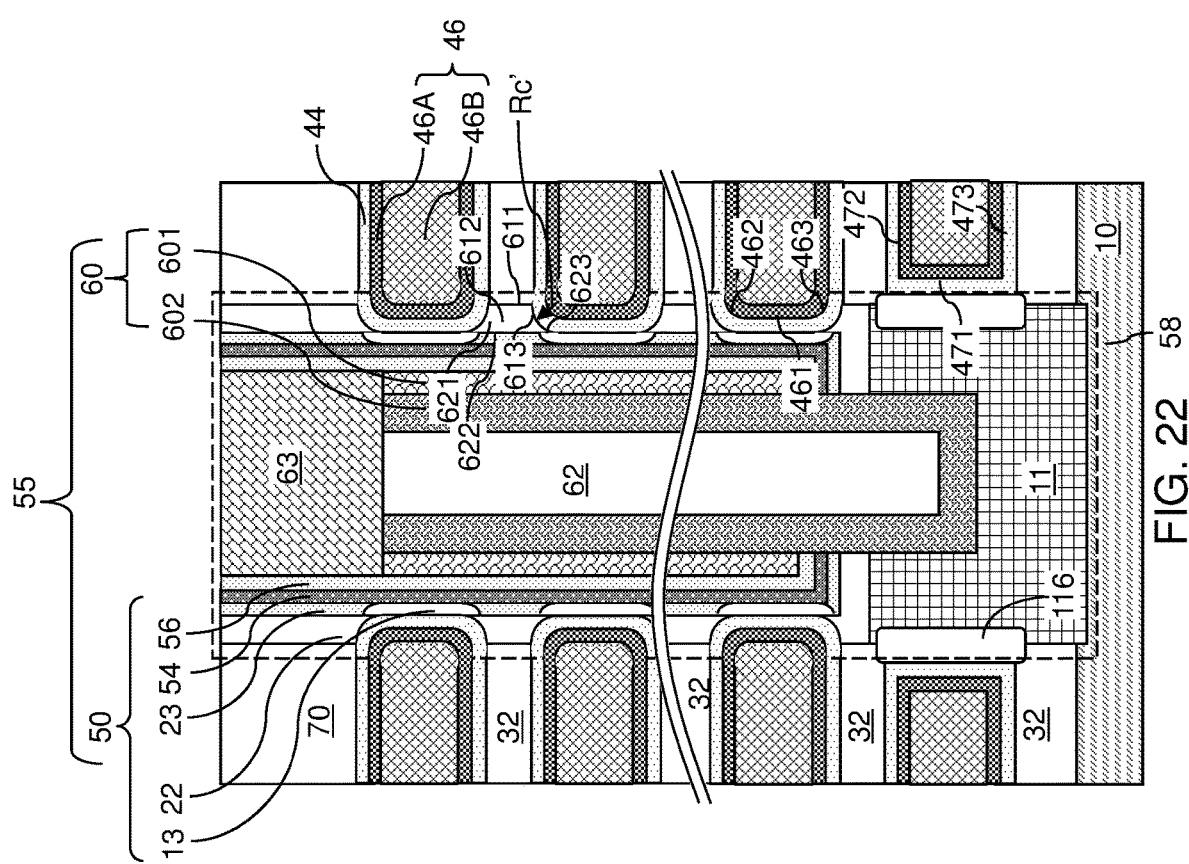
FIG. 22 is a second alternative embodiment of the third exemplary memory opening fill structure according to the third embodiment of the present disclosure.

Referring to FIG. 22, a second alternative embodiment of the third exemplary memory opening fill structure can be derived from the third exemplary memory opening fill structure 58 illustrated in FIG. 20D by omitting formation of the outer silicon oxide blocking dielectric layer 21L. In this case, the at least one vertical stack of silicon oxide material portions includes only a vertical stack of inner silicon oxide material portions 22, which is referred to as a vertical stack of silicon oxide material portions.

Referring to all drawings and according to various embodiments of the present disclosure, a three-dimensional memory device is provided, which comprises: an alternating stack of insulating layers (32, 36) and electrically conductive layers 46 located over a substrate (9, 10), a memory opening 49 vertically extending through the alternating stack (32, 46), and a memory opening fill structure 58 vertically extending through the alternating stack (32, 46), wherein: the memory opening fill structure 58 comprises a memory film 50 and a vertical semiconductor channel 60 contacting an inner sidewall of the memory film 50, and the memory film 50 comprises, from outside to inside, a vertical stack of silicon oxide material portions (21 and/or 22) located at levels of a subset of the insulating layers 32, a vertical stack of silicon oxide blocking dielectric portions 13 that is interlaced with a vertical stack of silicon nitride material portions 23 along a vertical direction, a charge storage layer 54, and a tunneling dielectric layer 56. The insulating layers 32 can be a layer of a solid insulating material (such as silicon oxide), or may be a layer including an air gap 36, i.e., an air gap layer composed of a confined gas phase material that is laterally surrounded by insulating spacers 74.

The various embodiments of the present disclosure can include a three-dimensional memory device. In one embodiment, the three-dimensional memory device comprises a monolithic three-dimensional NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of an electrically conductive layer 46) in a first device level of the array of monolithic three-dimensional NAND strings can be located over another memory cell (as embodied as another portion of the charge storage layer 54 at a level of another electrically conductive layer 46) in a second device level of the array of monolithic three-dimensional NAND strings. The silicon substrate can contain an integrated circuit comprising a driver circuit (as embodied as a subset of the least one semiconductor device 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion (such as the vertical semiconductor channel 60) of each of the plurality of semiconductor channels (59, 11, 60) extends substantially perpendicular to a top surface of the substrate (9, 10) and comprising a respective one of the vertical semiconductor channels 60, and a plurality of charge storage elements (as embodied as portions of the memory films 50, i.e., portions of the charge storage layer 54). Each charge storage element can be located adjacent to a respective one of the plurality of semiconductor channels (59, 11, 60).

The various embodiments of the present disclosure can be employed to provide a three-dimensional memory device including an alternating stack of insulating layers or air gaps (32, 36) and electrically conductive layers 46, in which the thickness of the insulating layers or air gaps (32, 36) is less than the limit imposed by the condition of structural integrity under application of capillary force applied during a wet etch process that removes the sacrificial material layers 42 selective to insulating layers 32 including a solid material (such as silicon oxide). Specifically, insulating layers or air gaps (32, 36) having a thickness less than 18 nm can be formed employing the methods of the embodiments of the present disclosure, thereby improving scaling of the three-dimensional memory device. Specifically, the insulating layer thickness may be reduced to minimum electrostatically allowed thickness and/or memory opening pitch may be reduced. Furthermore, a bigger memory opening diameter process may be used which improves the memory opening etch throughput even with reduced memory opening pitch. The reduces insulating layer thickness provides a thicker backside openings which permits a thicker electrically conductive layer formation in the backside opening and leads to a lower word line resistance and better device with longer channel length.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise.

Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
an alternating stack of insulating layers and electrically conductive layers located over a substrate;
a memory opening vertically extending through the alternating stack; and
a memory opening fill structure vertically extending through the alternating stack, wherein:
the memory opening fill structure comprises a memory film and a vertical semiconductor channel contacting an inner sidewall of the memory film; and
the memory film comprises, from outside to inside: a vertical stack of silicon oxide material portions located at levels of a subset of the insulating layers; a vertical stack of silicon oxide blocking dielectric portions that is interlaced with a vertical stack of silicon nitride material portions; a charge storage layer, and a tunneling dielectric layer.

2. The three-dimensional memory device of claim 1, wherein each of the silicon oxide blocking dielectric portions has a respective outer cylindrical sidewall and a respective inner cylindrical sidewall having a lesser vertical extent than the respective outer cylindrical sidewall.

3. The three-dimensional memory device of claim 2, wherein the respective inner cylindrical sidewall of each of the silicon oxide blocking dielectric portions is connected to the respective outer cylindrical sidewall of each of the silicon oxide blocking dielectric portions by a respective upper annular interconnection surface and by a respective lower annular interconnection surface.

4. The three-dimensional memory device of claim 3, wherein:
the respective upper annular interconnection surface and the respective lower annular interconnection surface have tapered convex surfaces that contact a respective tapered concave surface of a respective silicon nitride material portion within the vertical stack of silicon nitride material portions;
each of the silicon oxide blocking dielectric portions comprises interfacial regions adjacent to the respective upper annular interconnection surface and the respective lower annular interconnection surface; and
each of the interfacial regions comprises nitrogen atoms at an atomic concentration less than 1%, the atomic concentration decreasing with a distance from the respective upper annular interconnection surface or with a distance from the respective lower annular interconnection surface.

5. The three-dimensional memory device of claim 1, wherein a silicon oxide material portion within the vertical stack of silicon oxide material portions comprises:
a vertical cylindrical outer sidewall;
a vertical cylindrical inner sidewall that is laterally offset inward from the vertical cylindrical outer sidewall by a uniform lateral offset distance; and
a pair of tapered concave annular surfaces that connects the vertical cylindrical outer sidewall to the vertical cylindrical inner sidewall.

6. The three-dimensional memory device of claim 5, wherein:
the silicon oxide material portion within the vertical stack of silicon oxide material portions comprises an outer cylindrical sidewall that contacts an entirety of a cylindrical sidewall of one of the insulating layers;
an upper periphery of the outer cylindrical sidewall of the silicon oxide material portion coincides with an upper periphery of the cylindrical sidewall of the one of the insulating layers; and
a lower periphery of the outer cylindrical sidewall of the silicon oxide material portion coincides with a lower periphery of the cylindrical sidewall of the one of the insulating layers.

7. The three-dimensional memory device of claim 5, wherein the silicon oxide material portion contacts an entirety of an outer cylindrical sidewall of one of the silicon nitride material portions, a portion of an outer cylindrical sidewall of one of the silicon oxide blocking dielectric portions, and a portion of an outer cylindrical sidewall of another of the silicon oxide blocking dielectric portions.

8. The three-dimensional memory device of claim 1, wherein:
the memory opening fill structure further comprises an additional vertical stack of additional silicon oxide material portions; and
each of the silicon oxide material portions contacts a sidewall of a respective one of the additional silicon oxide material portions and contacts a cylindrical sidewall of a respective one of the insulating layers.

9. The three-dimensional memory device of claim 1, wherein the charge storage layer has a straight cylindrical sidewall that contacts each inner cylindrical sidewall of the silicon oxide blocking dielectric portions and each inner cylindrical sidewall of the silicon nitride material portions.

10. The three-dimensional memory device of claim 1, wherein:
each of the electrically conductive layers is spaced from the vertical stack of silicon oxide blocking dielectric portions by a respective backside blocking dielectric layer; and
each backside blocking dielectric layer contacts one of the silicon oxide blocking dielectric portions and at least one of the silicon nitride material portions.

11. The three-dimensional memory device of claim 1, further comprising air gaps that are at least partially surrounded by the insulating layers.

* * * * *